United States Patent [19]
Kondoh et al.

[11] Patent Number: 5,770,978
[45] Date of Patent: Jun. 23, 1998

[54] CURRENT TYPE RING OSCILLATOR, AND VOLTAGE-CONTROLLED OSCILLATOR HAVING CURRENT TYPE RING OSCILLATOR

[75] Inventors: Harufusa Kondoh; Hiromi Notani, both of Hyogo, Japan

[73] Assignee: Mitsubishi Denki Kabushiki Kaisha, Tokyo, Japan

[21] Appl. No.: 812,694

[22] Filed: Mar. 6, 1997

Related U.S. Application Data

[62] Division of Ser. No. 544,280, Oct. 17, 1995, Pat. No. 5,656,954.

[30] Foreign Application Priority Data

Nov. 17, 1994 [JP] Japan ................................... 6-283841

[51] Int. Cl.$^6$ ....................................................... H03B 5/02
[52] U.S. Cl. ............................................. 331/57; 331/135
[58] Field of Search ...................................... 331/57, 135

[56] References Cited

U.S. PATENT DOCUMENTS

| 5,278,522 | 1/1994 | Atriss et al. . |
| 5,289,054 | 2/1994 | Lucas . |
| 5,525,938 | 6/1996 | Monk et al. ............................... 331/57 |

FOREIGN PATENT DOCUMENTS 43 37 499   6/1994   Germany .

OTHER PUBLICATIONS

IEEE Journal of Solid–State Circuits, vol. SC–22, No. 2, pp. 255–261, Apr. 1987, Deog–Kyoon Jeong, et al., "Design of PLL–Based Clock Generation Circuits".

Primary Examiner—Siegfried H. Grimm
Attorney, Agent, or Firm—Oblon, Spivak, McClelland, Maier & Neustadt, P.C.

[57] ABSTRACT

A current type inverter circuit used in a Current Type Ring Oscillator and a Voltage-Controlled oscillator operates at a high speed with a low power consumption. A reference power source 1 has one end connected to a power source VDD and the other source receiving a reference current Iref. A drain and a gate of an NMOS transistor Q1 of a current mirror circuit CM1, as an input part, receive an input current Iin. A drain of an NMOS transistor Q2 is connected to an node N1 of the other end side of the reference power source 1 as an output part. As an input part, a drain and a gate of an NMOS transistor Q3 of a current mirror circuit CM2 are connected to the node N1 while a drain of an NMOS transistor Q4 functions as an output part for outputting an output current Iout. The transistors are set so that all of the conditions $TS1 \geq 1$, $TS2 \geq 1$ and $TS1 \cdot TS2 > 1$ are satisfied where TS1 is a ratio of the size of the NMOS transistor Q2 to the size of the NMOS transistor Q1 and TS2 is a ratio of the size of the NMOS transistor Q4 to the size of the NMOS transistor Q3.

2 Claims, 42 Drawing Sheets

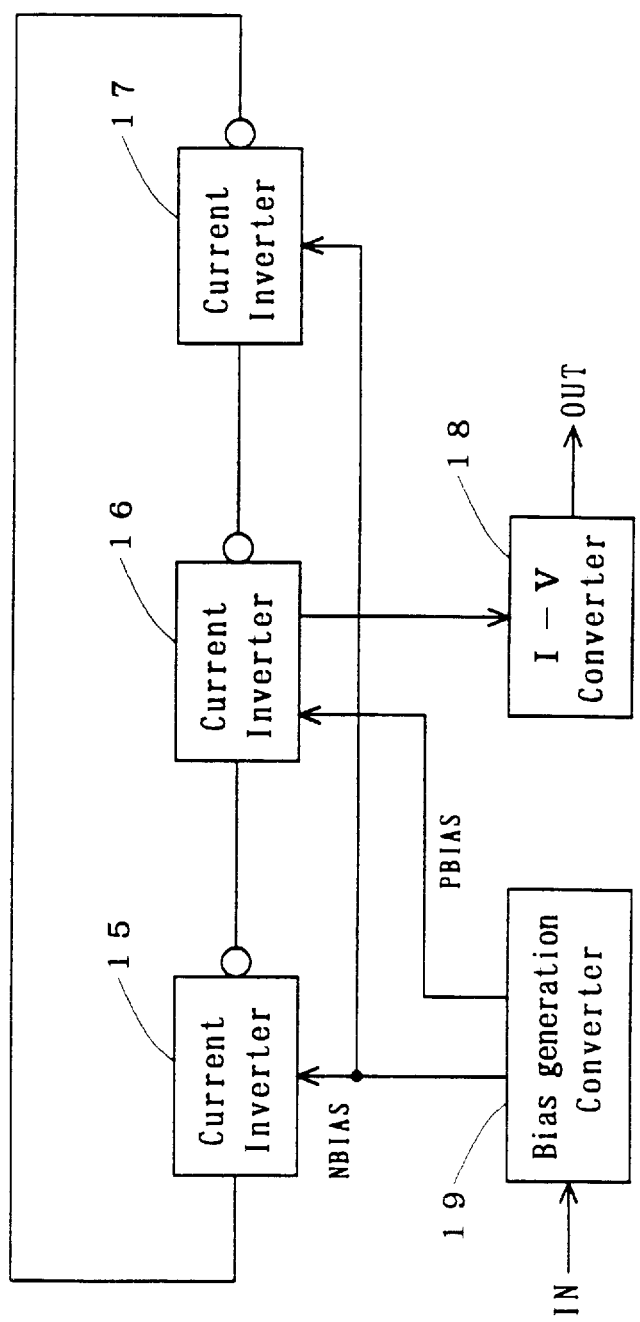
F I G. 36

CURRENT TYPE RING OSCILLATOR, AND VOLTAGE-CONTROLLED OSCILLATOR HAVING CURRENT TYPE RING OSCILLATOR

This is a Division of application Ser. No. 08/544,280 filed on Oct. 17, 1995 and now U.S. Pat. No. 5,656,954.

BACKGROUND OF THE INVENTION

1. Field of the Invention

The present invention relates to circuits including a current type ring oscillator using a current type inverter circuit, and a voltage-controlled oscillator using a current type inverter circuit.

2. Description of the Background Art

FIG. 47 is a circuitry diagram showing a structure of a conventional biasing CMOS inverter circuit. In FIG. 47, the CMOS inverter circuit is formed by an inverter part 100 and a bias circuit part 101.

In the inverter part 100, PMOS transistors Q201 and Q202 and NMOS transistors Q203 and Q204 are connected in series to each other between a power source VDD and a ground level. A bias voltage PBIAS is applied to a gate of the PMOS transistor Q201 while a bias voltage NBIAS is applied to a gate of the NMOS transistor Q204. Gates of the PMOS transistor Q202 and the NMOS transistor Q203 are connected in common.

In the bias circuit part 101, a current mirror circuit is formed by PMOS transistors Q205 and Q206 which share a gate. A source of the PMOS transistor Q205 is connected to the power source VDD while a gate and a drain of the PMOS transistor Q205 are grounded through a reference current source 102. A drain of the PMOS transistor Q206 is connected to a gate and a drain of the NMOS transistor Q207. A source of the NMOS transistor Q207 is grounded.

A gate voltage of the transistors Q205 and Q206 is supplied to the inverter part 100 as the bias voltage PBIAS, while a gate voltage of the transistor Q207 is supplied to the inverter part 100 as the bias voltage NBIAS.

In this structure, biasing in the inverter part 100 of the CMOS inverter circuit is set by the bias voltage PBIAS and the bias voltage NBIAS which are set in the bias circuit part 101. An input signal IN is supplied to the gates of the PMOS transistor Q202 and the NMOS transistor Q203 in the inverter part 100. From the drains of PMOS transistor Q202 and the NMOS transistor Q203, as an output signal OUT, the inverter part 100 outputs a signal which is obtained by reversing the logic value of the input signal IN.

The conventional logic circuit of FIG. 47 such as a CMOS inverter which operates in response to a voltage signal transmits information "1" and "0" when the input signal IN and the output signal OUT swing a full range from the ground level (0V) to the power source voltage level. Due to this constraint, the conventional logic circuit cannot operate at a high speed. Further, when the input signal IN has an intermediate voltage, the conventional logic circuit carries a through current, which unnecessarily uses a consumption power.

SUMMARY OF THE INVENTION

A first aspect of the present invention is related to a current type ring oscillator, comprising: a first power source and a second power source; and a first to an N-th (N≧3, N is an odd number) current type inverter circuits, wherein the first to the N-th current type inverter circuits each including: first reference current supply means having one end which is connected to the first power source and the other end for supplying a first reference current, the first reference current supply means receiving a first control signal from outside, the current quantity of the first reference current being set based on the first control signal; a first current mirror circuit having a first input part for receiving an input current and a first output part which is connected to the other end of the first reference current supply means so as to supply a first intermediate output current, whose current quantity is in proportion to that of the input current, between the first output part and the second power source; and a second current mirror circuit having a second input part which is connected to the other end of the first reference current supply means and a second output part for carrying an output current so as to supply the output current, whose current quantity is in proportion to that of a first intermediate input current which flows between the second input part and the second power source, between the second output part and the second power source, wherein the second to the (N−1)-th current type inverter circuits each including: second reference current supply means having one end which is connected to the second power source and the other end for supplying a second reference current, the second reference current supply means receiving a second control signal from outside, the current quantity of the second reference current being set based on the second control signal, a third current mirror circuit having a first input part for receiving an input current and a first output part which is connected to the other end of the second reference current supply means so as to supply a second intermediate output current, whose current quantity is in proportion to that of the input current, between the first output part and the first power source; and a fourth current mirror circuit having a second input part which is connected to the other end of the second reference current supply means and a second output part for carrying an output current so as to supply the output current between the second output part and the first power source, the current quantity of the output current is in proportion to that of a second intermediate input current which flows between the second input part and the first power source, wherein in the first to the N-th current type inverter circuits, a second output part of the i-th (1≦i≦(N−1)) current type inverter circuit is connected to a first input part of the (i+1)-th current type inverter circuit, and the current type ring oscillator further comprises: a connection circuit having a first connection part and a second connection part, the first connection part being connected to the second output part of the N-th current type inverter circuit, the second connection part being connected to the first input part of the first current type inverter circuit, the connection circuit supplying a current between the first power source and the first input part of the first current type inverter circuit as the input current to the first current type inverter circuit, the current quantity of the input current is in proportion to that of the output current from the N-th current type inverter circuit; and voltage output means for receiving the output current from the second output part of one of the first to the N-th current type inverter circuits, the voltage output means performing current/voltage conversion on the output current to output a voltage output signal.

A second aspect of the present invention is related to a voltage-controlled oscillator comprising: a current type ring oscillator, including: a first power source and a second power source; and a first to an N-th (N≧3, N is an odd number) current type inverter circuits, wherein the first to the N-th current type inverter circuits each including: first reference current supply means having one end which is connected to the first power source and the other end for supplying a first reference current, the first reference current supply means receiving a first control signal from outside, the current quantity of the first reference current being set based on the first control signal; a first current mirror circuit having a first input part for receiving an input current and a first output part which is connected to the other end of the first reference current supply means so as to supply a first intermediate output current, whose current quantity is in proportion to that of the input current, between the first output part and the second power source; and a second current mirror circuit having a second input part which is connected to the other end of the first reference current supply means and a second output part for carrying an output current so as to supply the output current, whose current quantity is in proportion to that of a first intermediate input current which flows between the second input part and the second power source, between the second output part and the second power source, wherein the second to the (N–1)-th current type inverter circuits each including: second reference current supply means having one end which is connected to the second power source and the other end for supplying a second reference current, the second reference current supply means receiving a second control signal from outside, the current quantity of the second reference current being set based on the second control signal, a third current mirror circuit having a first input part for receiving an input current and a first output part which is connected to the other end of the second reference current supply means so as to supply a second intermediate output current, whose current quantity is in proportion to that of the input current, between the first output part and the first power source; and a fourth current mirror circuit having a second input part which is connected to the other end of the second reference current supply means and a second output part for carrying an output current so as to supply the output current between the second output part and the first power source, the current quantity of the output current is in proportion to that of a second intermediate input current which flows between the second input part and the first power source, wherein in the first to the N-th current type inverter circuits, a second output part of the i-th (1≦i≦(N–1)) current type inverter circuit is connected to a first input part of the (i+1)-th current type inverter circuit, and the current type ring oscillator further comprises: a connection circuit having a first connection part and a second connection part, the first connection part being connected to the second output part of the N-th current type inverter circuit, the second connection part being connected to the first input part of the first current type inverter circuit, the connection circuit supplying a current between the first power source and the first input part of the first current type inverter circuit as the input current to the first current type inverter circuit, the current quantity of the output current is in proportion to that of the output current from the N-th current type inverter circuit; and voltage output means for receiving the output current from the second output part of one of the first to the N-th current type inverter circuits, the voltage output means performing current/voltage conversion on the output current to output a voltage output signal, the voltage-controlled oscillator further comprise a control signal generating circuit receiving a voltage input signal and generating the first and the second control signals based on the voltage input signal in such a manner that the first and the second reference currents have the same current quantity.

In the current type ring oscillator of the first aspect of the present invention, of the first to the N-th current type inverter circuits, the second output part of the i-th (1≦i≦ (N–1)) current type inverter circuit is connected to a first input part of the (i+1)-th current type inverter circuit. The connection circuit supplies a current, whose current quantity is in proportion to that of the output current from the N-th current type inverter circuit, between the first power source and the first input part of the first current type inverter circuit as the input current for the first current type inverter circuit. Hence, the N current type inverter circuits are connected to each other in a loop connection.

By changing the current quantities of the first and the second reference currents based on the first and the second control signals, it is therefore possible to output the voltage output signal which has a changing oscillating frequency.

The voltage-controlled oscillator of the second aspect comprises control the signal generating circuit for, receiving the voltage input signal and generating the first and the second control signals based on the voltage input signal in such a manner that the first and the second reference currents have the same current quantity. Hence, it is possible to output the voltage output signal whose oscillating frequency is changed based on the voltage input signal.

Accordingly, it is an object of the present invention to obtain high speed and low consumption power circuits including, a current type ring oscillator using a current type inverter circuit, and a voltage-controlled oscillator using a current type inverter circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 36 is a block diagram showing a structure of a voltage-controlled oscillator according to a sixteenth related embodiment of the present invention;

DESCRIPTION OF THE PREFERRED EMBODIMENTS

<<First Related Embodiment>>

<First Aspect>

Figure 1:
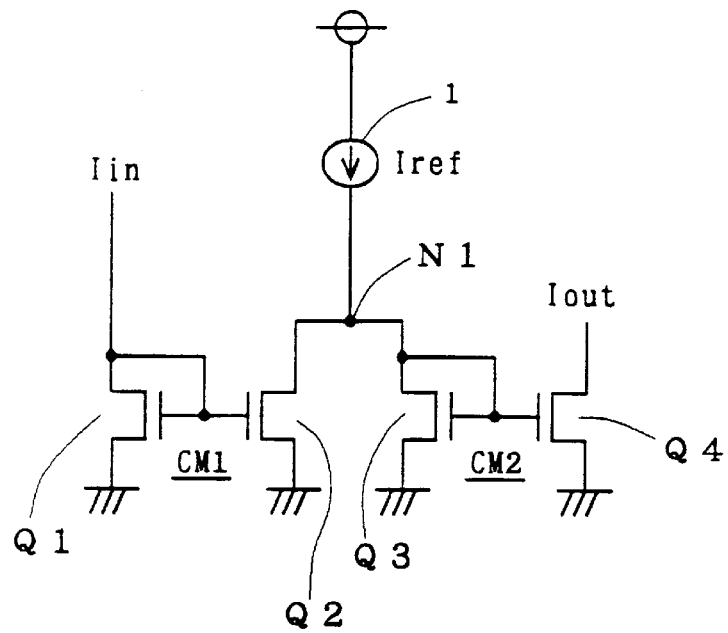
FIG. 1 is a circuit diagram showing a structure of a current type inverter circuit according to a first aspect of a related embodiment of the present invention.

FIG. 1 is a circuit diagram showing a structure of a current type inverter circuit according to a first aspect of a first related embodiment of the present invention. As shown in FIG. 1, the current type inverter circuit according to the first aspect of the first related embodiment is formed by a reference current source 1 and current mirror circuits CM1 and CM2.

One end of the reference current source 1 is connected to a power source VDD. The reference current source 1 receives a reference current Iref at the other end thereof. The current mirror circuit CM1 is formed by NMOS transistors Q1 and Q2 which share a gate. An input current Iin is supplied to a drain and a gate of the NMOS transistor Q1 which serve as an input part. A source of the NMOS transistor Q1 is grounded. On the other hand, as an output part, a drain of the NMOS transistor Q2 is connected to a node N1 of the other end side of the reference current source 1. A source of the NMOS transistor Q2 is grounded.

The current mirror circuit CM2 is formed by NMOS transistors Q3 and Q4 which share a gate. As an input part, a drain and a gate of the NMOS transistor Q3 are connected to the node N1. A source of the NMOS transistor Q3 is grounded. A drain of the NMOS transistor Q4 functions as an output part which outputs an output current Iout. A source of the NMOS transistor Q4 is grounded.

In the current mirror circuits CM1 and CM2, the following conditions are satisfied:

TS1≧1;

TS2≧1; and

TS1·TS2>1 where TS1 is a ratio of the size of the NMOS transistor Q2 to the size of the NMOS transistor Q1 and TS2 is a ratio of the size of the NMOS transistor Q4 to the size of the NMOS transistor Q3.

Now, a description will be given on an operation of such a structure, defining that the input current Iin ≧ the reference current Iref, a state where the input current Iin (and the output current Iout) flows="1" and a state where the input current Iin does not flow="0."

When Iin="1", the reference current Iref completely flows into the current mirror circuit CM1. That is, the reference current Iref in its entirety flows between the drain and the source of the NMOS transistor Q2 of the current mirror circuit CM1 as an intermediate output current. This allows no intermediate input current into the input part of the current mirror circuit CM2. In other words, the drain of the NMOS transistor Q3 of the current mirror circuit CM2 enters a floating state. As a result, the output current Iout does not flow between the drain and the source of the NMOS transistor Q4, i.e., the output current Iout="0."

On the other hand, when Iin="0," no intermediate output current flows in the current mirror circuit CM1. Hence, the reference current Iref in its entirety flows between the drain and the source of the NMOS transistor Q3 as an intermediate input current into the current mirror circuit CM2. As a result, the output current Iout which is in proportion in current quantity to the reference current Iref flows between the drain and the source of the NMOS transistor Q4, i.e., the output current Iout="1."

Thus, the current type inverter circuit according to the first preferred embodiment can reverse a logic value regarding a relationship between the input current Iin and the output current Iout.

A gate voltage VGS of the transistors which form the current mirror circuit CM1 changes depending on the input current Iin. However, when the input current Iin has a sufficiently small value because of a drain current characteristic which is determined by the size of the NMOS transistor Q1, the gate voltage VGS is set around a few hundred mV over a threshold voltage.

This suppresses the amplitude of the gate voltage based on "1"/"0" of the input current Iin sufficiently smaller than the amplitude of the gate voltage VGS in the conventional CMOS inverter which swings a full range from the ground level (0V) to the power source voltage VDD, thereby enabling a high speed operation (First effect).

Further, since a current needed for the current type inverter circuit to operate is determined by the reference current Iref, by setting the reference current Iref sufficiently small, it is possible to suppress a through current to the smallest necessary level (Second effect). This effect is advantageous particularly during a high speed switching operation. In addition, there is another effect from the design point of view (Third effect) that it is possible to accurately grasp an operation current during designing of the device.

Still further, since a current type inverter circuit basically operates in response to a current value, the operation speed has no dependency upon a power source voltage. Hence, there is an effect (Fourth effect) that a reduction of the power source voltage does not slow down the operation speed.

Even further, since the transistor size ratios TS1 and TS2 of the current mirror circuits CM1 and CM2 are set to satisfy the conditions TS1≧1, TS2≧1 and TS1·TS2>1, mirror ratios RM1 and RM2 of the current mirror circuits CM1 and CM2 satisfy relationships RM1≧1, RM2≧1 and RM1·RM2>1.

Hence, by setting a gain of the output current Iout with respect to the input current Iin into the current type inverter circuit sufficiently larger than 1, it is possible to ensure that the current quantity between the input and the output of the current type inverter circuit will not attenuate during an actual operation of the current type inverter circuit (Fifth effect).

The fifth effect above is created only if the mirror ratio RM1 of the current mirror circuit CM1 satisfies a relationship I1·RM1≧1 where I1 is the quantity of the input current Iin and IR is the quantity of the reference current Iref.

<Second Aspect>

Figure 2:
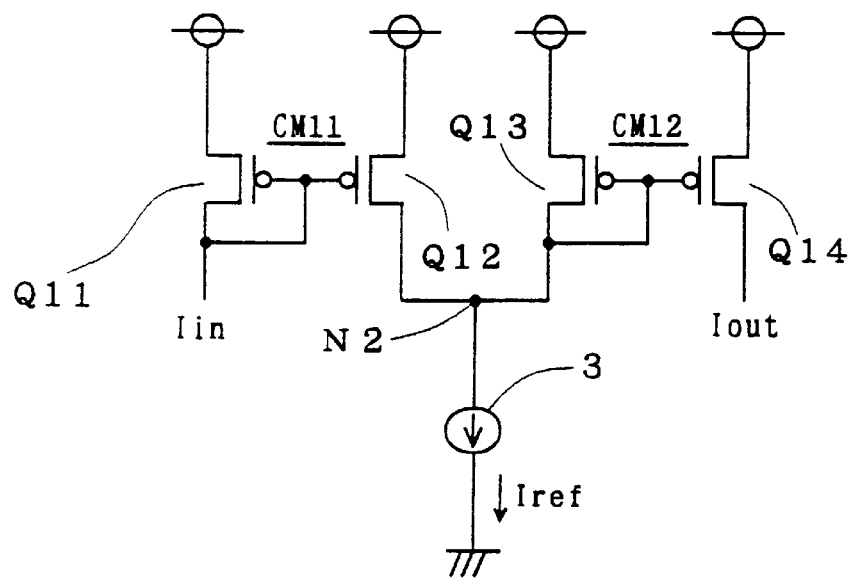
FIG. 2 is a circuit diagram showing a structure of a current type inverter circuit according to a second aspect of a first related embodiment of the present invention.

FIG. 2 is a circuit diagram showing a structure of a current type inverter circuit according to a second aspect of the first related embodiment of the present invention. As shown in FIG. 2, the current type inverter circuit according to the second aspect is formed by a reference current source 3 and current mirror circuits CM11 and CM12.

One end of the reference current source 3 is grounded. The reference current source 3 receives a reference current Iref at the other end thereof. The current mirror circuit CM11 is formed by PMOS transistors Q11 and Q12 which share a gate. The input current Iin is supplied to a drain and a gate of the PMOS transistor Q11 which serve as an input part. A source of the PMOS transistor Q11 is connected to a power source VDD. On the other hand, as an output part, a drain of the PMOS transistor Q12 is connected to an node N2 of the other end side of the reference current source 3. A source of the PMOS transistor Q12 is connected to the power source VDD.

The current mirror circuit CM12 is formed by PMOS transistors Q13 and Q14 which share a gate. A drain and a gate of the PMOS transistor Q13 are connected to the node N2 as an input part while a source of the PMOS transistor Q13 is connected to the power source VDD. A drain of the PMOS transistor Q14 functions as an output part which outputs the output current Iout. A source of the PMOS transistor Q14 is connected to the power source VDD.

In the current mirror circuits CM11 and CM12, the following conditions are all satisfied:

TS1≧1;
TS2≧1; and
TS1·TS2>1 where TS1 is a ratio of the size of the PMOS transistor Q12 to the size of the PMOS transistor Q11 and TS2 is a ratio of the size of the PMOS transistor Q14 to the size of the PMOS transistor Q13.

In such a structure, when Iin="1", the reference current Iref completely flows into the current mirror circuit CM11. That is, the reference current Iref in its entirety flows between the drain and the source of the PMOS transistor Q12 of the current mirror circuit CM11 as an intermediate output current. This allows no intermediate input current into the input part of the current mirror circuit CM12. In other words, the drain of the PMOS transistor Q13 of the current mirror circuit CM12 enters a floating state. As a result, the output current Iout does not flow between the drain and the source of the PMOS transistor Q14, i.e., the output current Iout="0."

On the other hand, when Iin="0," no intermediate output current flows in the current mirror circuit CM11. Hence, the reference current Iref in its entirety flows between the drain and the source of the PMOS transistor Q13 as the intermediate input current into the current mirror circuit CM12. As a result, the output current Iout which is in proportion in current quantity to the reference current Iref flows between the drain and the source of the PMOS transistor Q14, i.e., the output current Iout="1."

Thus, like the current type inverter circuit according to the first aspect which is formed by NMOS transistors, the current type inverter circuit according to the second aspect which is formed by PMOS transistors can perform a logical reverse operation with respect to a relationship between the input current Iin and the output current Iout. Hence, the current type inverter circuit according to the second aspect creates the first to the fifth effects described in relation to the first aspect.

The fifth effect above is created only if the mirror ratio RM11 of the current mirror circuit CM11 satisfies a relationship $I1 \cdot RM11 \geq 1$ where I1 is the quantity of the input current Iin and IR is the quantity of the reference current Iref.

<Third Aspect>

Figure 3:
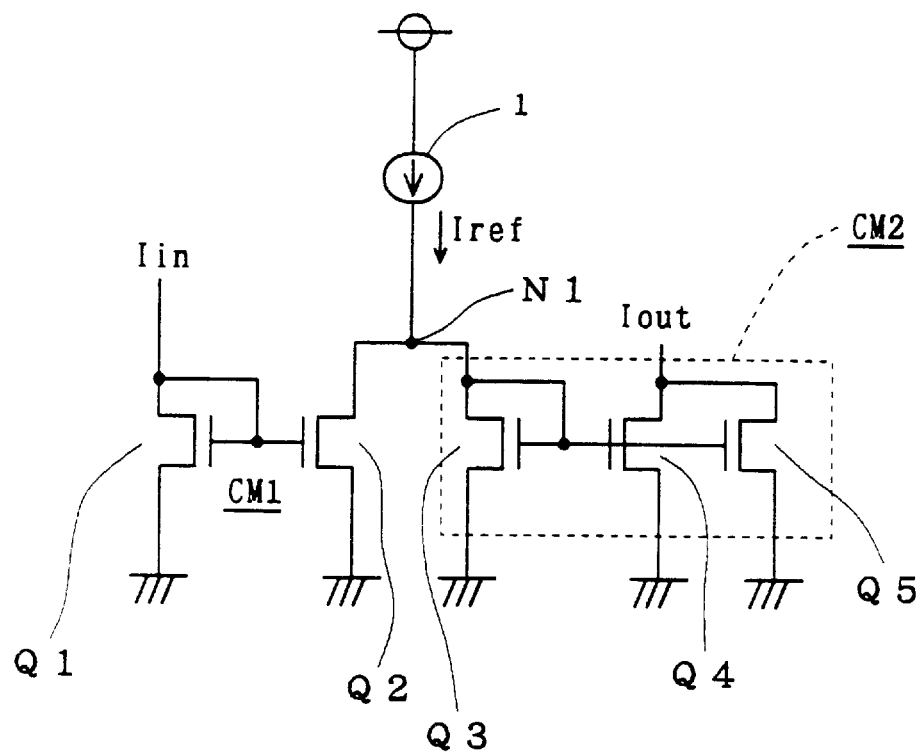
FIG. 3 is a circuit diagram showing a structure of a current type inverter circuit according to a third aspect of the first related embodiment of the present invention.

FIG. 3 is a circuit diagram showing a structure of a current type inverter circuit according to a third aspect of the first related embodiment of the present invention. As shown in FIG. 3, the current type inverter circuit is formed by the reference current source 1 and the current mirror circuits CM1 and CM2.

One end of the reference current source 1 is connected to a power source VDD. The reference current source 1 receives a reference current Iref at the other end thereof. The current mirror circuit CM1 is formed by NMOS transistors Q1 and Q2 which share a gate. The input current Iin is supplied to a drain and a gate of the NMOS transistor Q1 which serve as an input part. A source of the NMOS transistor Q1 is grounded. On the other hand, as an output part, a drain of the NMOS transistor Q2 is connected to an node N1 of the other end side of the reference current source 1. A source of the NMOS transistor Q2 is grounded.

The current mirror circuit CM2 is formed by NMOS transistors Q3, Q4 and Q5 which share a gate. As an input part, a drain and a gate of the NMOS transistor Q3 are connected to the node N1. A source of the NMOS transistor Q3 is grounded. Drains of the NMOS transistors Q4 and Q5 are connected in common to function as an output part for outputting the output current Iout. Sources of the NMOS transistors Q4 and Q5 are commonly grounded.

In the current mirror circuits CM1 and CM2, the NMOS transistors Q1 to Q5 have the same transistor size.

Like the current type inverter circuit shown in FIG. 1, this current type inverter circuit as well can perform a logical reverse operation with respect to relationship between the input current Iin and the output current Iout. Hence, the current type inverter circuit creates the first to the fourth effects described in relation to the first aspect.

Further, although a mirror ratio of the current mirror circuit CM1 is 1, since the current mirror circuit CM2 includes two transistors for outputting the output current Iout, the current mirror circuit CM2 has a mirror ratio of 2.

Hence, by setting a gain of the output current Iout with respect to the input current Iin of the current type inverter circuit sufficiently larger than 1, it is possible to ensure that the current quantity between the input and the output of the current type inverter circuit will not attenuate during an actual operation of the current type inverter circuit, whereby the fifth effect is achieved.

The fifth effect above is created only if the mirror ratio RM1 of the current mirror circuit CM1 satisfies a relationship $I1 \cdot RM1 \geq 1$ where I1 is the quantity of the input current Iin and IR is the quantity of the reference current Iref.

<Fourth Aspect>

Figure 4:
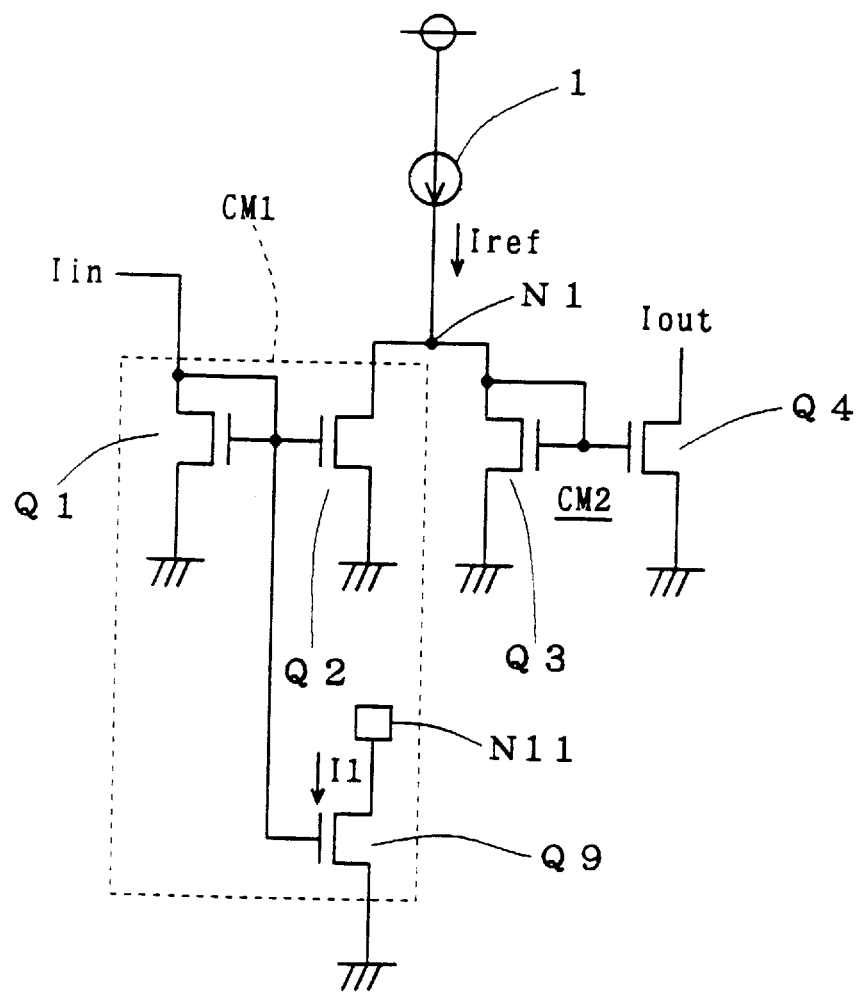
FIG. 4 is a circuit diagram showing a structure of a current type inverter circuit according to a fourth aspect of the first preferred embodiment of the present invention.

FIG. 4 is a circuit diagram showing a structure of a current type inverter circuit according to a fourth aspect of the first related embodiment of the present invention. As shown in FIG. 4, the current mirror circuit CM1 is formed by NMOS transistors Q1, Q2 and Q9 which share a gate. As an input part, a drain and a gate of the NMOS transistor Q1 receive the input current Iin. A source of the NMOS transistor Q1 is grounded. On the other hand, as an output part, a drain of the NMOS transistor Q2 is connected to an node N1 of the other end side of the reference current source 1. A source of the NMOS transistor Q2 is grounded. A drain of the NMOS transistor Q9 is connected to the node N1 while a source of the NMOS transistor Q9 is grounded.

In the current mirror circuit CM1, a ratio of the size of the NMOS transistor Q9 to the size of the NMOS transistor Q1 is TS3 ($\geq 1$).

In such a structure, in addition to the inverter operation of the first aspect, a circuit connected to the node N1 takes in the output current I1 which is in proportion in current quantity to the input current Iin. That is, as an optional output from the current type inverter circuit, the output current I1 is obtained which activates outputting of a non-reversed output of the input current Iin.

<<Second Preferred Embodiment>>

<First Aspect>

Figure 5:
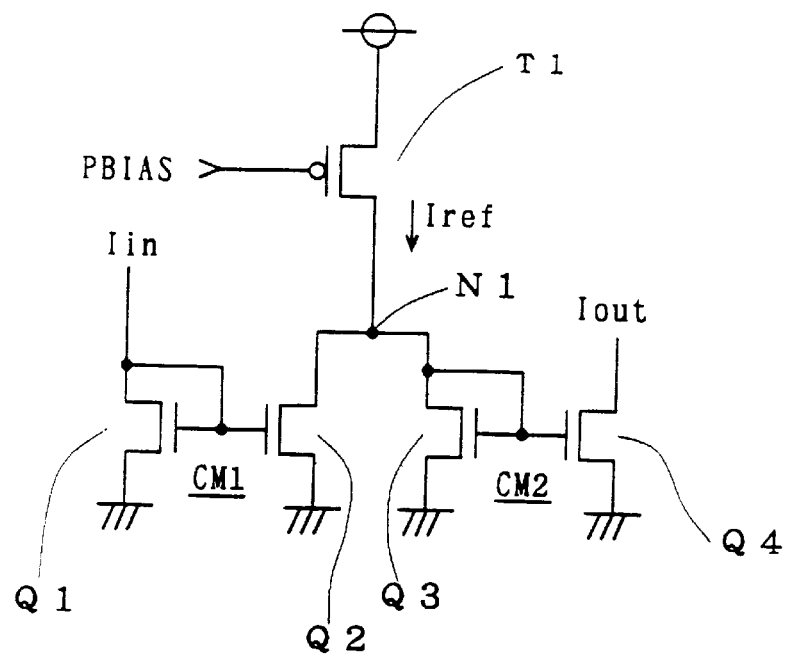
FIG. 5 is a circuit diagram showing a structure of a current type inverter circuit according to a first aspect of a second related embodiment of the present invention.

FIG. 5 is a circuit diagram showing a structure of a current type inverter circuit according to a first aspect of a second related embodiment of the present invention. As shown in FIG. 5, the current type inverter circuit of the second preferred embodiment is formed by a PMOS transistor T1 for setting a reference current and current mirror circuits CM1 and CM2.

The PMOS transistor T1 has a source which is connected to a power source VDD, a gate receiving a bias voltage PBIAS and a drain which is connected to an node N1. Hence, the bias voltage PBIAS controls the quantity of a reference current Iref which is supplied from the drain of the PMOS transistor T1. The other structure is similar to that of the current type inverter circuit of the first aspect of the first preferred embodiment shown in FIG. 1, and therefore, will not be described here.

Having such a structure, like the current type inverter circuit of the first preferred embodiment, the current type inverter circuit of according to the first aspect of the second related embodiment can perform a logical reverse operation with respect to a relationship between the input current Iin and the output current Iout. Hence, the current type inverter circuit according to the second aspect creates the first to the fifth effects.

In addition, it is possible to change the quantity of the reference current Iref by the bias voltage PBIAS, and therefore, the driving force for the current type inverter circuit is adjustable (Sixth effect).

<Second Aspect>

Figure 6:
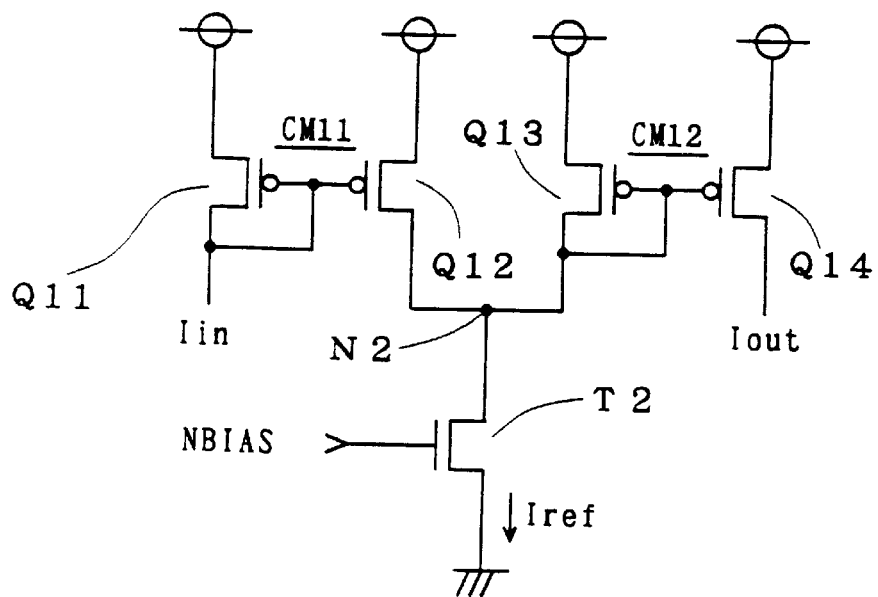
FIG. 6 is a circuit diagram showing a structure of a current type inverter circuit according to a second aspect of the second related embodiment of the present invention.

FIG. 6 is a circuit diagram showing a structure of a current type inverter circuit according to a second aspect of the second related embodiment of the present invention. As shown in FIG. 6, the current type inverter circuit of the second aspect is formed by an NMOS transistor T2 for setting a reference current and current mirror circuits CM11 and CM12.

The NMOS transistor T2 has a source which is grounded, a gate receiving a bias voltage NBIAS and a drain which is connected to an node N2. Hence, the bias voltage NBIAS controls the quantity of the reference current Iref which flows into the drain of the NMOS transistor T2. The other structure, being similar to that of the current type inverter circuit of the second aspect of the first related embodiment shown in FIG. 2, will not be described here.

Having such a structure, like the current type inverter circuit of the first aspect, the current type inverter circuit according to the second aspect of the second related embodiment can perform a logical reverse operation with respect to a relationship between the input current Iin and the output current Iout. Hence, the current type inverter circuit according to the second aspect creates the first to the fifth effects.

Further, it is possible to change the quantity of the reference current Iref by the bias voltage NBIAS, and therefore, the driving force for the current type inverter circuit is adjustable (Sixth effect).

<Third Aspect>

The current type inverter circuit according to the second aspect shown in FIG. 5 may be modified so that the mirror ratio is set equal to 1 or larger 1 by increasing the number of the transistors which are disposed on the output stage side of the current mirror circuit as in the third aspect of the first preferred embodiment.

<Fourth Aspect>

Figure 7:
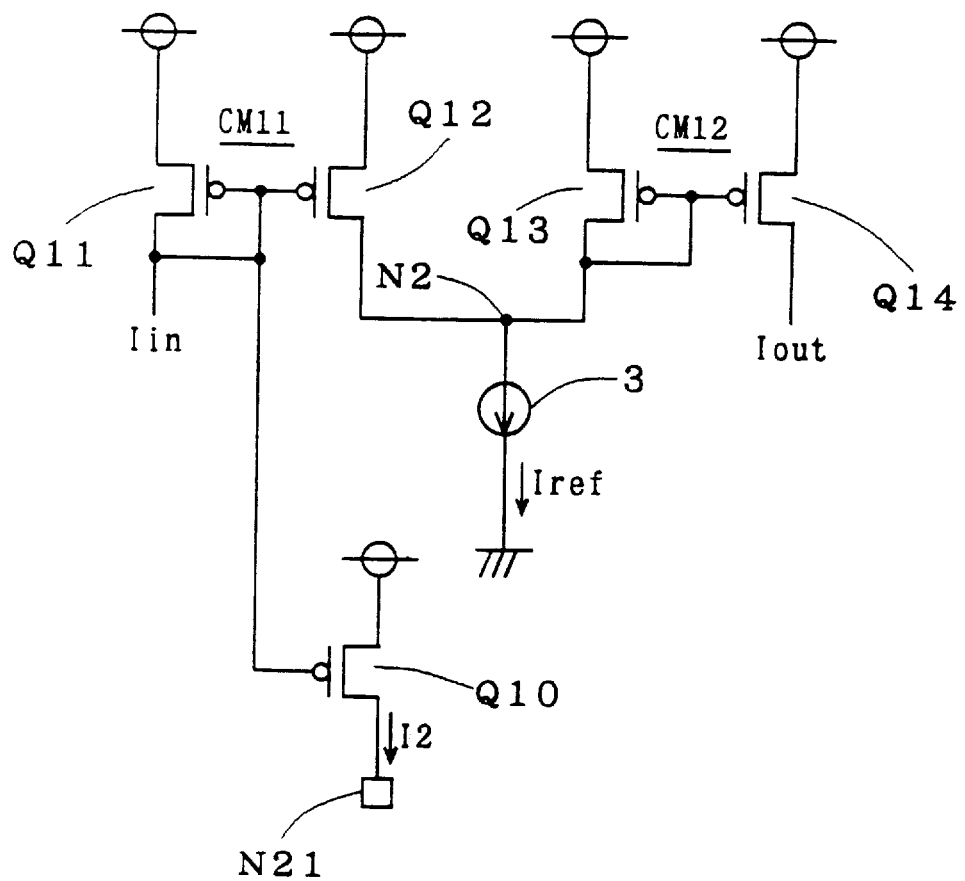
FIG. 7 is a circuit diagram showing a structure of a current type inverter circuit according to a third aspect of the second related embodiment of the present invention.

FIG. 7 is a circuit diagram showing a structure of a current type inverter circuit according to a fourth aspect of the second related embodiment of the present invention. As shown in FIG. 7, the current mirror circuit CM11 is formed by PMOS transistors Q11, Q12 and Q10 which share a gate. As an input part, a drain and a gate of the PMOS transistor Q11 receive the input current Iin. A source of the PMOS transistor Q11 is connected to the power source VDD. On the other hand, as an output part, a drain of the PMOS transistor Q12 is connected to the node N2 of the other end side of the reference current source 3. A source of the PMOS transistor Q12 is grounded. A drain of the PMOS transistor Q10 is connected to the node N2 while a source of the PMOS transistor Q10 is connected to the power source VDD.

In the current mirror circuit CM11, a ratio of the size of the PMOS transistor Q12 to the size of the PMOS transistor Q11 is TS3 ($\geq 1$).

In such a structure, in addition to the inverter operation of the first aspect, a circuit connected to an node N21 can receive an output current I2 which is in proportion in terms of current quantity to the input current Iin the current type inverter circuit. That is, as an optional output from the current type inverter circuit, the output current I2 is obtained which activates outputting of a non-reversed output of the input current Iin.

<<Third Preferred Embodiment>>

Figure 8:
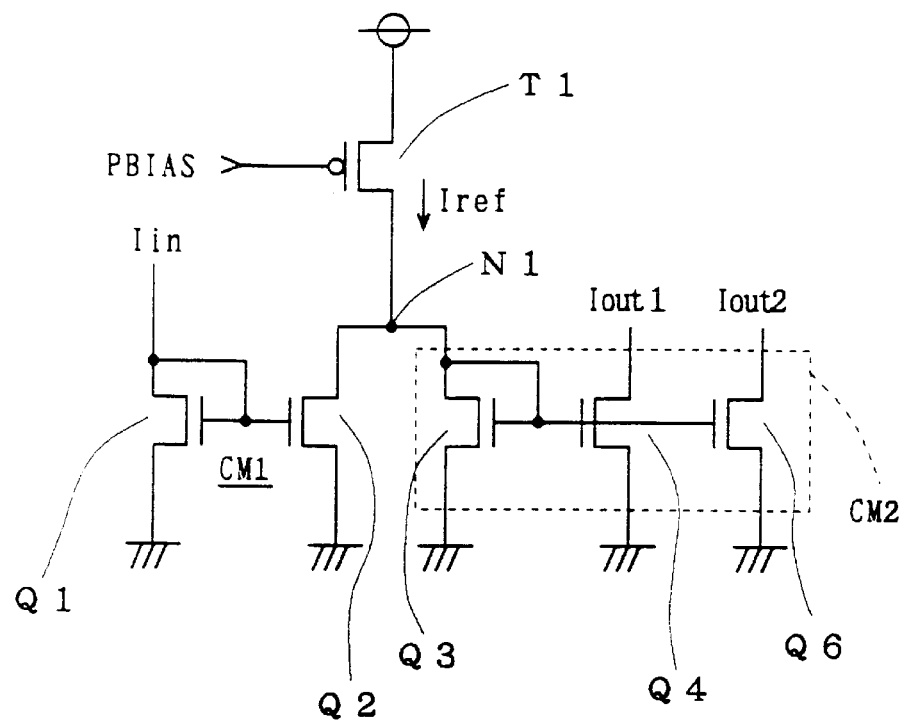
FIG. 8 is a circuit diagram showing a structure of a current type inverter circuit according to a third related embodiment of the present invention.

FIG. 8 is a circuit diagram showing a structure of a current type inverter circuit according to a third related embodiment of the present invention. As shown in FIG. 8, the current type inverter circuit of the third preferred embodiment is formed by a PMOS transistor T1 and current mirror circuits CM1 and CM2.

The current mirror circuit CM2 is formed by NMOS transistors Q3, Q4 and Q6 which share a gate. As an input part, a drain and a gate of the NMOS transistor Q3 are connected to an node N1 while a source of the NMOS transistor Q3 is grounded. A drain of the NMOS transistor Q4 functions as a first output part for carrying a first output current Iout1, and a source of the NMOS transistor Q4 is grounded. A drain of the NMOS transistor Q5 functions as a second output part for carrying a second output current Iout2, and a source of the NMOS transistor Q5 is grounded.

In the current mirror circuits CM1 and CM2, the following conditions are all satisfied:

TS1$\geq$1;

TS2$\geq$1;

TS3$\geq$1;

TS1·TS2>1; and

TS1·TS3>1 where TS1 is a ratio of the size of the NMOS transistor Q2 to the size of the NMOS transistor Q1, TS2 is a ratio of the size of the NMOS transistor Q4 to the size of the NMOS transistor Q3 and TS3 is a ratio of the size of the NMOS transistor Q6 to the size of the NMOS transistor Q3. The other structure, being similar to that of the current type inverter circuit of the first aspect of the second related embodiment shown in FIG. 5, will not be described here.

The current type inverter circuit of the third related embodiment having such a structure can perform a logical reverse operation with respect to a relationship between the input current Iin and the output currents Iout1 and Iout2. Hence, the current type inverter circuit creates the first to the fourth and the sixth effects. In short, the current type inverter circuit has a multiple output structure which provides two outputs with respect to one input.

Therefore, the current type inverter circuit of the third preferred embodiment can deal with different output paths such as multiple emitter outputs from bipolar transistors in ECL mode. Further, due to the set mirror ratio, driving force which is suitable to the load of a particular output is obtained by switching the number of the transistors or the sizes of the transistors depending on an output path.

Satisfying the conditions above and setting gains of the output currents Iout1 and Iout 2 with respect to the input current Iin sufficiently larger than 1, it is possible to ensure that the current quantity between the two inputs/outputs of the current type inverter circuit will not attenuate during an actual operation of the current type inverter circuit (Fifth effect).

The fifth effect above is created only if the mirror ratio RM1 of the current mirror circuit CM1 satisfies a relationship I1·RM1$\geq$1 where I1 is the quantity of the input current Iin and IR is the quantity of the reference current Iref.

Figure 9:
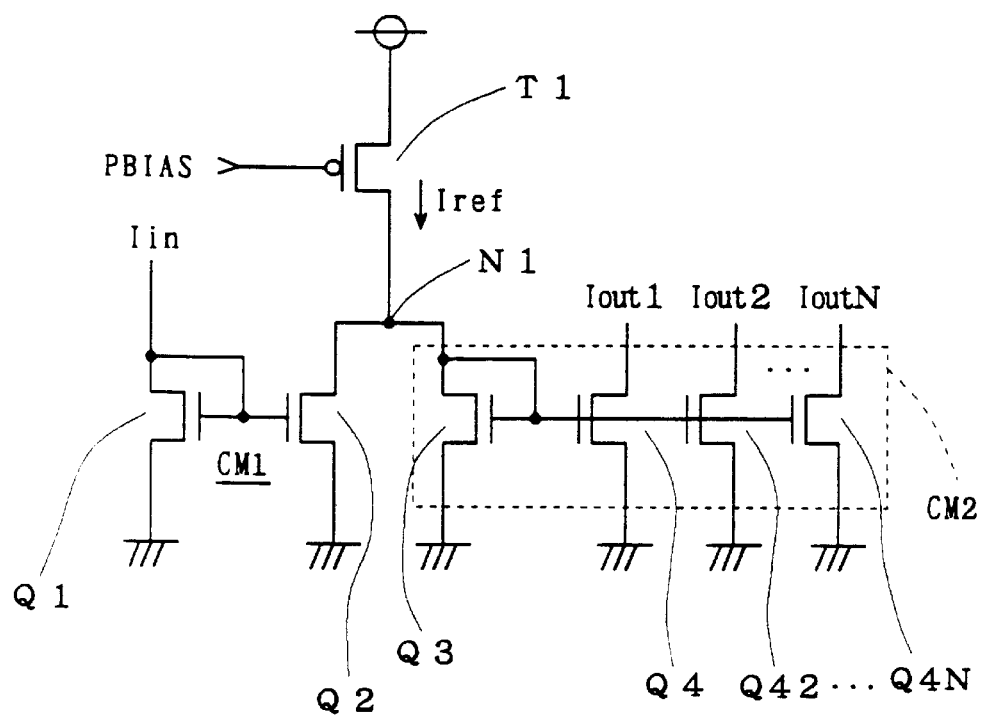
FIG. 9 is a circuit diagram showing other structure of a current type inverter circuit according to the third related embodiment of the present invention.

Although FIG. 8 shows an example where two outputs are provided for one input, (N-1) NMOS transistors Q42 to 4N may be connected in parallel to the NMOS transistor Q4 in such a manner that these NMOS transistors share a gate as shown in FIG. 9 so as to obtain a structure with one input and N outputs. In this case, however, the gain needs be equal to 1 or larger for each input/output.

<Other Aspects>

The current type inverter circuit according to the third related embodiment shown in FIG. 8 may be modified so that the current type inverter circuit is formed by PMOS transistors as in the second aspects of the first and the second preferred embodiments. Otherwise, the mirror ratio may be set larger than 1 by increasing the number of the transistors which are disposed on the output stage side of the current mirror circuit as in the third aspect of the first preferred embodiment. Alternatively, a non-reversed optional output may be provided as in the fourth aspects of the first and the second related embodiments.

<<Fourth Related Embodiment>>

Figure 10:
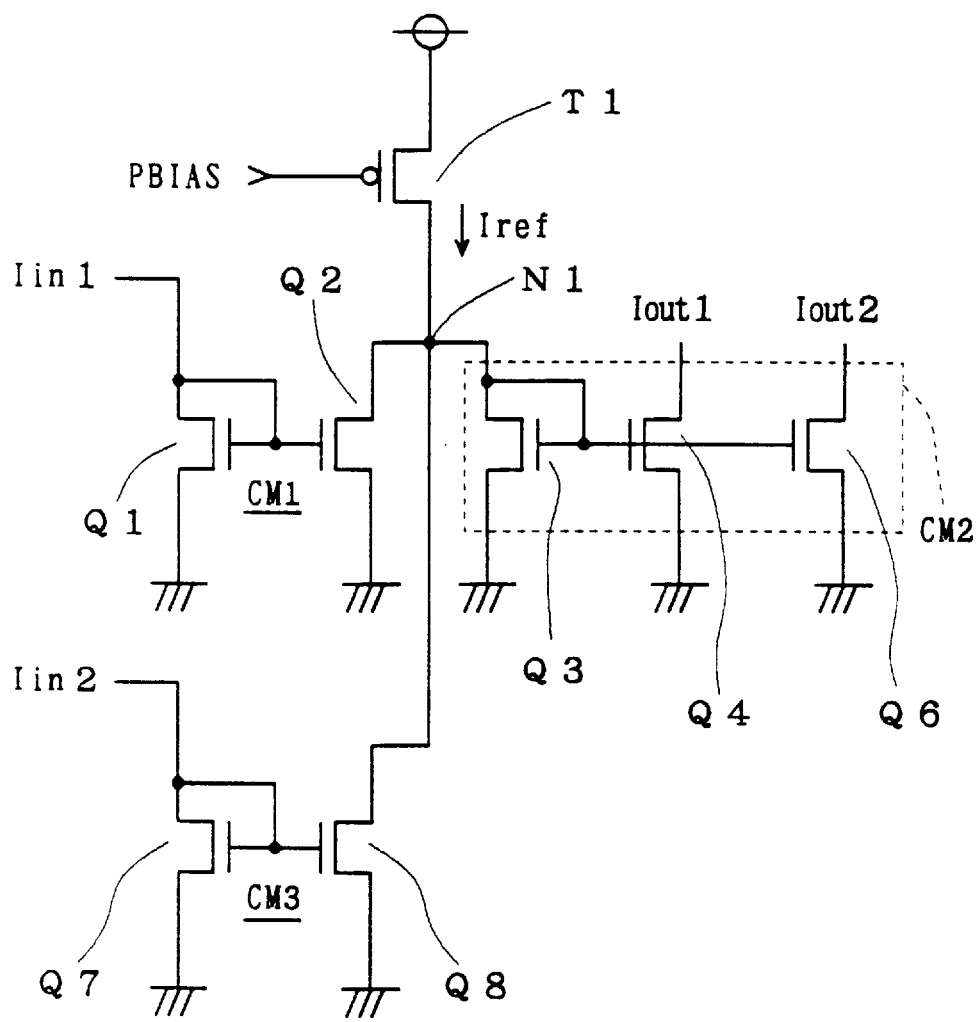
FIG. 10 is a circuit diagram showing a structure of a current type NOR gate circuit according to a fourth related embodiment of the present invention.

FIG. 10 is a circuit diagram showing a structure of a current type NOR gate circuit according to a fourth related embodiment of the present invention. As shown in FIG. 10, the current type NOR gate circuit of the fourth preferred embodiment is formed by a PMOS transistor T1 and current mirror circuits CM1 to CM3.

The PMOS transistor T1 has a source which is connected to a power source VDD, a gate receiving a bias voltage PBIAS and a drain which is connected to an node N1. Hence, the bias voltage PBIAS controls the quantity of a reference current Iref which is available from the drain of the PMOS transistor T1.

The current mirror circuit CM1 is formed by NMOS transistors Q1 and Q2 which share a gate. As an input part, a drain and a gate of the NMOS transistor Q1 receive an input current Iin1. A source of the NMOS transistor Q1 is grounded. On the other hand, as an output part, a drain of the NMOS transistor Q2 is connected to an node N1. A source of the NMOS transistor Q2 is grounded.

The current mirror circuit CM3 is formed by NMOS transistors Q7 and Q8 which share a gate. As an input part, a drain and a gate of the NMOS transistor Q7 receive an input current Iin2. A source of the NMOS transistor Q7 is grounded. On the other hand, as an output part, a drain of the NMOS transistor Q8 is connected to the node N1. A source of the NMOS transistor Q8 is grounded.

The current mirror circuit CM2 is formed by NMOS transistors Q3, Q4 and Q6 which share a gate. As an input part, a drain and a gate of the NMOS transistor Q3 are connected to the node N1. A source of the NMOS transistor Q3 is grounded. A drain of the NMOS transistor Q4 functions as a first output part for carrying a first output current Iout1, and a source of the NMOS transistor Q4 is grounded. A drain of the NMOS transistor Q6 functions as a second output part for carrying a second output current Iout2, and a source of the NMOS transistor Q6 is grounded.

In the current mirror circuits CM1 to CM3, the following conditions are all satisfied:

$TS1 \geq 1$;
$TS2 \geq 1$;
$TS3 \geq 1$;
$TS1' \geq 1$;
$TS1 \cdot TS2 > 1$;
$TS1 \cdot TS3 > 1$;
$TS1' \cdot TS2 > 1$; and
$TS1' \cdot TS3 > 1$ where TS1 is a ratio of the size of the NMOS transistor Q2 to the size of the NMOS transistor Q1, TS2 is a ratio of the size of the NMOS transistor Q4 to the size of the NMOS transistor Q3, TS3 is a ratio of the size of the NMOS transistor Q6 to the size of the NMOS transistor Q3, and TS1' is a ratio of the size of the NMOS transistor Q8 to the size of the NMOS transistor Q7.

Now, a description will be given on an operation in such a structure, defining that the input current Iin1 $\geq$ the reference current Iref, the input current Iin2 $\geq$ the reference current Iref, a state where the input current Iin1 (Iin2) flows="1" and a state where the input current Iin1 (Iin2) does not flow="0."

When Iin="1" or Iin2="1", the reference current Iref completely flows into the current mirror circuit CM1. That is, the reference current Iref in its entirety flows between the drain and the source of the NMOS transistor Q2 of the current mirror circuit CM1 or between the drain and the source of the NMOS transistor Q8 of the current mirror circuit CM3 as an intermediate output current. This allows no intermediate input current into the input part of the current mirror circuit CM2. In other words, the drain of the NMOS transistor Q3 of the current mirror circuit CM2 enters a floating state. As a result, neither the output current Iout1 nor the output current Iout2 do not flow between the drain and the source of either the NMOS transistor Q4 nor Q6, i.e., the output current Iout1="0" and the output current Iout2="0."

On the other hand, when Iin1="0" and Iin2="0," no intermediate output current flows in the current mirror circuits CM1 and CM2. Hence, the reference current Iref in its entirety flows between the drain and the source of the PMOS transistor Q3 as the intermediate input current into the current mirror circuit CM2. As a result, the output currents Iout1 and Iout2 each in proportion in terms of current quantity to the reference current Iref flows between the drain and the source of each one of the NMOS transistors Q4 and Q6, i.e., the output current Iout1="1" and the output current Iout2="1."

Thus, the current type NOR gate circuit of the fourth preferred embodiment can perform an inverted OR (NOR) operation in terms of a relationship between the input currents Iin1 and Iin2 and the output currents Iout1 and a relationship between the input currents Iin1 and Iin2 and the output currents Iout2.

Further, like the current type inverter circuit of the third preferred embodiment, the current type NOR gate circuit of the fourth related embodiment creates the first to the fourth and the sixth effects.

In addition, as described above, setting the transistor size ratios within the current mirror circuits CM1 to CM3 and setting gains of the output currents Iout1 and Iout 2 into the current type NOR gate circuit of the fourth related embodiment with respect to the input currents Iin1 and Iin2 each sufficiently larger than 1, it is possible to ensure that the current quantity between the two inputs/outputs of the current type NOR gate circuit will not attenuate during an actual operation of the current type inverter circuit (Fifth effect).

The fifth effect above is created only if the mirror ratios RM1 and RM3 of the current mirror circuits CM1 and CM3 satisfy relationships $II1 \cdot RM1 \geq 1$ and $II2 \cdot RM2 \geq 1$ where II1 and II2 are the quantities of the input currents Iin1 and Iin2, respectively, and IR is the quantity of the reference current Iref.

Figure 11:
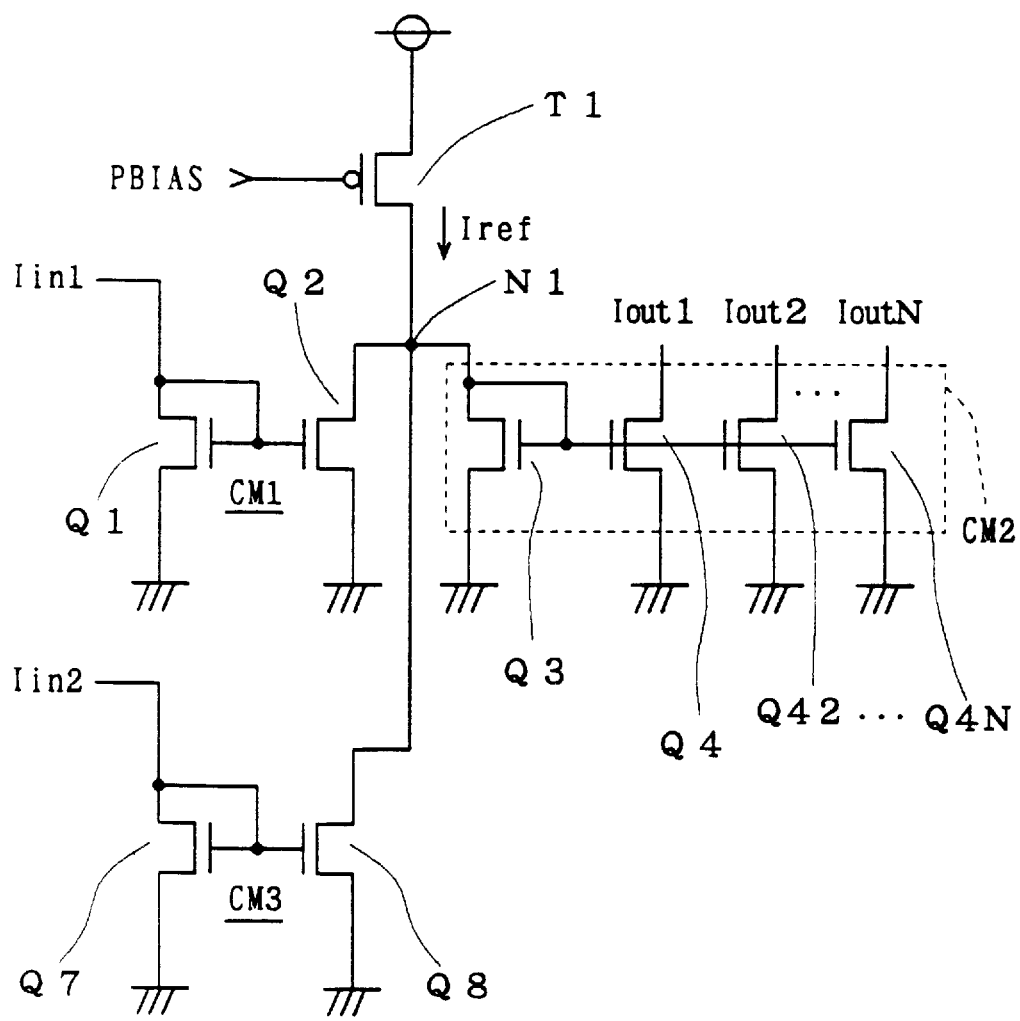
FIG. 11 is a circuit diagram showing other structure of a current type NOR gate circuit according to the fourth related embodiment of the present invention.

Although FIG. 10 shows an example where two outputs are provided for two inputs, (N−1) NMOS transistors Q42 to 4N may be connected in parallel to the NMOS transistor Q4 in such a manner that these NMOS transistors share a gate as shown in FIG. 11 like in the third related embodiment, so as to obtain a structure with two inputs and N outputs. In this case, however, the gain needs be equal to 1 or larger for each input/output.

<Other Aspects>

The current type NOR gate circuit according to the fourth related embodiment shown in FIG. 10 may be modified so that the current type NOR gate circuit is formed by PMOS transistors as in the second aspects of the first and the second preferred embodiments. Otherwise, the mirror ratio may be set larger than 1 by increasing the number of the transistors which are disposed on the output stage side of the current mirror circuit as in the third aspect of the first preferred embodiment. Alternatively, a non-reversed optional output may be provided as in the fourth aspects of the first and the second related embodiments.

<<Fifth Related Embodiment>>

<First Aspect>

Figure 12:
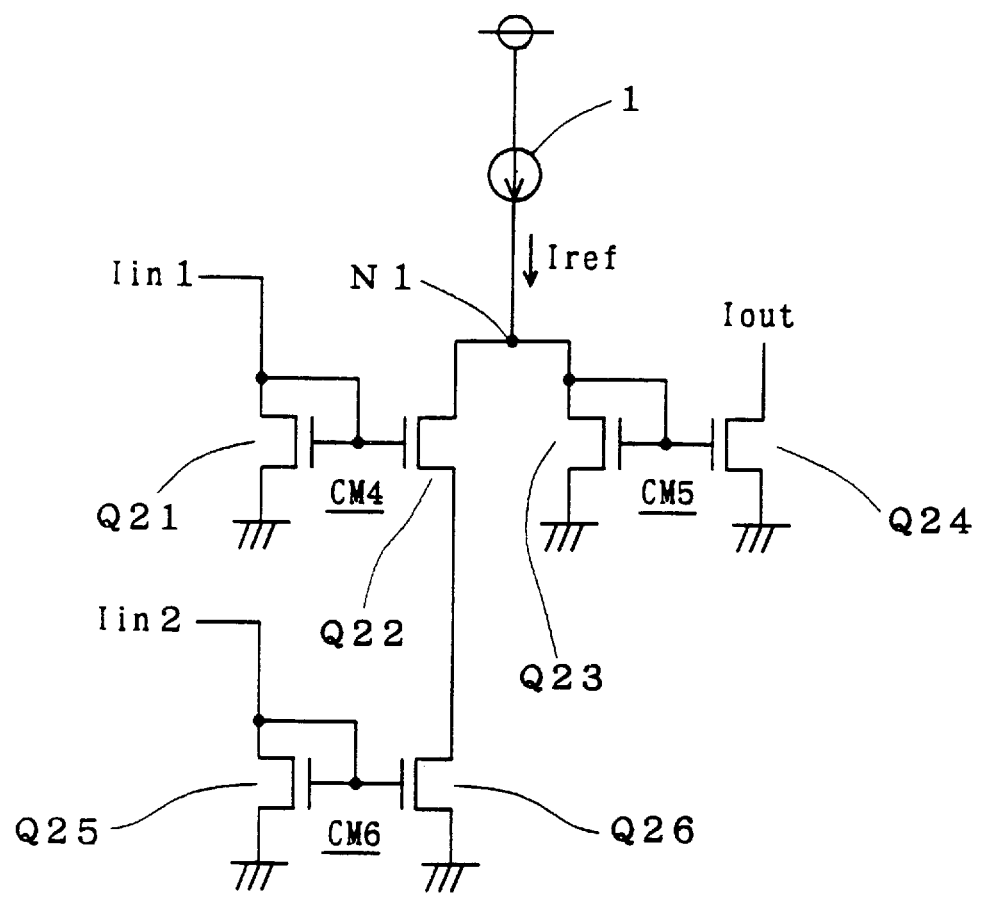
FIG. 12 is a circuit diagram showing a structure of a current type NAND gate circuit according to a first aspect of a fifth related embodiment of the present invention.

FIG. 12 is a circuit diagram showing a structure of a current type NAND gate circuit according to a first aspect of a fifth related embodiment of the present invention. As shown in FIG. 12, the current type NAND gate circuit of the fifth related embodiment is formed by a reference current source 1 and current mirror circuits CM4, CM5 and CM6.

One end of the reference current source 1 is connected to a power source VDD to provide a reference current Iref to an node N1 which is formed at the end of the reference current source 1.

The current mirror circuit CM4 is formed by NMOS transistors Q21 and Q22 which share a gate. As a first input part, a drain and a gate of the NMOS transistor Q21 receive an input current Iin1. A source of the NMOS transistor Q21 is grounded. On the other hand, as an output part, a drain of the NMOS transistor Q22 is connected to the node N1 of the other end side of the reference current source 1.

The current mirror circuit CM5 is formed by NMOS transistors Q23 and Q24 which share a gate. As an input part, a drain and a gate of the NMOS transistor Q23 are connected to the node N1. A source of the NMOS transistor Q23 is grounded. A drain of the NMOS transistor Q24 functions as an output part for carrying an output current Iout, and a source of the NMOS transistor Q24 is grounded.

The current mirror circuit CM6 is formed by NMOS transistors Q25 and Q26 which share a gate. As a second input part, a drain and a gate of the NMOS transistor Q25 receive an input current Iin2. A source of the NMOS transistor Q25 is grounded. On the other hand, as an output part, a drain of the NMOS transistor Q26 is connected to the source of the NMOS transistor Q22 of the current mirror circuit CM4. A source of the NMOS transistor Q26 is grounded.

In the current mirror circuits CM4 to CM6, the following conditions are all satisfied:

TS4$\geq$1;

TS5$\geq$1;

TS6$\geq$1;

TS4·TS5>1; and

TS6·TS5>1 where TS4 is a ratio of the size of the NMOS transistor Q22 to the size of the NMOS transistor Q21, TS5 is a ratio of the size of the NMOS transistor Q24 to the size of the NMOS transistor Q23 and TS6 is a ratio of the size of the NMOS transistor Q26 to the size of the NMOS transistor Q25.

Now, a description will be given on an operation in such a structure, defining that the input current Iin1$\geq$the reference current Iref, the input current Iin2$\geq$the reference current Iref, a state where the input current Iin1 (Iin2) flows="1" and a state where the input current Iin1 (Iin2) does not flow="0."

When Iin="1" and Iin2="1," the reference current Iref completely flows into the current mirror circuits CM4 and CM5. That is, the reference current Iref in its entirety flows between the drain and the source of the NMOS transistor Q22 of the current mirror circuit CM4 and between the drain and the source of the NMOS transistor Q26 of the current mirror circuit CM5 as an intermediate output current. This allows no intermediate input current into the input part of the current mirror circuit CM5. In other words, the drain of the NMOS transistor Q23 of the current mirror circuit CM5 enters a floating state. As a result, the output current Iout does not flow between the drain and the source of the NMOS transistor Q24, i.e., the output current Iout="0."

On the other hand, when Iin1="0" or Iin2="0," one of the NMOS transistors Q22 and Q26 of the current mirror circuits CM4 and CM5 is turned off, allowing no intermediate output current. Hence, the reference current Iref in its entirety flows between the drain and the source of the NMOS transistor Q23 as an intermediate input current of the current mirror circuit CM5. As a result, the output current Iout which is in proportion in terms of current quantity to the reference current Iref flows between the drain and the source of the NMOS transistor Q24, i.e., the output current Iout="1."

Thus, the current type NAND gate circuit of the fifth preferred embodiment can perform an inverted AND (NAND) operation in terms of a relationship between the input currents Iin1 and Iin2 and the output current Iout.

Further, like the current type inverter circuits of the first to the third related embodiments, the current type NAND gate circuit of the fifth related embodiment creates the first to the fourth effects.

In addition, as described above, setting the transistor size ratios within the current mirror circuits CM1 to CM6 and setting gains of the output current Iout with respect to the input currents Iin1 and Iin2 into the current type NAND gate circuit of the fifth preferred embodiment each sufficiently larger than 1, it is possible to ensure that the current quantity between the two inputs/outputs of the current type NOR gate circuit will not attenuate during an actual operation of the current type NAND gate circuit (Fifth effect).

The fifth effect above is created only if the mirror ratios RM4 and RM6 of the current mirror circuits CM4 and CM6 satisfy relationships II1·RM4$\geq$1 and II2·RM6$\geq$1 where II1 and II2 are the quantities of the input currents Iin1 and Iin2, respectively, and IR is the quantity of the reference current Iref.

<Second Aspect>

Figure 13:
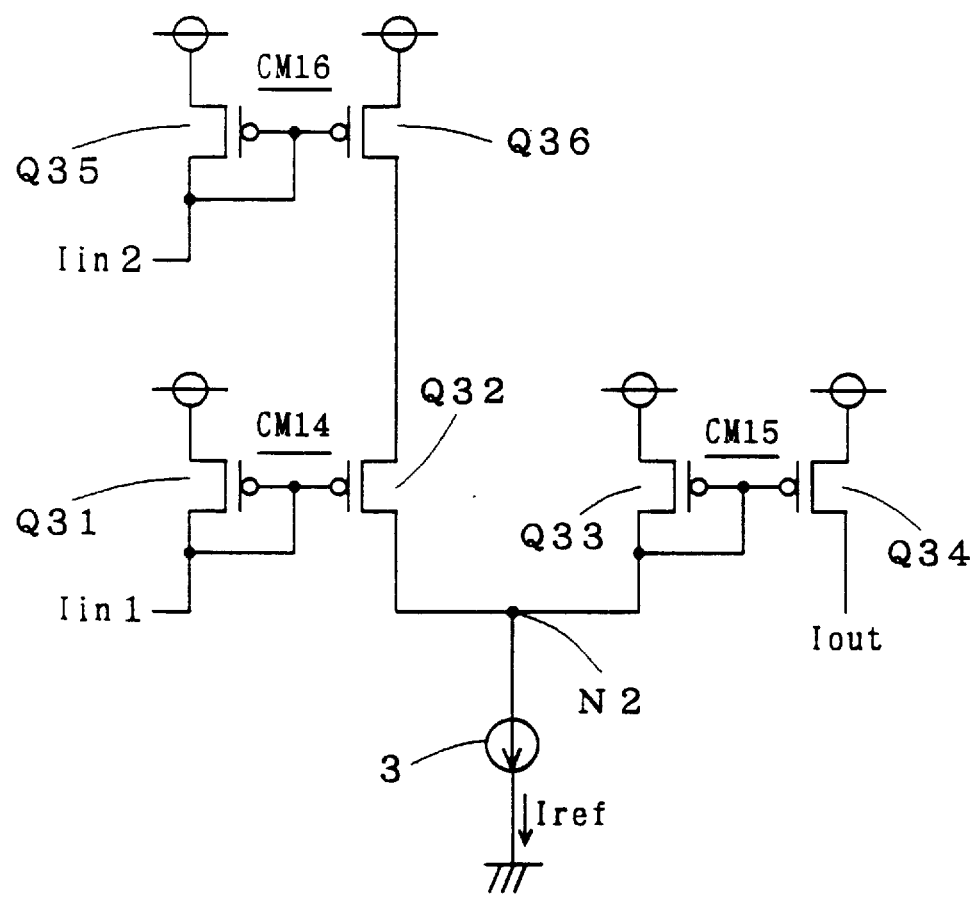
FIG. 13 is a circuit diagram showing a structure of a current type NAND gate circuit according to a second aspect of the fifth related embodiment of the present invention.

FIG. 13 is a circuit diagram showing a structure of a current type NAND gate circuit according to a second aspect of the fifth related embodiment of the present invention. As shown in FIG. 13, the current type NAND gate circuit of the second aspect is formed by a reference current source 3 and current mirror circuits CM14, CM15 and CM16.

One end of the reference current source 3 is grounded. The reference current source 3 receives a reference current Iref at an node N2 which disposed at the other end of the reference current source 3.

The current mirror circuit CM14 is formed by PMOS transistors Q31 and Q32 which share a gate. As a first input part, a drain and a gate of the PMOS transistor Q31 receive an input current Iin1. A source of the PMOS transistor Q31 is grounded. On the other hand, as an output part, a drain of the PMOS transistor Q32 is connected to the node N2 which disposed at the other end of the reference current source 3.

The current mirror circuit CM15 is formed by PMOS transistors Q33 and Q34 which share a gate. As an input part, a drain and a gate of the PMOS transistor Q33 are connected to the node N2. A source of the PMOS transistor Q33 is connected to the power source VDD. A drain of the PMOS transistor Q34 functions as an output part for carrying an output current Iout, and a source of the PMOS transistor Q34 is connected to a power source VDD.

The current mirror circuit CM16 is formed by PMOS transistors Q35 and Q36 which share a gate. As a second input part, a drain and a gate of the PMOS transistor Q35 receive an input current Iin2. A source of the PMOS transistor Q35 is connected to the power source VDD. On the other hand, as an output part, a drain of the PMOS transistor Q36 is connected to the source of the PMOS transistor Q32 of the current mirror circuit CM14. A source of the PMOS transistor Q36 is connected to the power source VDD.

In the current mirror circuits CM14 to CM16, the following conditions are all satisfied:

TS4$\geq$1;

TS5$\geq$1;

TS6$\geq$1;

TS4·TS5>1; and

TS6·TS5>1 where TS4 is a ratio of the size of the PMOS transistor Q32 to the size of the PMOS transistor Q31, TS5 is a ratio of the size of the PMOS transistor Q34 to the size of the PMOS transistor Q33 and TS6 is a ratio of the size of the PMOS transistor Q36 to the size of the PMOS transistor Q35.

The circuit of the second aspect which is formed by PMOS transistors as well can perform an inverted AND (NAND) operation in terms of a relationship between the input currents Iin1 and Iin2 and the output current Iout, creating the first to fourth effects described above.

<Other Aspects>

The current type NAND gate circuit according to the fifth related embodiment shown in FIG. 12 may be modified so as to increase the number of the transistors which are disposed on the output stage side of the current mirror circuit and to set the mirror ratio may be set larger than 1, as in the third aspect of the first related embodiment. Alternatively, a non-reversed optional output may be provided as in the fourth aspects of the first and the second related embodiments.

Figure 14:
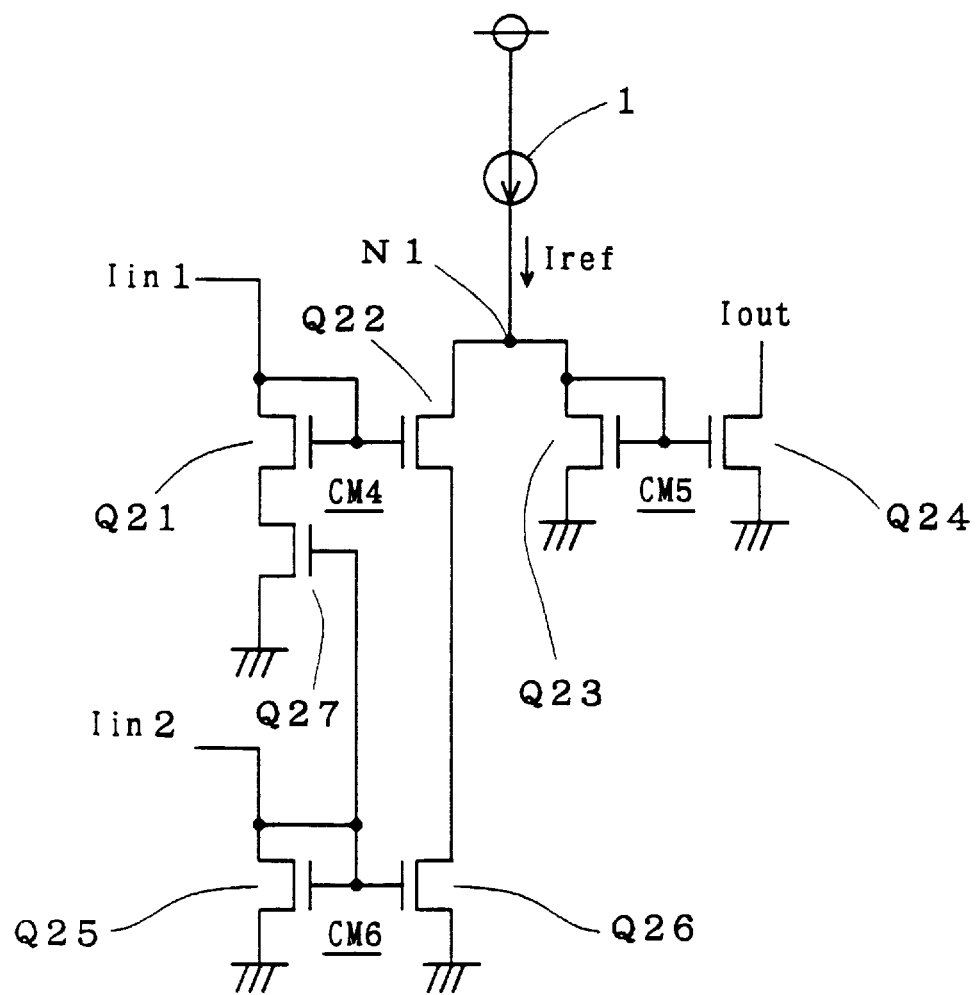
FIG. 14 is a circuit diagram showing an improved structure of a current type NAND gate circuit according to the fifth related embodiment of the present invention.

Further, in the current type NAND gate circuit shown in FIG. 12, due to an ON-resistance of the NMOS transistor Q26, a source potential of the NMOS transistor Q22 increases from the ground level, which decreases a gate-source voltage Vgs of the NMOS transistor Q22. Hence, as shown in FIG. 14, a dummy NMOS transistor Q27 is preferably inserted between the source of the NMOS transistor Q21 and the ground level and the gate of the NMOS transistor Q27 is preferably connected to the gates of the NMOS transistors Q25 and Q26. This supplies a load of the same level as that on the NMOS transistor Q26 to the source of the NMOS transistor Q21, which in turn ensures that the NMOS transistors Q21 and Q22 have the same source potential.

<<Sixth Preferred Embodiment>>

Figure 15:
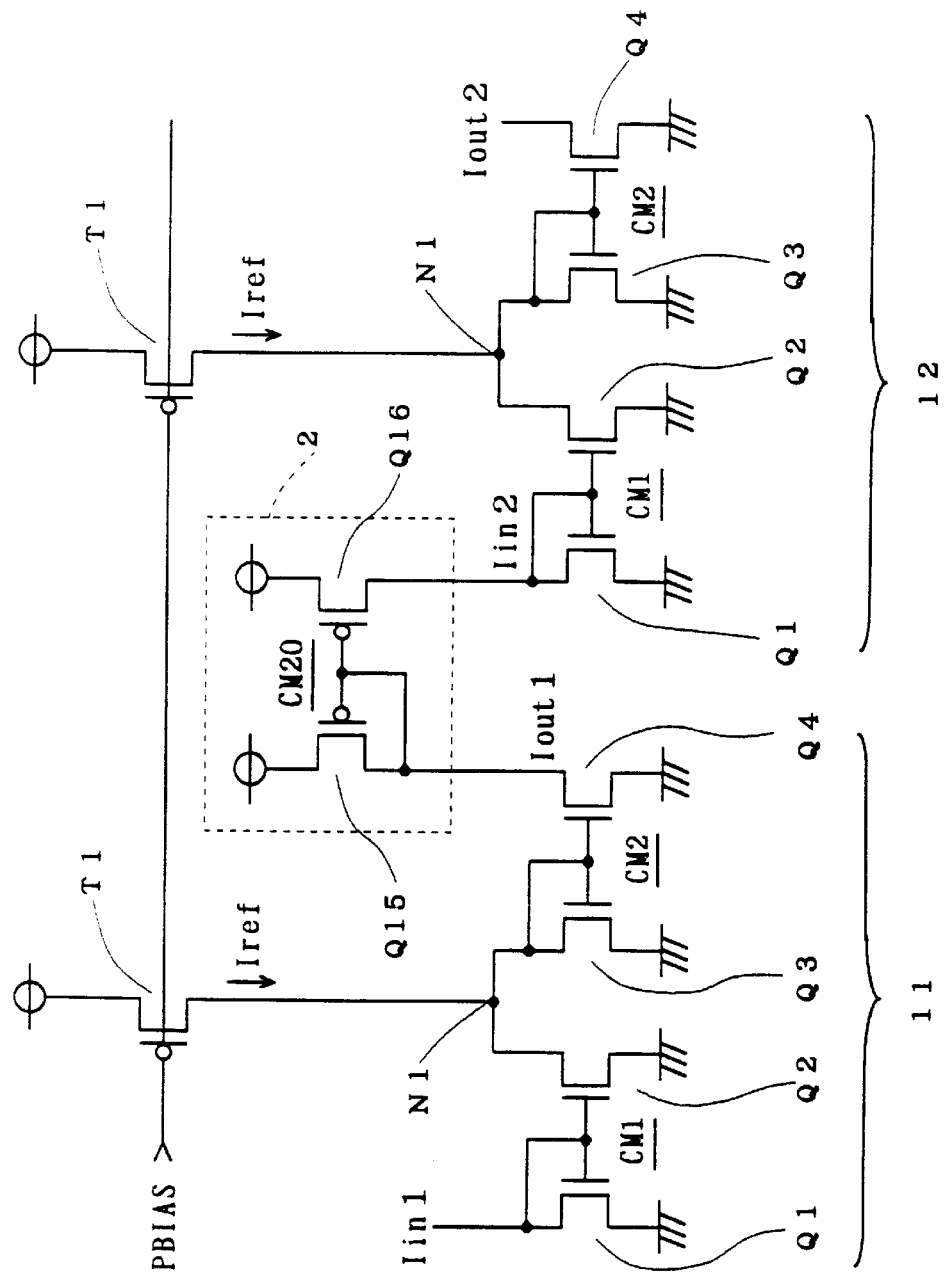
FIG. 15 is a circuit diagram showing a structure of a combination circuit according to a sixth related embodiment of the present invention.

FIG. 15 is a circuit diagram showing a structure of a combination current according to a sixth related embodiment of the present invention. As shown in FIG. 15, the combination circuit is formed by current type inverter circuits 11 and 12 each formed by NMOS transistors and a buffer circuit 2 formed by PMOS transistors.

Since the current type inverter circuits 11 and 12 are each similar to the current type inverter circuit of the first aspect of the second related embodiment, and therefore, inner structures of the current type inverter circuits 11 and 12 will not be described. For clear distinction between input/output currents associated with the current type inverter circuits 11 and 12, input/output currents associated with the current type inverter circuit 11 will be denoted at Iin1 and Iout1 and input/output currents associated with the current type inverter circuit 12 will be denoted at Iin2 and Iout2.

The buffer circuit 2 is formed by PMOS transistors Q15 and Q16 which share a gate to form current mirror structures. A drain and a gate of the PMOS transistor Q15 are connected to a drain of an NMOS transistor Q4 which serves as an output part of the current type inverter circuit 11. A source of the PMOS transistor Q15 is connected to a power source. A drain of the PMOS transistor Q16 is connected to a drain of an NMOS transistor Q1 which serves as an input part of the current type inverter circuit 12. A ratio of the size of the PMOS transistor Q16 to the size of the PMOS transistor Q15 is set equal to 1 or larger so that a mirror ratio of the buffer circuit 2 is set equal to 1 or larger.

In such a structure, the current type inverter circuit 11 reverses the logic value of the input current Iin1 and the resulting output current Iout1 flows into the drain of the NMOS transistor Q4 of the current type inverter circuit 11. The buffer circuit 2 routes the input current Iin2 which logically has the same current quantity with the output current Iout1 into the drain of the NMOS transistor Q1 of the current type inverter circuit 12. Further, the current type inverter circuit 12 routes the output current Iout2 which is obtained by reversing the logic value of the input current Iin2 into the drain of the NMOS transistor Q4 of the current type inverter circuit 12.

That is, the combination current according to the sixth preferred embodiment outputs the output current Iout2 which has the same logic value with the input current Iin1. Thus, inputs and outputs of current type inverter circuits of the same conductivity type can be connected to each other by inserting a buffer circuit which has an opposite polarity. Hence, using a logic circuit which is formed by connecting the same type of current type inverter circuits in series to each other, it is possible to form a more complex logic circuit.

The sixth related embodiment is related to a structure where inputs and outputs of two current type inverter circuits are connected to each other. However, regardless of whether current type logic circuits are current type NOR gate circuits, current type NAND gate circuits, etc., inputs and outputs of the current type logic circuits of the same conductivity type can be connected to each other by inserting a buffer circuit which has an opposite polarity.

Further, since the quantities of the currents between the inputs and the outputs do not attenuate during an actual operation of the combination circuit of the sixth preferred embodiment, it is necessary to set a mirror ratio of each current mirror circuit which forms the combination circuit equal to 1 or larger. It is also necessary to set a total gain created by series connection of the current mirrors equal to 1 or larger.

<<Seventh Related Embodiment>>

Figure 16:
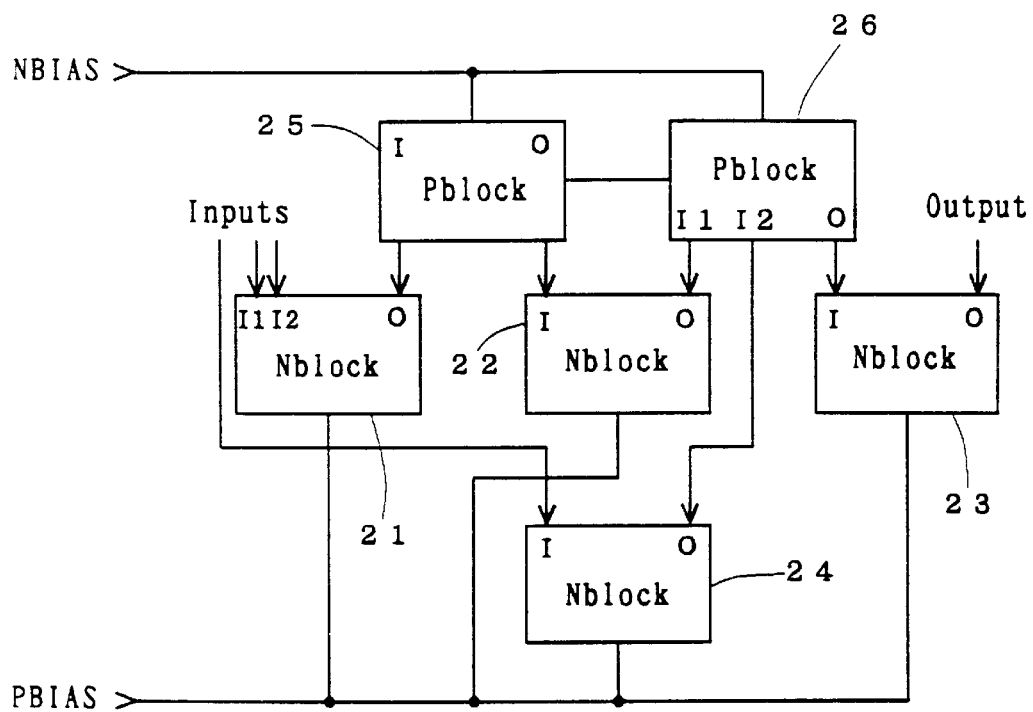
FIG. 16 is an explanatory diagram showing a structure of a combination circuit according to a seventh related embodiment of the present invention.

FIG. 16 is an explanatory diagram showing a structure of a combination current according to a seventh related embodiment of the present invention. As shown in FIG. 16, the combination current is formed by Nblocks 21 to 24 which are current type logic circuits formed by NMOS transistors and Pblocks 25 and 26 which are current type logic circuits formed by PMOS transistors. A bias voltage PBIAS for a reference current setting PMOS transistor is applied on the Nblocks 21 to 24, while a bias voltage NBIAS for a reference current setting NMOS transistor is applied on the Pblocks 25 and 26. Arrows in FIG. 16 show current flows.

Input parts I1 and I2 of the Nblock 21 receive an externally supplied input current. An output part O of the Nblock 21 is connected to an input part I of the Pblock 25. An output part O of the Pblock 25 is connected to an input part I of the Nblock 22. An output part O of the Nblock 22 is connected to an input part I1 of the Pblock 26.

An input part I of the Nblock 24 receives an externally supplied input current. An output part O of the Nblock 24 is connected to an input part I2 of the Pblock 26. An output part of the Pblock 26 is connected to an input part I of the Nblock 23. An output current flows from an output part O of the Nblock 23.

Figure 17:
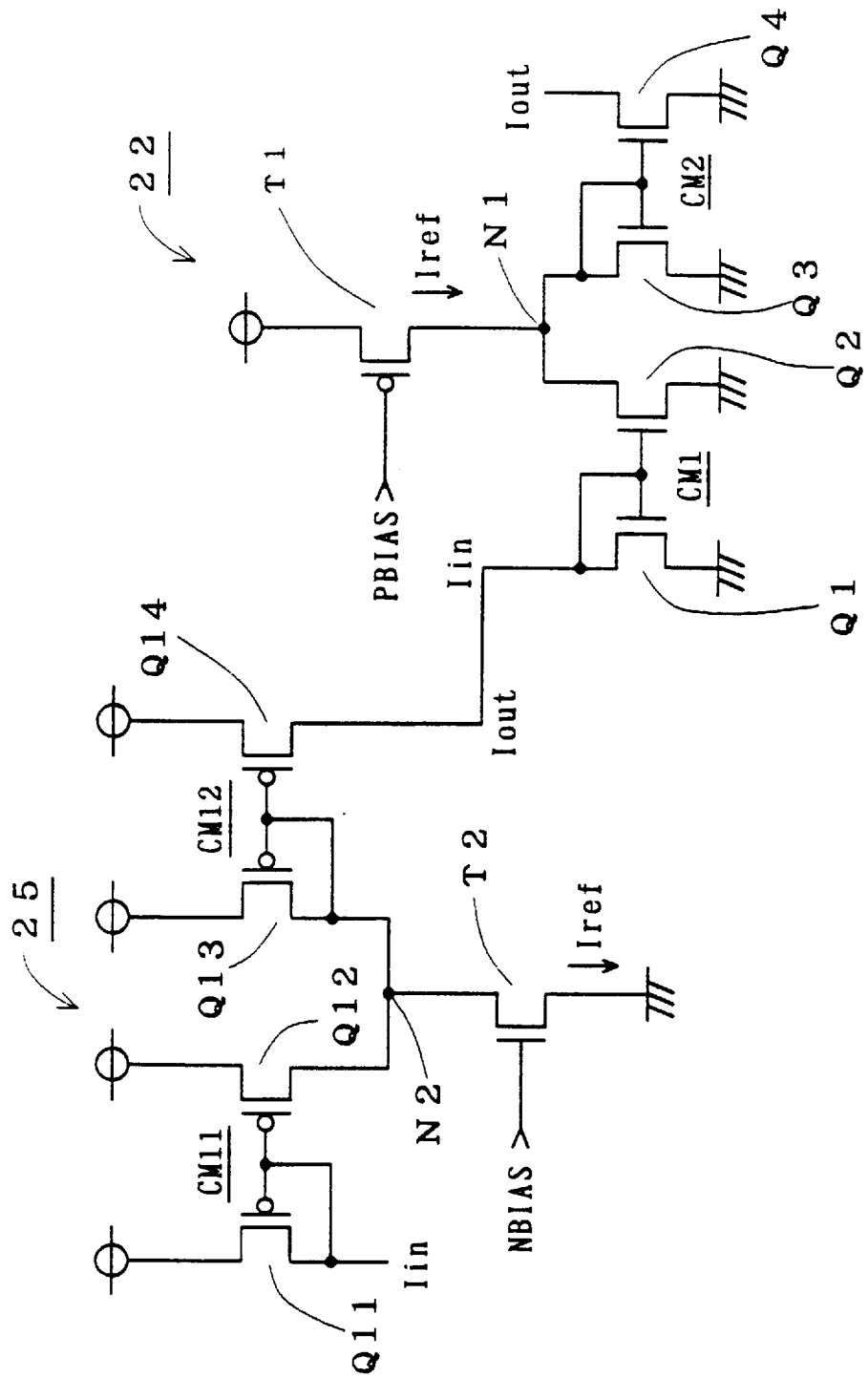
FIG. 17 is a circuit diagram partially showing FIG. 16 in detail.

FIG. 17 is a circuitry diagram showing an example of connection between the Pblock 25 and the Nblock 22. As shown in FIG. 17, a current type inverter circuit formed by PMOS transistors (See the second aspect of the second related embodiment, FIG. 6) is used as a logic circuit which corresponds to the Pblock 25, while a current type inverter circuit formed by NMOS transistors (See the first aspect of the second preferred embodiment, FIG. 5) is used as a logic circuit which corresponds to the Nblock 22.

As shown in FIG. 17, a drain of a PMOS transistor Q14, i.e., the output part of the Pblock 25 and a drain of an NMOS transistor Q1, i.t., the input part of the Nblock 22 are connected directly to each other, whereby the output part O of the Pblock 25 and the input part I of the Nblock 22 are connected to each other.

Connecting the input part I of a Pblock to the output part O of an Nblock while connecting the input part I of an Nblock to the output part O of a Pblock in this manner, inputs and outputs of current type logic circuits of different conductivity types can be connected to each other easily. Since a buffer circuit is not necessary as in the sixth related embodiment, the circuit structure is simpler.

Although the combination-circuit is formed by connecting inputs and outputs of current type logic circuits of different conductivity types in the seventh related embodiment, to form the combination circuit, the connection method of the sixth related embodiment may be used together which requires to connect inputs and outputs of current type logic circuits of the same conductivity type by inserting a buffer circuit which has an opposite polarity. This approach is effective when a final output needs be fixed to a current type logic circuit of a desired conductivity type, or when one bus running through odd-numbered logic circuits and another bus running through even-numbered logic circuits need be balanced each other, etc.

Further, since the quantities of the currents between the inputs and the outputs do not attenuate during an actual operation of the combination circuit of the seventh preferred embodiment, it is necessary to set a mirror ratio of each current mirror circuit which forms the combination circuit equal to 1 or larger. It is also necessary to set a total gain created by series connection of the current mirrors equal to 1 or larger.

<<Eighth Preferred Embodiment>>

<First Aspect>

Figure 18:
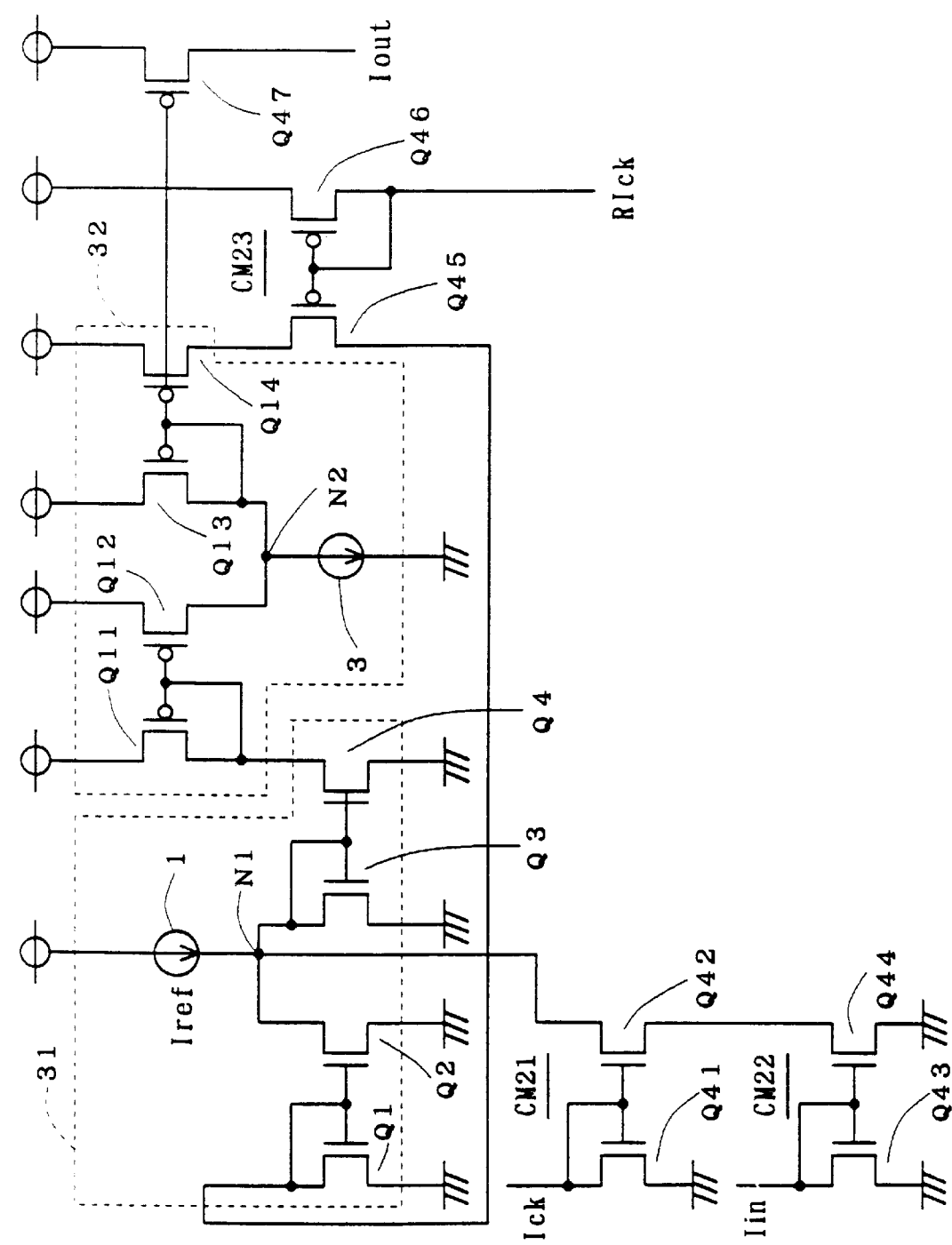
FIG. 18 is a circuit diagram showing a structure of a current type D-latch circuit according to a first aspect of an eighth related embodiment of the present invention.

FIG. 18 is a circuit diagram showing a structure of a current type D-latch circuit according to a first aspect of an eighth related embodiment of the present invention. As shown in FIG. 18, the current type D-latch circuit according to the eighth preferred embodiment is formed by an Nblock 31, a Pblock 32, current mirror circuits CM21 to CM23 and a PMOS transistor Q47.

The Nblock 31 forms a current type inverter circuit consisting of NMOS transistors (See the first aspect of the first preferred embodiment, FIG. 1), while the Pblock 32 forms a current type inverter circuit consisting of PMOS transistors (See the second aspect of the first preferred embodiment, FIG. 2). An output part of the Nblock 31 is connected to an input part of the Pblock 32.

The current mirror circuit CM21 is formed by NMOS transistors Q41 and Q42 which share a gate. A clock current Ick is supplied to a drain of the NMOS transistor Q41. A source of the NMOS transistor Q41 is grounded. A drain of the NMOS transistor Q42 is connected to an node N1 of the current type inverter circuit which is formed by the Nblock 31.

The current mirror circuit CM22 is formed by NMOS transistors Q43 and Q44 which share a gate. An input current Iin is supplied to a drain of the NMOS transistor Q43. A source of the NMOS transistor Q43 is grounded. A drain of the NMOS transistor Q44 is connected to a source of the NMOS transistor Q42, and a source of the NMOS transistor Q44 is grounded.

Hence, the current mirror circuits CM21 and CM22 perform an AND operation on the clock current Ick and the input current Iin and determine "1"/"0" of a reference current Iref which flows from the node N1 to the ground level.

The current mirror circuit CM23 is formed by NMOS transistors Q45 and Q46 which share a gate. A source of the PMOS transistor Q45 is connected to a drain of a PMOS transistor Q14 which serves as the output part of the Pblock 32, and a drain of the PMOS transistor Q45 is connected to a drain of an NMOS transistor Q1 which serves as the input part of the Nblock 31. A source of the PMOS transistor Q46 is connected to a power source VDD. A reversed clock current RIck which has a reversed logic value with respect to the clock current Ick is supplied to the drain of the PMOS transistor Q46.

Hence, when the reversed clock current RIck has a value "1," a current available from the output part of the Pblock 32 is transmitted to the input part of the Nblock 31. As a result, the two current type inverter circuits are connected to each other in a loop connection.

The PMOS transistor Q47 is connected to the PMOS transistor Q13 in a current mirror connection style. That is, a gate of the PMOS transistor Q47 is connected to gates of the PMOS transistors Q13 and Q14 of the Pblock 32, a source of the PMOS transistor Q47 is connected to the power source VDD and the output current Iout is obtained from a drain of the PMOS transistor Q47.

Hence, a current available from the output part of the Pblock 32 is outputted as the output current Iout from the drain of the PMOS transistor Q47.

In such a structure, information of the input current Iin ("1"/"0") is supplied to the node N1 of the Nblock 31 when the clock current Ick has a value "1" (i.e., when the reversed clock current Rick has a value "0") and the information allowed into the node N1 is held in the loop connection of the Nblock 31 and the Pblock 32 and outputted as the output current Iout when the clock current Ick has a value "0" (i.e., when the reversed clock current RIck has a value "1").

Thus, the circuit according to the first aspect of the eighth related embodiment performs a D-latch operation of latching the information of the input current Iin using the clock current Ick and the reversed clock current RIck as currents for clocking. The drain of the NMOS transistor Q42 which serve as the output part of the current mirror circuit CM21 may be connected to the drain of the NMOS transistor Q1 which serve as the input part of the Nblock 31.

<Second Aspect>

Figure 19:
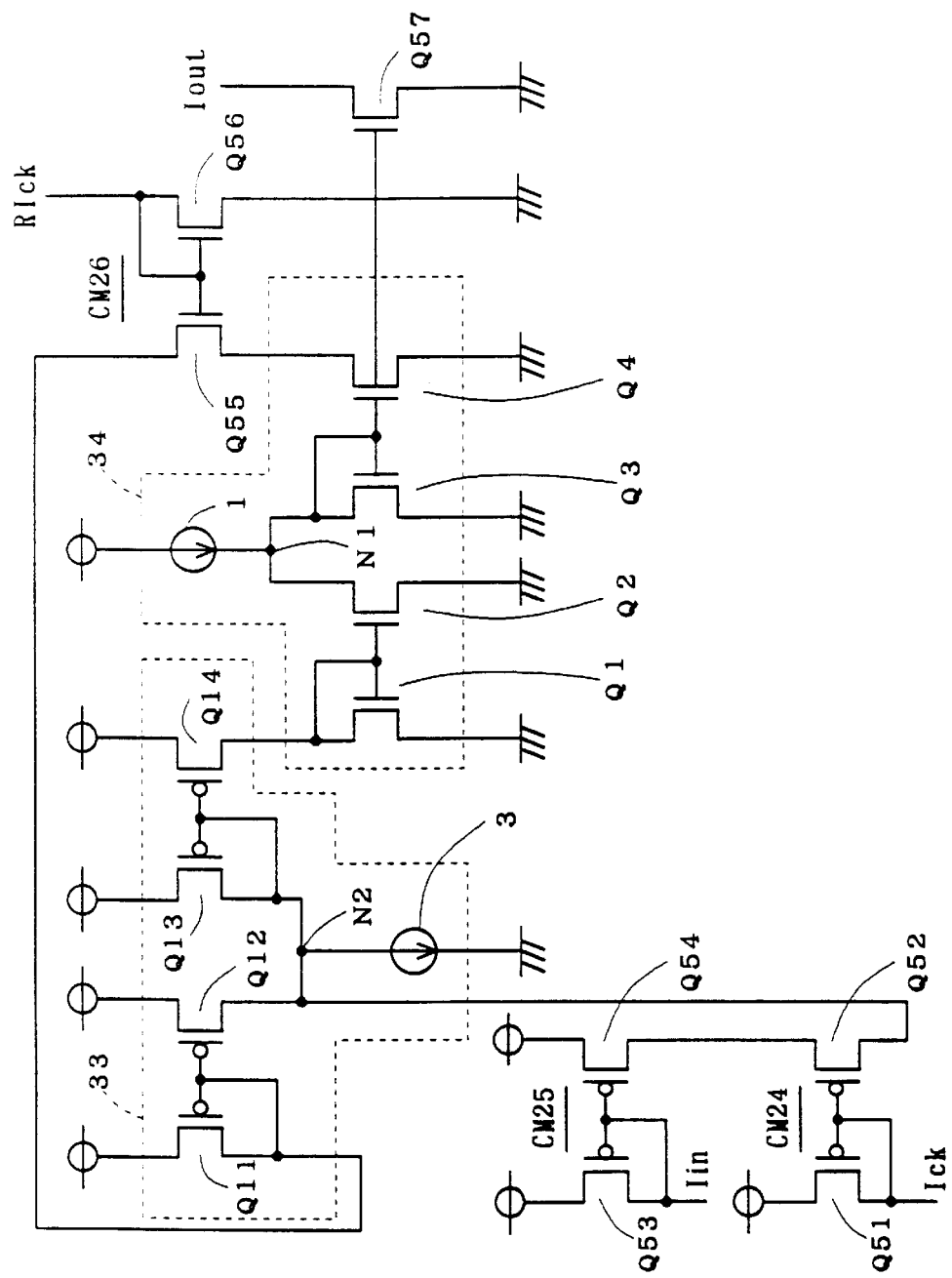
FIG. 19 is a circuit diagram showing a structure of a current type D-latch circuit according to a second aspect of the eighth related embodiment of the present invention.

FIG. 19 is a circuit diagram showing a structure of a current type D-latch circuit according to a second aspect of the eighth related embodiment of the present invention. As shown in FIG. 19, the current type D-latch circuit according to the second aspect is formed by a Pblock 33, an Nblock 34, current mirror circuits CM24 to CM26 and an NMOS transistor Q57.

The Pblock 33 forms a current type inverter circuit consisting of PMOS transistors (See the second aspect of the first related embodiment, FIG. 2), while the Nblock 34 forms a current type inverter circuit consisting of NMOS transistors (See the first aspect of the first related embodiment, FIG. 1). An output part of the Pblock 33 is connected to an input part of the Nblock 34.

The current mirror circuit CM24 is formed by PMOS transistors Q51 and Q52 which share a gate. A clock current Ick is supplied to a drain of the PMOS transistor Q51. A source of the PMOS transistor Q51 is connected to the power source VDD. A drain of the PMOS transistor Q52 is connected to an node N2 of the current type inverter circuit which is formed by the Pblock 33.

The current mirror circuit CM25 is formed by PMOS transistors Q53 and Q54 which share a gate. An input current Iin is supplied to a drain of the PMOS transistor Q53. A source of the PMOS transistor Q53 is connected to the power source VDD. A drain of the PMOS transistor Q54 is connected to a source of the PMOS transistor Q52, and a source of the PMOS transistor Q54 is connected to the power source VDD.

Hence, the current mirror circuits CM24 and CM25 perform an AND operation on the clock current Ick and the input current Iin and determine "1"/"0" of a reference current Iref which flows from the power source VDD to the node N2.

The current mirror circuit CM26 is formed by PMOS transistors Q55 and Q56 which share a gate. A source of the PMOS transistor Q55 is connected to a drain of a PMOS transistor Q4 which serves as the output part of the Nblock 34, and a drain of the PMOS transistor Q55 is connected to a drain of an PMOS transistor Q11 which serves as the input part of the Pblock 33. A source of the PMOS transistor Q56 is connected to the power source VDD. The reversed clock current RIck flows into the drain of the PMOS transistor Q56.

Hence, when the reversed clock current RIck has a value "1", a current available from the output part of the Nblock 34 is transmitted to the input part of the Pblock 33. As a result, the two current type inverter circuits are connected to each other in a loop connection The NMOS transistor Q57 is connected to the NMOS transistor Q3 in a current mirror connection style. That is, a gate of the NMOS transistor Q57 is connected to gates of the NMOS transistors Q3 and Q4 of the Nblock 34, a source of the NMOS transistor Q57 is grounded and the output current Iout is obtained from a drain of the NMOS transistor Q57.

Hence, a current available from the output part of the Nblock 34 is outputted as the output current Iout from the drain of the NMOS transistor Q57.

In such a structure, information "1"/"0" of the input current Iin is supplied to the node N2 of the Pblock 33 when the clock current Ick has a value "1" (i.e., when the reversed clock current RIck has a value "0"), and the information allowed into the node N2 is held in the loop connection of the Pblock 33 and the Nblock 34 and outputted as the output current Iout when the clock current Ick has a value "0" (i.e., when the reversed clock current RIck has a value "1").

Thus, using the clock current Ick and the reversed clock current Rick as currents for clocking, the current type D-latch circuit according to the second aspect of the eighth related embodiment performs a D-latch operation of latching the information of the input current Iin.

Although information is held in the loop connection of the current type inverter circuit of the P-type and the current type inverter circuit of the N-type in the eighth related embodiment, information may be held in a loop connection of current type inverter circuits of the same conductivity type with a buffer circuit of a different conductivity type interposed as in the sixth related embodiment shown in FIG. 15.

It is of course desirable that a mirror ratio of each current mirror circuit used in this preferred embodiment is equal to 1 or larger and a total gain created by series connection of the current mirrors is equal to 1 or larger.

<<Ninth Related Embodiment>>

Figure 20:
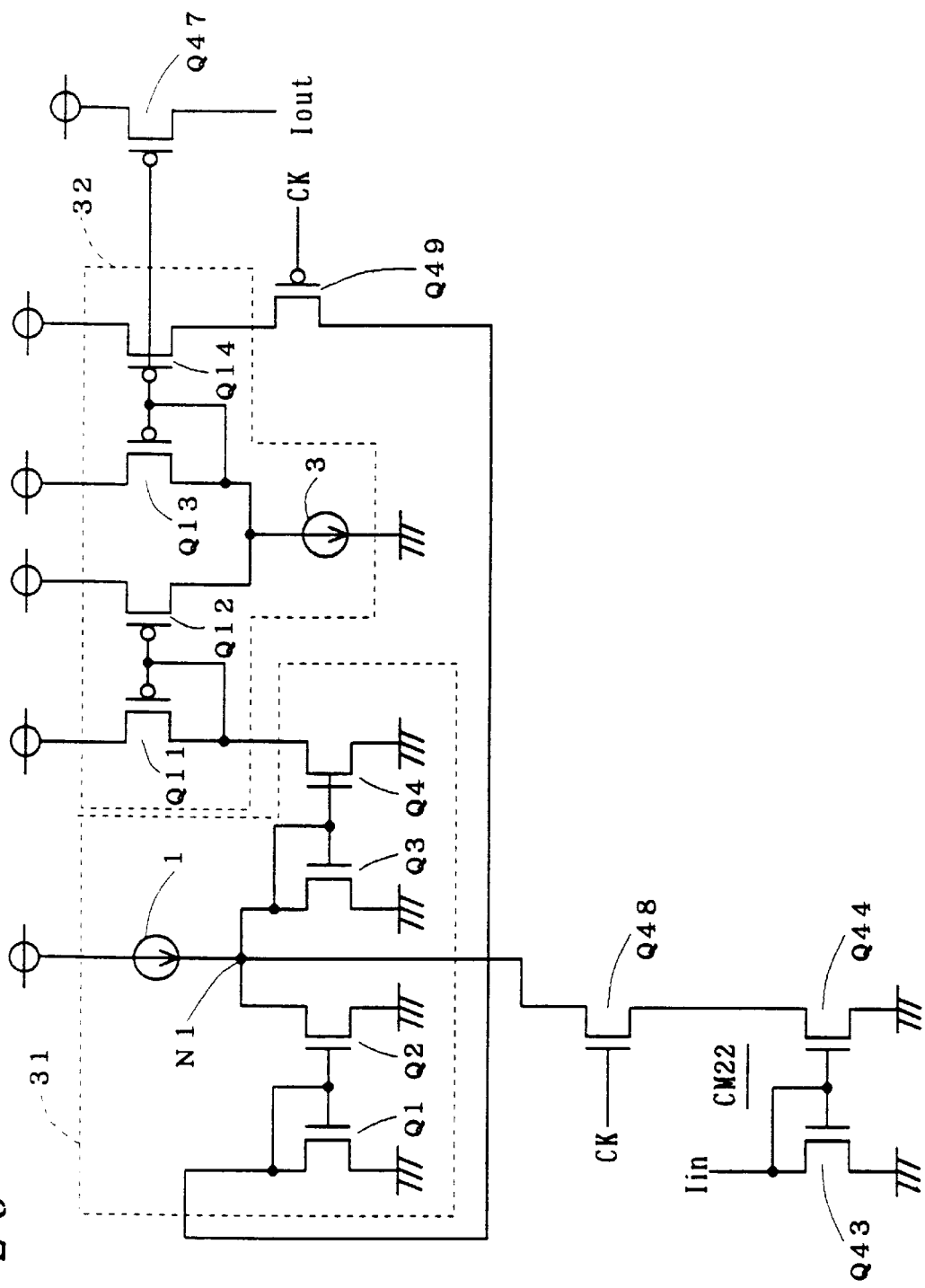
FIG. 20 is a circuit diagram showing a structure of a current type D-latch circuit according to a ninth related embodiment of the present invention.

FIG. 20 is a circuit diagram showing a structure of a current type D-latch circuit according to a ninth related embodiment of the present invention. The circuit of the ninth preferred embodiment is formed by replacing the current mirror circuits CM21 and CM23 of the first aspect of the eighth preferred embodiment shown in FIG. 18 with NMOS transistors Q48 and Q49, respectively. In the following, differences from the first aspect of the eighth related embodiment will be described.

The NMOS transistor Q48 receives a clock signal CK which is a voltage signal at a gate thereof. A drain of the NMOS transistor Q48 is connected to node N1 of the Nblock 31 while a source of the NMOS transistor Q48 is connected to a drain of the NMOS transistor Q44 of the current mirror circuit CM22. It is defined that information has a value "1" when the clock signal CK is at the power source level VDD but has a value "0" when the clock signal CK is at the ground level.

Hence, when the clock signal CK has a value "1," the NMOS transistor Q48 determines "1"/"0" of a reference current Iref which flows from the node N1 to the ground level based on "1"/"0" of the input current Iin.

The NMOS transistor Q49 receives the clock signal CK at a gate thereof. A drain of the NMOS transistor Q49 is connected to the drain of the NMOS transistor Q14 which serves as the output part of the Pblock 32, and a source of the NMOS transistor Q49 is connected to the drain of the NMOS transistor Q1 which serves as the input part of the Nblock 31.

Hence, when the clock signal CK has a value "0," the NMOS transistor Q49 transmits a current from the output part of the Pblock 32 to the input part of the Nblock 31, thereby realizing a loop connection of the two current type inverter circuits.

In such a structure, information "1"/"0" of the input current Iin is supplied to the node N1 of the Nblock 31 when the clock signal CK has a value "1," and the information allowed into the node N1 is held in the loop connection of the Nblock 31 and the Pblock 32 and outputted as the output current Iout when the clock signal CK has a value "0."

Thus, using the clock signal CK as a voltage signal for clocking, the circuit according to the first aspect of the ninth related embodiment performs a D-latch operation of latching the information of the input current Iin.

Hence, the current type D-latch circuit of the ninth related embodiment requires less labor to generate the clock current Ick than in the eighth related embodiment. Instead of the clock signal CK, other voltage-controlled signal may be used; The drain of the NMOS transistor Q48 may be connected to the drain of the NMOS transistor Q1 which serves as the input part of the Nblock 31.

Further, it is of course possible to form the current type D-latch circuit using transistors of an opposite conductivity type. Although information is held in the loop connection of the current type inverter circuit of the P-type and the current type inverter circuit of the N-type in the ninth related embodiment, information may be held in a loop connection of current type inverter circuits of the same conductivity type with a buffer circuit of a different conductivity type interposed as in the sixth related embodiment shown in FIG. 15.

In addition, it is of course desirable that a mirror ratio of each current mirror circuit used in this preferred embodiment is equal to 1 or larger and a total gain created by series connection of the current mirrors is equal to 1 or larger.

<<Tenth Related Embodiment>>
<First Aspect>

Figure 21:
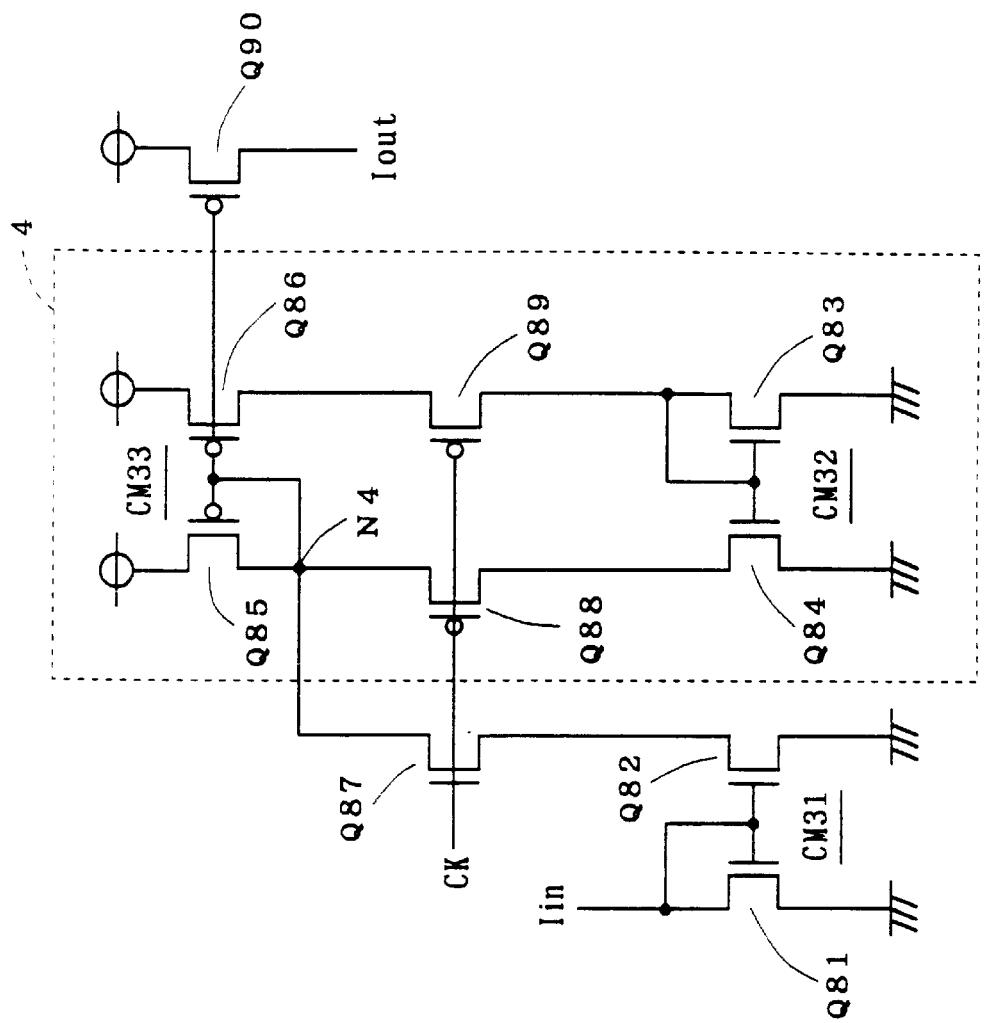
FIG. 21 is a circuit diagram showing a structure of a current type D-latch circuit according to a first aspect of a tenth related embodiment of the present invention.

FIG. 21 is a circuit diagram showing a structure of a current type D-latch circuit according to a first aspect of a tenth related embodiment of the present invention. As shown in FIG. 21, the current type D-latch circuit according to the tenth related embodiment is formed by NMOS transistors Q81 to Q84 and Q87 (having a threshold voltage NVTH) and PMOS transistors Q85, Q86 and Q88 to Q90 (having a threshold voltage PVTH). A latch part 4 is formed by the transistors Q83 to Q89. The threshold voltages NVTH and PVTH satisfy a condition NVTH+PVTH<VDD.

The NMOS transistors Q81 and Q82 which share a gate form a current mirror circuit CM31. A drain of the NMOS transistor Q81 serves as an input part of the current mirror circuit CM31, and a drain of the NMOS transistor Q82 serves as an output part of the current mirror circuit CM31. An input current Iin is supplied between a drain and a gate of the NMOS transistor Q81. A source of the NMOS transistor Q81 is grounded. The drain of the NMOS transistor Q82 is connected to a source of the NMOS transistor Q87, and a source of the NMOS transistor Q82 is grounded.

The NMOS transistor Q87 receives a clock signal CK which is a voltage signal at a gate thereof. A drain of the NMOS transistor Q87 is connected to an node N4 between a drain of the PMOS transistor Q85 and a source of the PMOS transistor Q88 of the latch part 4.

A current mirror circuit CM32 of the latch part 4 is formed by NMOS transistors Q83 and Q84 which share a gate. A drain of the NMOS transistor Q83 serves as an input part of the current mirror circuit CM32, and a drain of the NMOS transistor Q84 serves as an output part of the current mirror circuit CM32. A drain and a gate of the NMOS transistor Q83 are connected to a drain of the PMOS transistor Q89, and a source the NMOS transistor Q83 is grounded. The drain of the NMOS transistor Q84 is connected to a drain of the PMOS transistor Q88, and a source of the NMOS transistor Q84 is grounded.

A current mirror circuit CM33 of the latch part 4 is formed by PMOS transistors Q85 and Q86 which share a gate. A drain of the PMOS transistor Q85 serves as an input part of the current mirror circuit CM33, and a drain of the PMOS transistor Q86 serves as an output part of the current mirror circuit CM33. The drain of the PMOS transistor Q85 is connected to a source of the PMOS transistor Q88 through the node N4, and a source of the PMOS transistor Q85 is connected to the power source VDD. The drain of the PMOS transistor Q86 is connected to a source of the PMOS transistor Q89, and a source of the PMOS transistor Q86 is connected to the power source VDD. The clock signal CK is applied to the gate of the PMOS transistors Q88 and Q89.

The PMOS transistor Q90 is connected to the PMOS transistor Q85 in a current mirror connection. That is, a gate of the PMOS transistor Q90 is connected to the gate of the PMOS transistors Q85 and Q86 and a source of the PMOS transistor Q90 is connected to the power source VDD so that the output current Iout is available from a drain of the PMOS transistor Q90.

Figure 22:
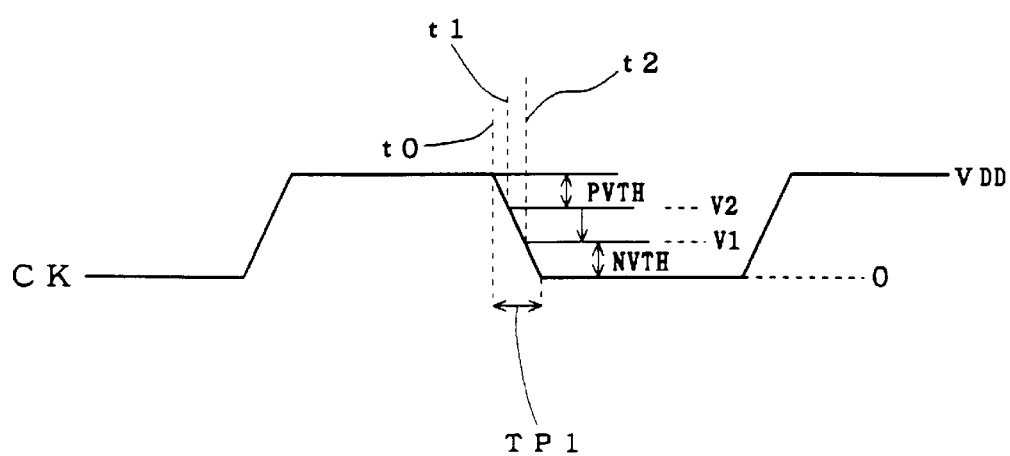
FIG. 22 is a waveform diagram showing an operation of the current type D-latch circuit of the first aspect.

When the clock signal CK whose voltage level changes as shown in FIG. 22 is supplied to such a structure, at a time t0 during a sampling period TP1, the NMOS transistor Q87 is in ON-state while the PMOS transistors Q88 and Q89 are in OFF-sate.

From a time t1 to a time t2 during the period TP1, when the voltage level of the clock signal CK becomes smaller than V2 (=VDD−PVTH), the PMOS transistors Q88 and Q89 turn on while the NMOS transistor Q87 remains in ON-state, whereby information of the input current Iin is allowed into the node N4.

After the time t2 during the period TP1, when the voltage level of the clock signal CK becomes smaller than V1 (=NVTH), the NMOS transistor Q87 turns off while the PMOS transistors Q88 and Q89 stay in ON-sate. As a result, the information supplied to the node N4 is latched by the current mirror circuits CM32 and CM33 which have their inputs and outputs electrically connected to each other to form a loop.

Thus, using the clock signal CK as a voltage signal for clocking, the circuit according to the first aspect of the tenth related embodiment performs a D-latch operation of latching the information of the input current Iin.

Hence, the current type D-latch circuit of the tenth related embodiment requires even less labor to generate the clock current Ick than in the eighth related embodiment. Further, the tenth preferred embodiment uses fewer transistors than the ninth related embodiment, and therefore, the circuit structure is simpler. Instead of the clock signal CK, other voltage-controlled signal may be used.

<Second Aspect>

Figure 23:
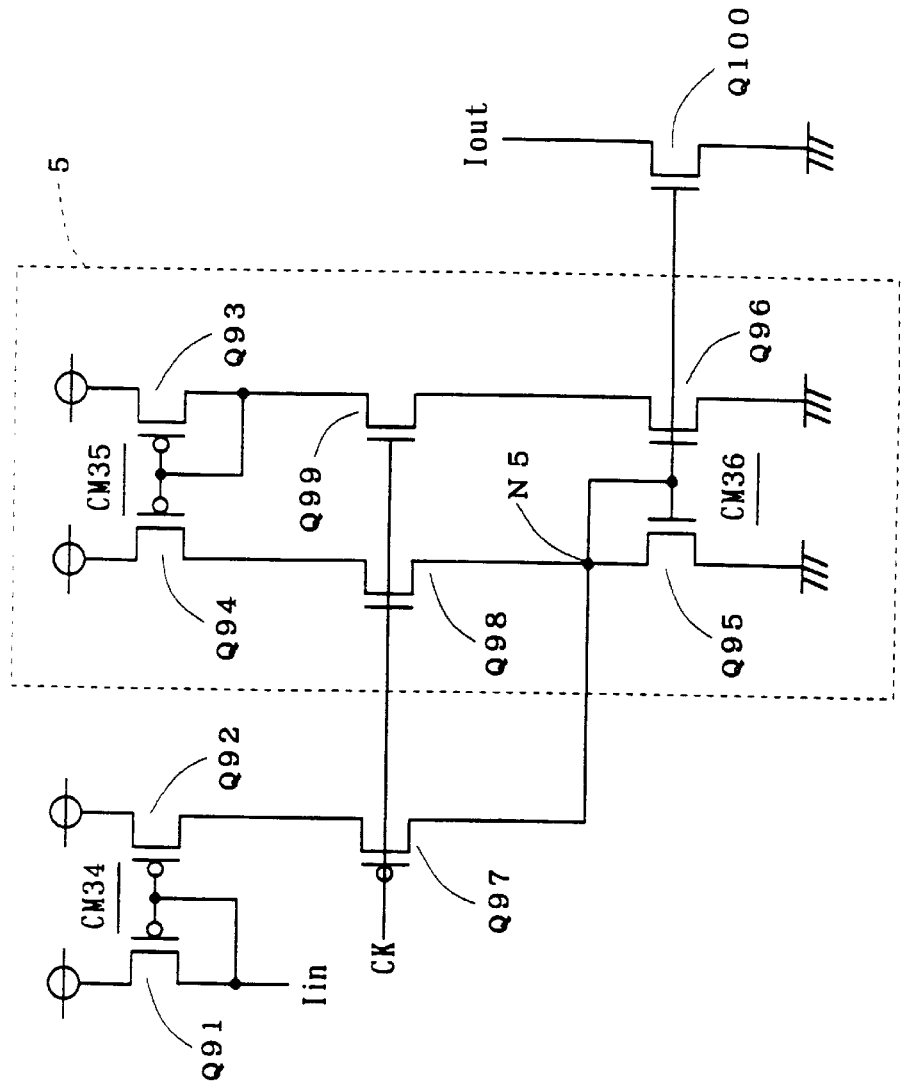
FIG. 23 is a circuit diagram showing a structure of a current type D-latch circuit according to a second aspect of the tenth related embodiment of the present invention.

FIG. 23 is a circuit diagram showing a structure of a current type D-latch circuit according to a second aspect of the tenth related embodiment of the present invention. As shown in FIG. 23, the current type D-latch circuit according to the second aspect is formed by PMOS transistors Q91 to Q94 and Q97 (having a threshold voltage PVTH) and NMOS transistors Q95, Q96 and Q98 to Q100 (having a threshold voltage NVTH). A latch part 5 is formed by the transistors Q93 to Q99. The threshold voltages PVTH and NVTH satisfy a condition PVTH+NVTH<VDD.

The PMOS transistors Q91 and Q82 which share a gate form a current mirror circuit CM34. A drain of the PMOS transistor Q91 serves as an input part of the current mirror circuit CM34, and a drain of the PMOS transistor Q92 serves as an output part of the current mirror circuit CM34. An input current Iin is supplied between a drain and a gate of the PMOS transistor Q91. A source of the PMOS transistor Q91 is connected to the power source VDD. The drain of the PMOS transistor Q92 is connected to a source of the PMOS transistor Q97, and a source of the PMOS transistor Q92 is connected to the power source VDD.

The NMOS transistor Q97 receives a clock signal CK which is a voltage signal at a gate thereof. A drain of the NMOS transistor Q97 is connected to an node N5 between a drain of the NMOS transistor Q95 and a source of the NMOS transistor Q98 of the latch part 5.

A current mirror circuit CM35 of the latch part 5 is formed by PMOS transistors Q93 and Q94 which share a gate. A drain of the PMOS transistor Q93 serves as an input part of the current mirror circuit CM35, and a drain of the PMOS transistor Q94 serves as an output part of the current mirror circuit CM35. The drain and a gate of the PMOS transistor Q93 are connected to a drain of the NMOS transistor Q99, and a source the PMOS transistor Q93 is connected to the power source VDD. The drain of the PMOS transistor Q94 is connected to a drain of the NMOS transistor Q98, and a source of the PMOS transistor Q94 is connected to the power source VDD.

A current mirror circuit CM36 of the latch part 5 is formed by NMOS transistors Q95 and Q96 which share a gate. A drain of the NMOS transistor Q95 serves as an input part of the current mirror circuit CM36, and a drain of the NMOS transistor Q96 serves as an output part of the current mirror circuit CM36. The drain of the NMOS transistor Q95 is connected to a source of the NMOS transistor Q98 through the node N5, and a source of the NMOS transistor Q95 is grounded. The drain of the NMOS transistor Q96 is connected to a source of the NMOS transistor Q99, and a source of the NMOS transistor Q96 is grounded. The clock signal CK is applied on the gates of the NMOS transistors Q98 and Q99.

The NMOS transistor Q100 is connected to the NMOS transistor Q95 in a current mirror connection. That is, a gate of the NMOS transistor Q100 is connected to the gate of the NMOS transistors Q95 and Q96 and a source of the NMOS transistor Q100 is grounded so that the output current Iout is available from a drain of the NMOS transistor Q100.

Figure 24:
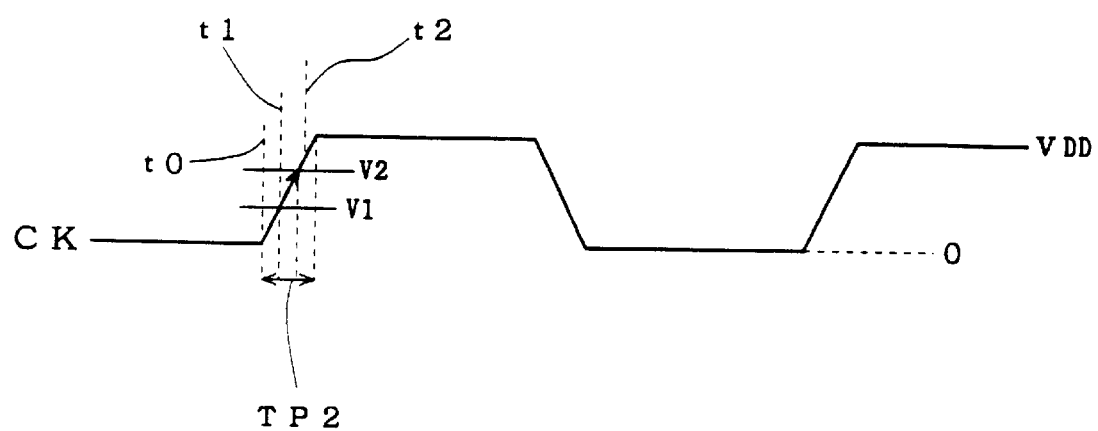
FIG. 24 is a waveform diagram showing an operation of the current type D-latch circuit of the second aspect.

When the clock signal CK whose voltage level changes as shown in FIG. 24 is supplied to such a structure, at a time t0 during a sampling period TP2, the NMOS transistor Q97 is in ON-state while the NMOS transistors Q98 and Q99 are in OFF-state.

From a time t1 to a time t2 during the period TP2, when the voltage level of the clock signal CK becomes larger than V1 (=PVTH), the NMOS transistors Q98 and Q99 turn on while the NMOS transistor Q97 remains in ON-state, whereby information of the input current Iin is allowed into the node N5.

After the time t2 during the period TP2, when the voltage level of the clock signal CK becomes greater than V2 (=VDD−PVTH), the PMOS transistor Q97 turns off while the NMOS transistors Q98 and Q99 stay in ON-sate. As a result, the information supplied to the node N5 is latched by the current mirror circuits CM35 and CM36 which have their inputs and outputs electrically connected to each other to form a loop.

Thus, using the clock signal CK as a voltage signal for clocking, the circuit according to the second aspect of the tenth related embodiment performs a D-latch operation of latching the information of the input current Iin as in the first aspect of the tenth related embodiment.

Further, it is of course desirable that a mirror ratio of each current mirror circuit used in this related embodiment is equal to 1 or larger and a total gain created by series connection of the current mirrors is equal to 1 or larger.

<<Eleventh Related Embodiment>>

Figure 25:
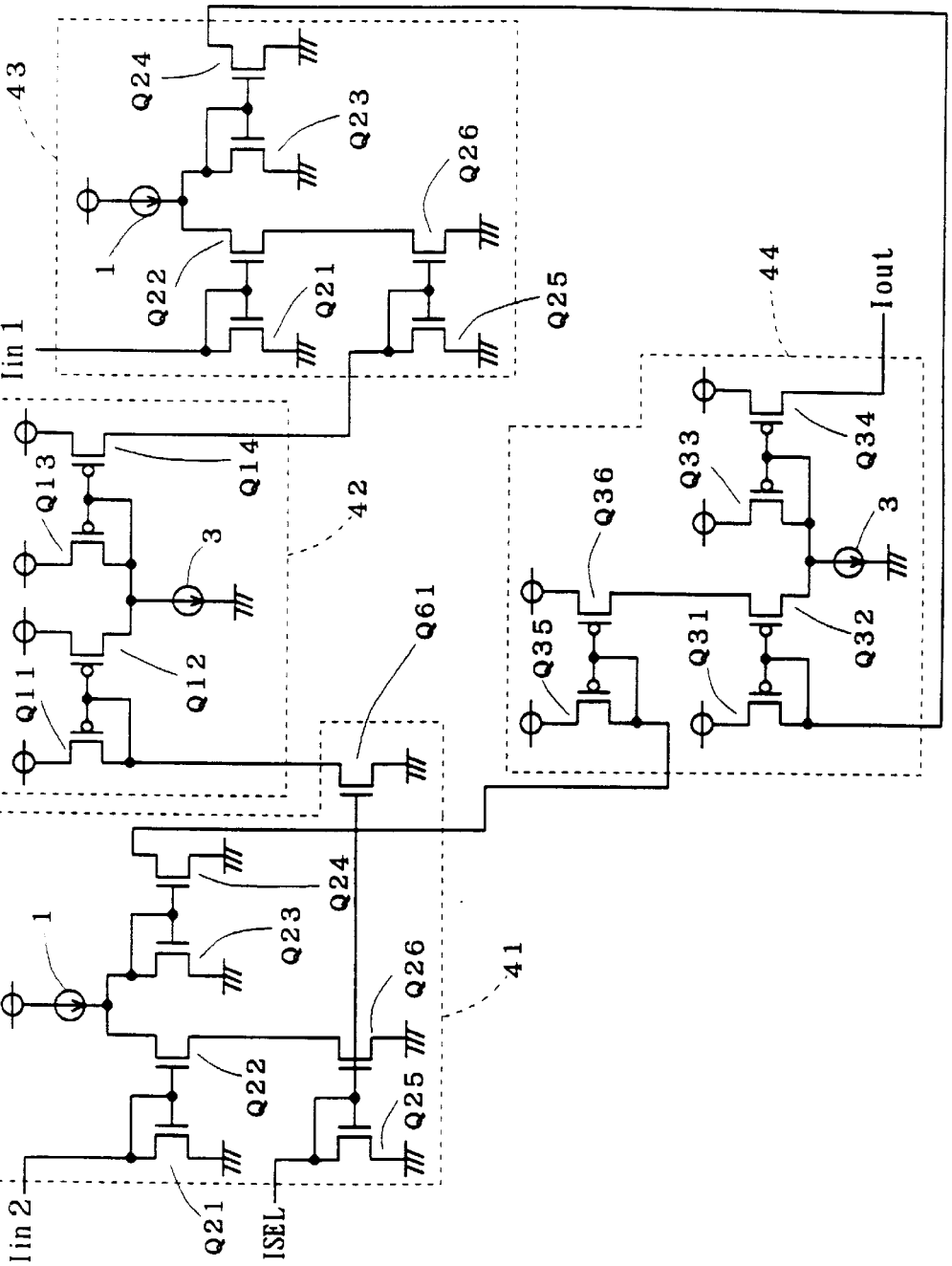
FIG. 25 is a circuit diagram of a selector circuit according to an eleventh related embodiment of the present invention.

FIG. 25 is a circuit diagram of a selector circuit according to an eleventh related embodiment of the present invention. The selector circuit according to the eleventh related embodiment is formed by an N-type NAND gate block 41, a P-type inverter block 42, an N-type NAND gate block 43 and a P-type NAND gate block 44.

A basic structure of the N-type NAND gate block 41 is formed by the current type NAND gate circuit of the first aspect of the fifth related embodiment (See FIG. 12). The N-type NAND gate block 41 receives an input current Iin2 at a first input part and a select current ISEL at a second input part.

An NMOS transistor Q61 is additionally connected to the gates of the NMOS transistors Q25 and Q26. A source of the NMOS transistor Q61 is grounded so that a drain of the NMOS transistor Q61 receives a current whose signal value is the same as that of the signal which is available at the drain of the transistor Q25 which serves as the second input part. In other words, like the current type inverter circuit according to the fourth aspect of the first related embodiment, the NAND gate block 41 has a function of outputting a non-reversed optional current with respect to a select current ISEL which is available at the second input part.

The inverter block 42 has the same structure as the current type inverter circuit according to the second aspect of the first related embodiment (See FIG. 2), that is, an input part of the inverter block 42 is connected to the drain of the NMOS transistor Q61. This means that the inverter block 42 receives the select current ISEL at the input part.

The NAND gate block 43 has the same structure as the current type inverter circuit according to the first aspect of the fifth related embodiment (See FIG. 12) that the input current Iin is supplied to a first input part of the NAND gate block 43 and a second input part of the NAND gate block 43 is connected to an output part of the inverter block 42. That is, the select current ISEL as it is logically reversed is supplied to the second input part of the NAND gate block 43.

The NAND gate block 44 has the same structure as the current type inverter circuit according to the second aspect of the fifth related embodiment (See FIG. 13) that a first input part of the NAND gate block 44 is connected to an output part of the NAND gate block 43 and a second input part of the NAND gate block 44 is connected to an output part of the NAND gate block 41.

Figure 26:
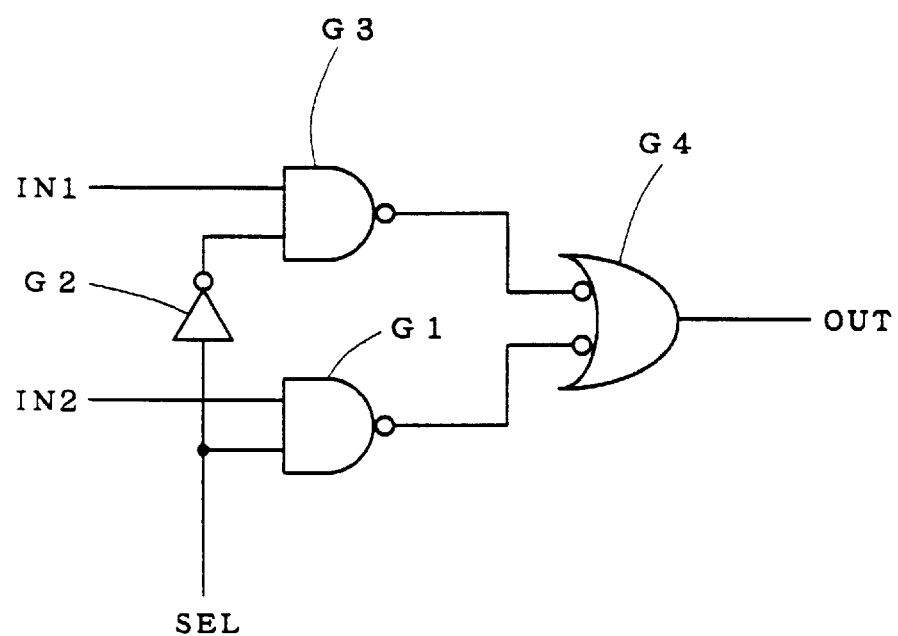
FIG. 26 is an equivalent circuit diagram of FIG. 25.

FIG. 26 shows the selector circuit having such a structure using logic gates. Denoted at G1, G3 and G4 are the NAND gates and denoted at G2 is the inverter. When a selection signal SEL has a value "1" ("H"), the selector circuit of FIG. 26 selects an input signal IN2 as an output signal OUT, but selects an input signal IN1 as the output signal OUT when the selection signal SEL has a value "0" ("L").

The selector circuit of the eleventh related embodiment performs an operation which is equivalent to that of the selector circuit of FIG. 26. In other words, the selector circuit of the eleventh related embodiment selects the information of the input current Iin2 as the output current Iout when the select current ISEL has a value "1" but selects the information of the input current Iin1 as the output current Iout when the select current ISEL has a value "0."

Since the second input part of the NAND gate block 41 has a function of outputting a non-reversed optional current, the selector circuit of the eleventh related embodiment has a simple structure. This point will be described in the following.

Figure 27:
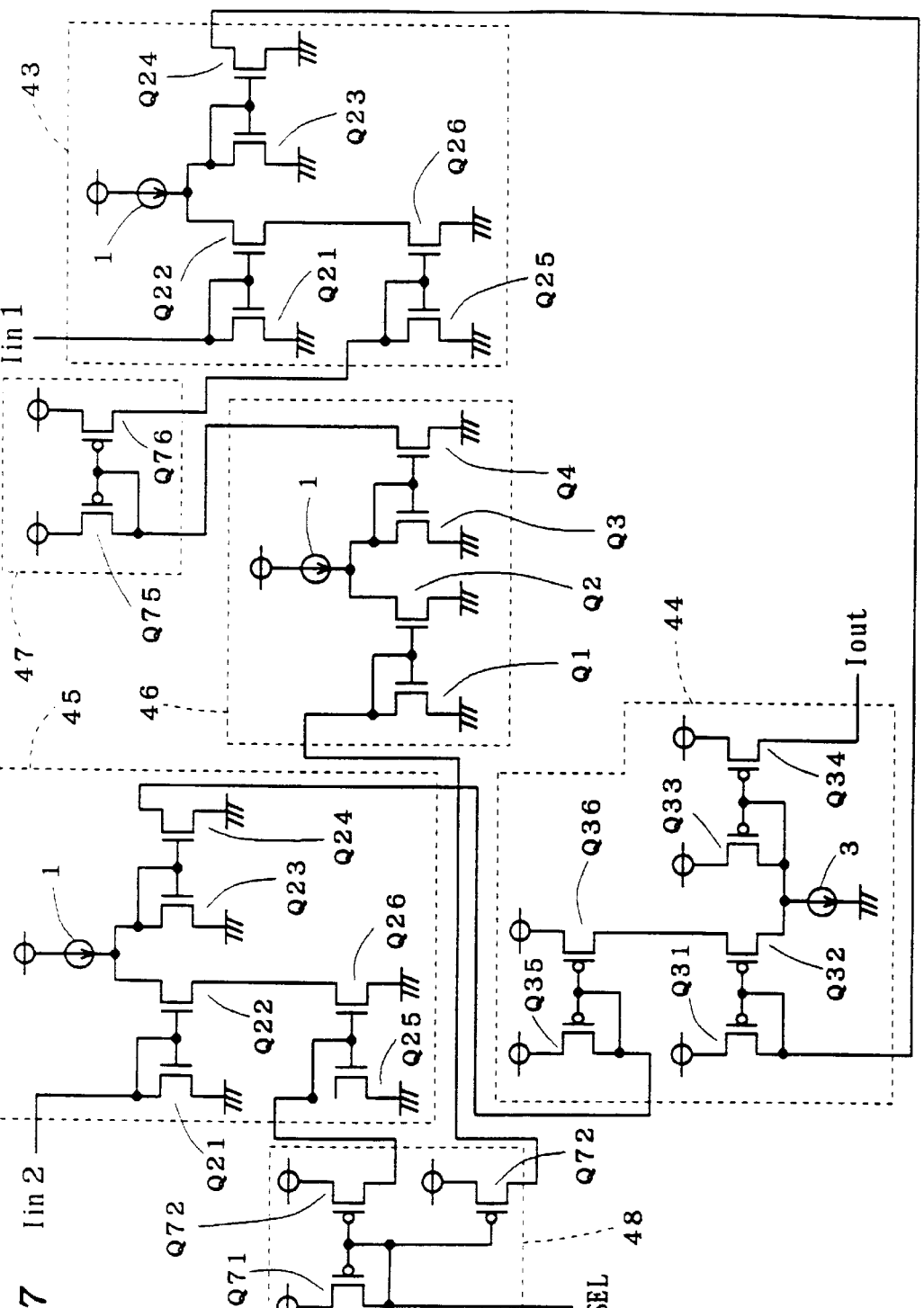
FIG. 27 is a circuit diagram of a selector circuit for describing an effect of the eleventh related embodiment.

FIG. 27 is a circuit diagram of a selector circuit in which a current type NAND gate circuit a function of outputting a non-reversed option instead of the NAND gate block 41. This selector circuit is formed by an N-type NAND gate block 43, a P-type NAND gate block 44, an N-type NAND gate block 45, an N-type inverter block 46 and P-type buffer blocks 47 and 48.

The buffer block 48 is formed by PMOS transistors Q71 to Q73 which share a gate. A source of the PMOS transistor Q71 is connected to the power source VDD. The select current ISEL is supplied to a gate and a drain of the PMOS transistor Q71. Sources of the PMOS transistors Q72 and Q73 are commonly connected to the power source VDD.

Hence, the buffer block 48 has a drain of the PMOS transistor Q72 as a first output part and the drain of the PMOS transistor Q73 as a second output part, and therefore, functions as a buffer circuit which comprises one input receiving the select current ISEL and two outputs.

The NAND gate block 45 has the same structure as the current type inverter circuit according to the first aspect of the fifth related embodiment that the input current Iin is supplied to a first input part of the NAND gate block 45 and a second input part of the NAND gate block 45 is connected to the first output part of the buffer block 48. This structure allows the NAND gate block 45 to receive the select current ISEL.

The inverter block 46 has the same structure as the current type inverter circuit according to the first aspect of the first related embodiment. With an input part connected to the second output part of the buffer block 48, the inverter block 46 receives the select current ISEL.

The buffer block 47 is formed by PMOS transistors Q75 and Q76 which share a gate. A source of the PMOS transistor Q75 is connected to the power source VDD. A gate and a drain of the PMOS transistor Q75 are connected to an output part of the inverter block 46. Sources of the PMOS transistors Q75 and Q76 are commonly connected to the power source VDD.

Hence, the buffer block 47 functions as a buffer circuit whose input part is the drain of the transistor Q75 and an output is the drain of the transistor Q76.

The NAND gate block 43 has the same structure as the current type inverter circuit according to the first aspect of the fifth related embodiment (See FIG. 12) that the input current Iin is supplied to a first input part of the NAND gate block 43 and a second input part of the NAND gate block 43 is connected to the output part of the buffer block 47. That is, the select current ISEL as it is logically reversed is supplied to the second input part of the NAND gate block 43.

The NAND gate block 44 has the same structure as the current type inverter circuit according to the second aspect of the fifth related embodiment (See FIG. 13) that a first input part of the NAND gate block 44 is connected to the output part of the NAND gate block 43 and a second input part of the NAND gate block 44 is connected to the output part of the NAND gate block 41.

This structure as well can perform an operation which is exactly equivalent to that of the selector circuit of FIG. 25. However, the circuit structure of FIG. 25 is simpler with four fewer transistors than in the circuit structure of FIG. 27. The circuit structure of FIG. 25 has such a simpler structure because of the optional output available from the NAND gate block 41.

<<Twelfth Related Embodiment>>

<First Aspect>

Figure 28:
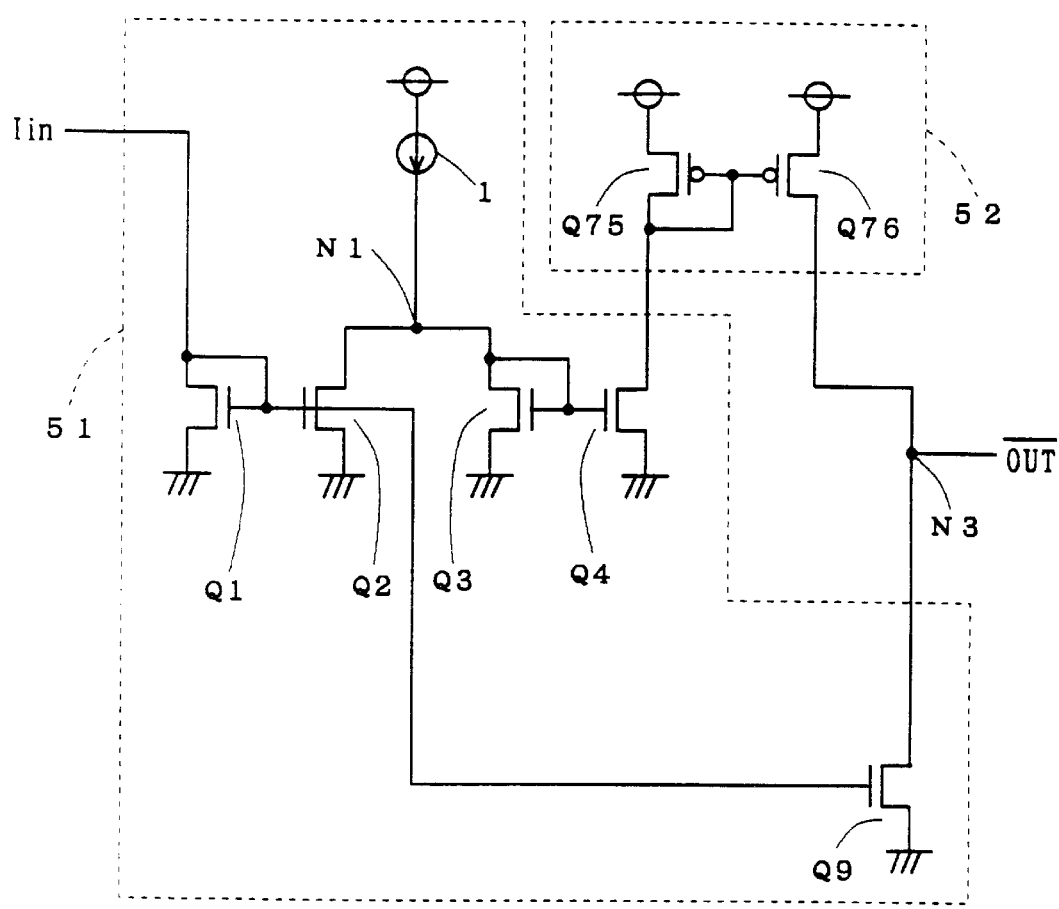
FIG. 28 is a circuit diagram showing a structure of a current/voltage conversion circuit according to a first aspect of a twelfth related embodiment of the present invention.

FIG. 28 is a circuit diagram showing a structure of a current-voltage conversion circuit according to a first aspect of a twelfth related embodiment of the present invention. As shown in FIG. 28, the current-voltage conversion circuit according to the first aspect is formed by an N-type inverter block 51 and a P-type buffer block 52.

The inverter block 51 has the same structure as the current type inverter circuit according to the fourth aspect of the first related embodiment that the input current Iin is supplied to an input part of the inverter block 51. A drain of a transistor Q9 which serves as a non-reversed optional output part of the inverter block 51 is connected to an node N3.

The buffer block 52 is formed by PMOS transistors Q75 and Q76 which share a gate. A source of the PMOS transistor Q75 is connected to the power source VDD. A gate and a drain of the PMOS transistor Q75 are connected to an output part of the inverter block 51. A source of the PMOS transistor Q76 is connected to the power source VDD and a drain of the PMOS transistor Q76 is connected to the node N3. Hence, the buffer block 52 functions as a buffer circuit whose input part is the drain of the transistor Q75 and an output part is the drain of the transistor Q76.

In such a structure, an output signal OUT of a voltage signal which has a reverse logic value with respect to the input current Iin is available at the node N3. This current-voltage conversion circuit converts an input current into a voltage level to obtain an output voltage, and therefore, it is possible to connect an output result of the current-type logic circuit to a regular CMOS circuit or the like which operates in response to a voltage signal. This is particularly effective when the current-voltage conversion circuit is to be implemented in a standard cell and a gate array.

<Second Aspect>

Figure 29:
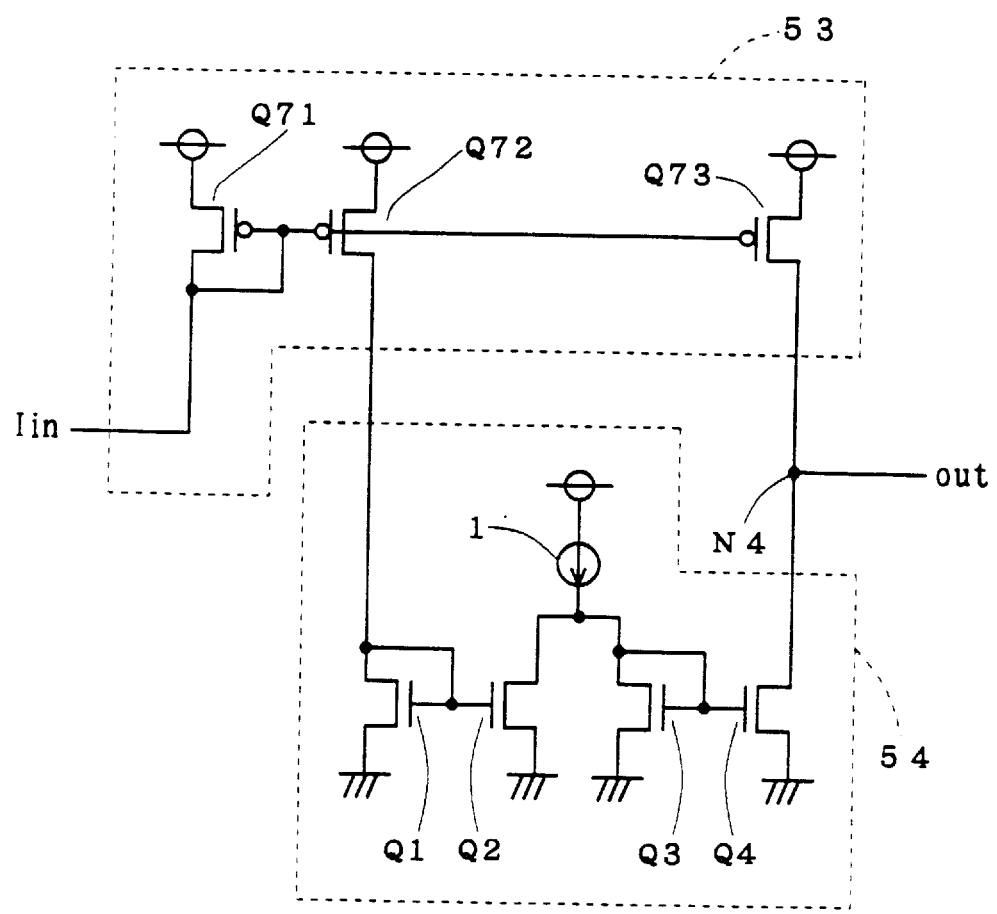
FIG. 29 is a circuit diagram showing a structure of a current/voltage conversion circuit according to a second aspect of a twelfth related embodiment of the present invention.

FIG. 29 is a circuit diagram showing a structure of a current-voltage conversion circuit according to a second aspect of the twelfth related embodiment of the present invention. As shown in FIG. 29, the current-voltage conversion circuit according to the second aspect is formed by a P-type buffer block 53 and an N-type inverter block 54.

The buffer block 53 is formed by PMOS transistors Q71 to Q73 which share a gate. A source of the PMOS transistor Q71 is connected to the power source VDD. The input current Iin is supplied to a gate and a drain of the PMOS transistor Q71. Sources of the PMOS transistors Q72 and Q73 are commonly connected to the power source VDD. A drain of the PMOS transistor Q73 is connected to the node N4. Hence, the buffer block 53 functions as a buffer circuit for the input current Iin whose first output part is the drain of the transistor Q72 and a second output is the drain of the transistor Q73.

The inverter block 54 has the same structure as the current type inverter circuit according to the first aspect of the first related embodiment that an input part of the inverter block 54 is connected to the first output part of the buffer block and an output part of the inverter block 54 is connected to the node N4.

Having such a structure, like the circuit of the first aspect, the circuit of the second aspect can output the output signal OUT of a voltage signal which has a reverse logic value with respect to the input current Iin from the node N4.

<<Thirteenth Related Embodiment>>

<First Aspect>

Figure 30:
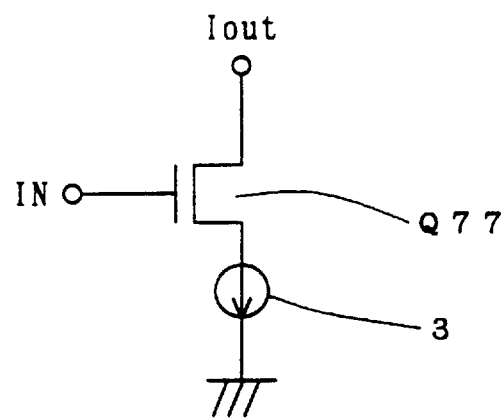
FIG. 30 is a circuit diagram showing a structure of a current/voltage conversion circuit according to a first aspect of a thirteenth related embodiment of the present invention.

FIG. 30 is a circuit diagram showing a structure of a voltage-current conversion circuit according to a first aspect of a thirteenth related embodiment of the present invention. As shown in FIG. 30, an input signal IN, a voltage signal, is supplied to a gate of an NMOS transistor Q77 and a source of the NMOS transistor Q77 is grounded through a reference current source 3.

Having such a structure, the voltage-current conversion circuit can obtain an output current Iout which has the same logic value as the input signal IN from the drain of the NMOS transistor Q 77, to thereby perform voltage-current conversion.

If this voltage-current conversion circuit is interposed, an output result from a regular logic circuit which operates in response to a voltage signal is supplied to a current type logic circuit. Further, when this voltage-current conversion circuit is used with the current-voltage conversion circuit of the eleventh related embodiment, a logic circuit triggered by a voltage signal and a logic circuit triggered by a current signal are mixed relatively easily to obtain an effective logic circuit which uses a current type logic circuit where a high speed operation is needed. This effectiveness is particularly advantageous when the current-voltage conversion circuit is to be implemented in a standard cell and a gate array.

<Second Aspect>

Figure 31:
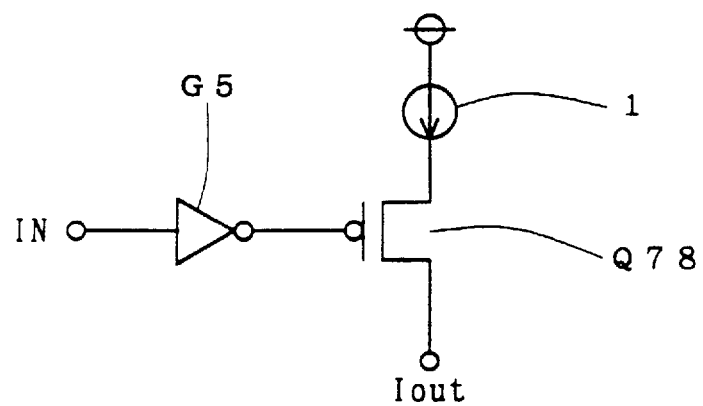
FIG. 31 is a circuit diagram showing a structure of a current/voltage conversion circuit according to a second aspect of the thirteenth related embodiment of the present invention.

FIG. 31 is a circuit diagram showing a structure of a voltage-current conversion circuit according to a second aspect of the thirteenth related embodiment of the present invention. As shown in FIG. 31, the input signal IN is supplied to an inverter G5. An output from the inverter G5 is supplied to a gate of an NMOS transistor Q78, and a source of the PMOS transistor Q78 is connected to the power source VDD through a reference current source 1.

Having such a structure, the current-voltage conversion circuit can obtain an output current Iout which has the same logic value as the input signal IN from the drain of the PMOS transistor Q78, to thereby perform voltage-current conversion.

<<Fourteenth Related Embodiment>>

When the current type logic circuits of the first to the eleventh related embodiments are used as a standard cell or a basic cell of a gate array, the characteristics unique to the current type logic circuits, i.e., the first to the sixth effects, are realized over the entire chip. Particularly advantageous, a high speed operation is attained without using bipolar transistors.

Where the current type logic circuits of the first to the eleventh preferred embodiments are used together with a logic circuit which operates in response to a voltage signal, to balance the two types of circuits, the current-voltage conversion circuit according to the twelfth related embodiment and the voltage-current conversion circuit according to the thirteenth related embodiment are used.

Further, where a current type logic circuit in which the quantity of a reference current Iref is controlled by the bias voltages PBIAS and NBIAS is used as a current type logic circuit as in the second preferred embodiment, the bias voltages are preferably changeable for each macro block. The operation speed of the current type logic circuit is improved by increasing the bias voltages, while a power consumption by the current type logic circuit is suppressed by decreasing the bias voltages.

Hence, by changing the bias voltages for each macro block to change the reference current Iref and attain a desired operation speed in each block, it is possible to obtain a combination circuit which consumes a minimum necessary electric power and operates at an optimal operation speed. This in turn saves a power consumption of the chip.

Figure 32:
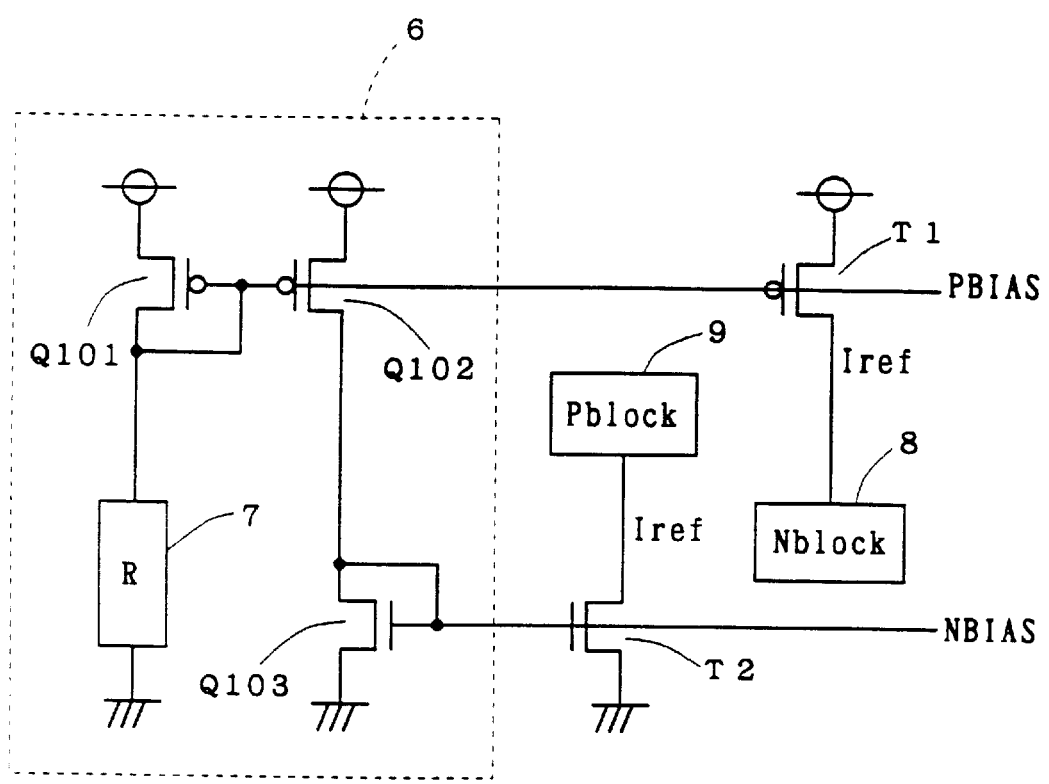
FIG. 32 is a circuit diagram showing a bias generating circuit.

FIG. 32 is a circuit diagram showing an example of a bias generation circuit. As shown in FIG. 32, in the bias generation circuit 6, a current mirror is formed by PMOS transistors Q101 and Q102 which share a gate. A source of the PMOS transistor Q101 is connected to a power source VDD while a drain and a gate are grounded through a resistor part 7. A source of the PMOS transistor Q102 is connected to the power source VDD while a drain of the PMOS transistor Q102 is connected to a drain and a gate of a PMOS transistor Q103. A source of the PMOS transistor Q103 is grounded.

The resistor part 7 may be formed by a regular resistor of course, or by connecting MOS transistors in the form of a diode. Alternatively, the resistor part 7 may have a structure in which a resistance component is formed by a transistor and a gate of the resistance component is connected externally to the chip as a control voltage terminal so that fine management of the resistance value is possible.

A gate of a PMOS transistor T1 for setting the reference current Iref is connected to the gate of the PMOS transistors Q101 and Q102. A source of the PMOS transistor T1 is connected to a power source VDD and a drain of the PMOS transistor T1 is connected to a current type logic circuit part (Nblock) 8 which is formed by NMOS transistors.

A gate of a PMOS transistor T2 for setting the reference current Iref is connected to the gate of the NMOS transistor Q103. A source of the PMOS transistor T2 is grounded. A drain of the PMOS transistor T2 is connected to a current type logic circuit part (Pblock) 9 which is formed by PMOS transistors.

Hence, setting the resistance value of the resistor part 7 of the bias generation circuit 6 and determining a drain voltage of the PMOS transistor Q101, it is possible to determine the bias voltage PBIAS, i.e., a gate voltage of the PMOS transistors Q101 and Q102 and the bias voltage NBIAS, i.e., a gate voltage of the NMOS transistor Q103.

The bias generation circuit 6 which has the structure of FIG. 32 is disposed in each macro block which performs a series of operations. Setting the resistance value of the resistor part 7 so that the bias voltages PBIAS and NBIAS which yield a desired reference current Iref are generated, it is possible to set the bias voltages for each macro block.

As a method of changing the bias voltages which are set for each macro block, the size of the MOS transistor for setting the reference current Iref may be changed for each macro block.

Figures 33A, 33B:
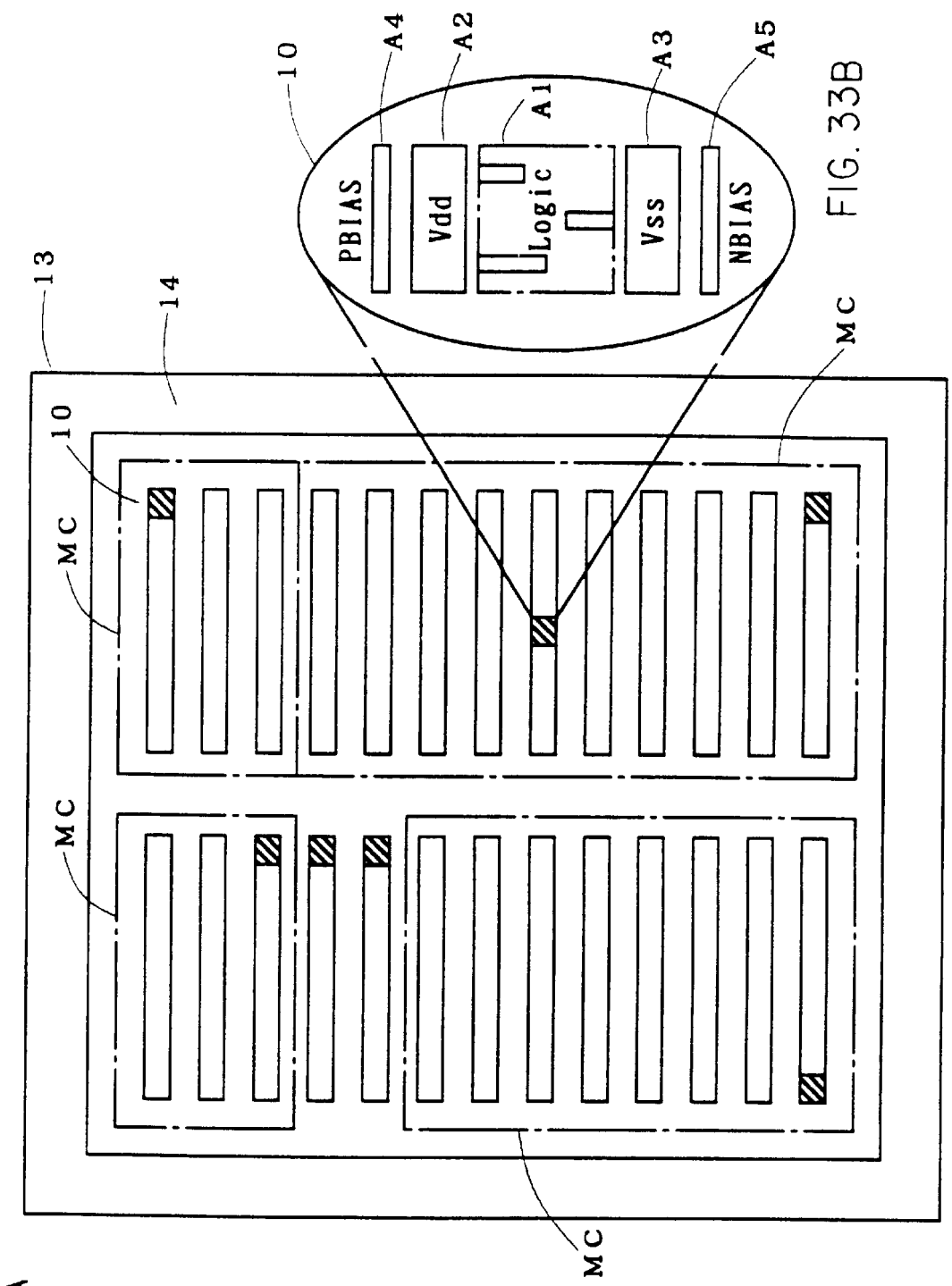
FIG. 33 is a plan view of a semiconductor integrated circuit of a gate array structure according to a fourteenth related embodiment of the present invention.

FIG. 33 is a plan view showing a structure of a semiconductor integrated circuit according to the fourteenth related embodiment which is formed by applying the current type logic circuits of the first to the eleventh related embodiments to a gate array.

As shown in FIG. 33, a plurality of basic cells 10 are disposed on a chip 13. A macro block MC is formed by a necessary number of the basic cells 10, Denoted at 14 is an input/output buffer region. The bias generation circuit 6 is disposed in each macro block MC. The bias generation circuit 6 may be constructed in such a manner that the resistor part 7 can be externally controlled.

As shown in an enlarged diagram portion showing the basic cells 10, each basic cell 10 may be formed by a logic circuit formation region A1, a power source wiring region A2, a ground wiring region A3 and bias wiring regions A4 and A5 for the bias voltages PBIAS and NBIAS, respectively. If formed to have such a structure, the basic cells each has an improved surface area efficiency.

When inputs and outputs are connected to each other among macro blocks MC which carry different quantities of the reference current Iref from each other, and particularly when an output of a macro block MC which carries a small quantity of the reference current Iref is connected to an input of a macro block MC which carries a large quantity of the reference current Iref, a current amplifier stage is disposed between the input of the former macro block MC and the output of the latter macro block MC. The current amplifier stage may be a current mirror circuit which has a transistor size or the like changed and therefore has a mirror ratio exceeding 1.

The bias voltages PBIAS and NBIAS are set for each macro block MC in this related embodiment. However, even when the bias voltages PBIAS and NBIAS are set commonly for the entire semiconductor integrated circuit, all effects are attained except for the effect that a circuit with a minimum necessary power consumption and an optimal operation speed is obtained. Further, labor of setting the bias voltages PBIAS and NBIAS for each macro block is eliminated in this case. <<Current Type Ring Oscillator Preferred Embodiment>>

Figure 34:
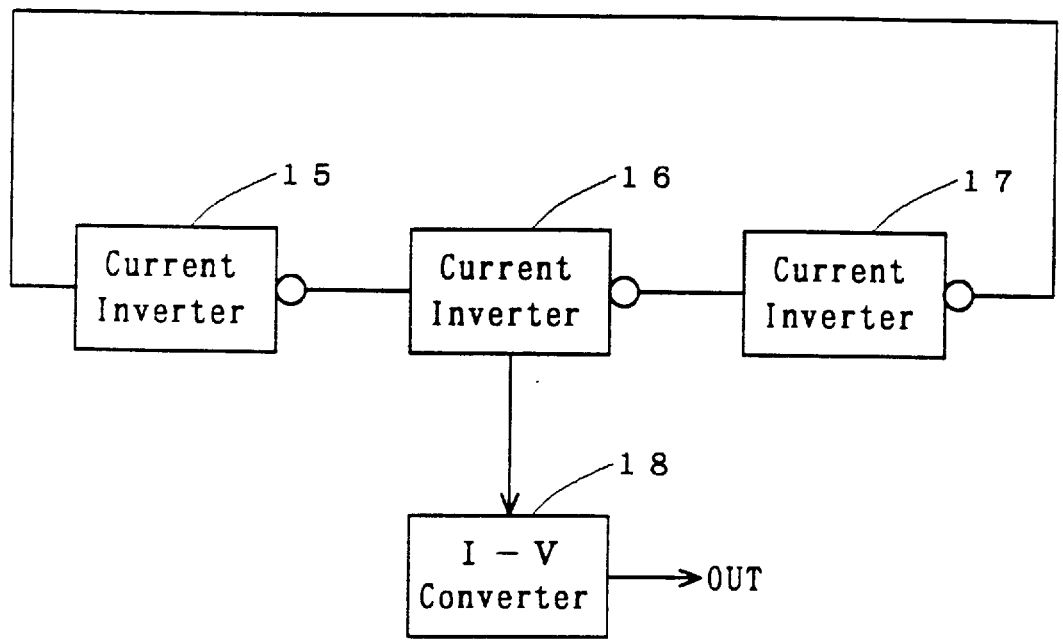
FIG. 34 is a block diagram showing a structure of a current type ring oscillator according to a fifteenth related embodiment of the present invention.

FIG. 34 is a block diagram showing a structure of a current type ring oscillator embodiment of the present invention. As shown in FIG. 34, current type inverter circuits 15 to 17 are connected in series to each other and an output part of the current type inverter circuit 17 is connected to an input part of the current type inverter circuit 15. An output current from the current type inverter circuit 16 is supplied to a current-voltage conversion circuit 18, and the current-voltage conversion circuit 18 converts the output current into a voltage signal which will be outputted as an output signal OUT.

Formed by the three current type inverter circuits which are connected to each other in the form of a loop, the current type ring oscillator alternatively outputs the oscillating output signal OUT having a value "1" and the oscillating output signal OUT having a value "0."

Figure 35:
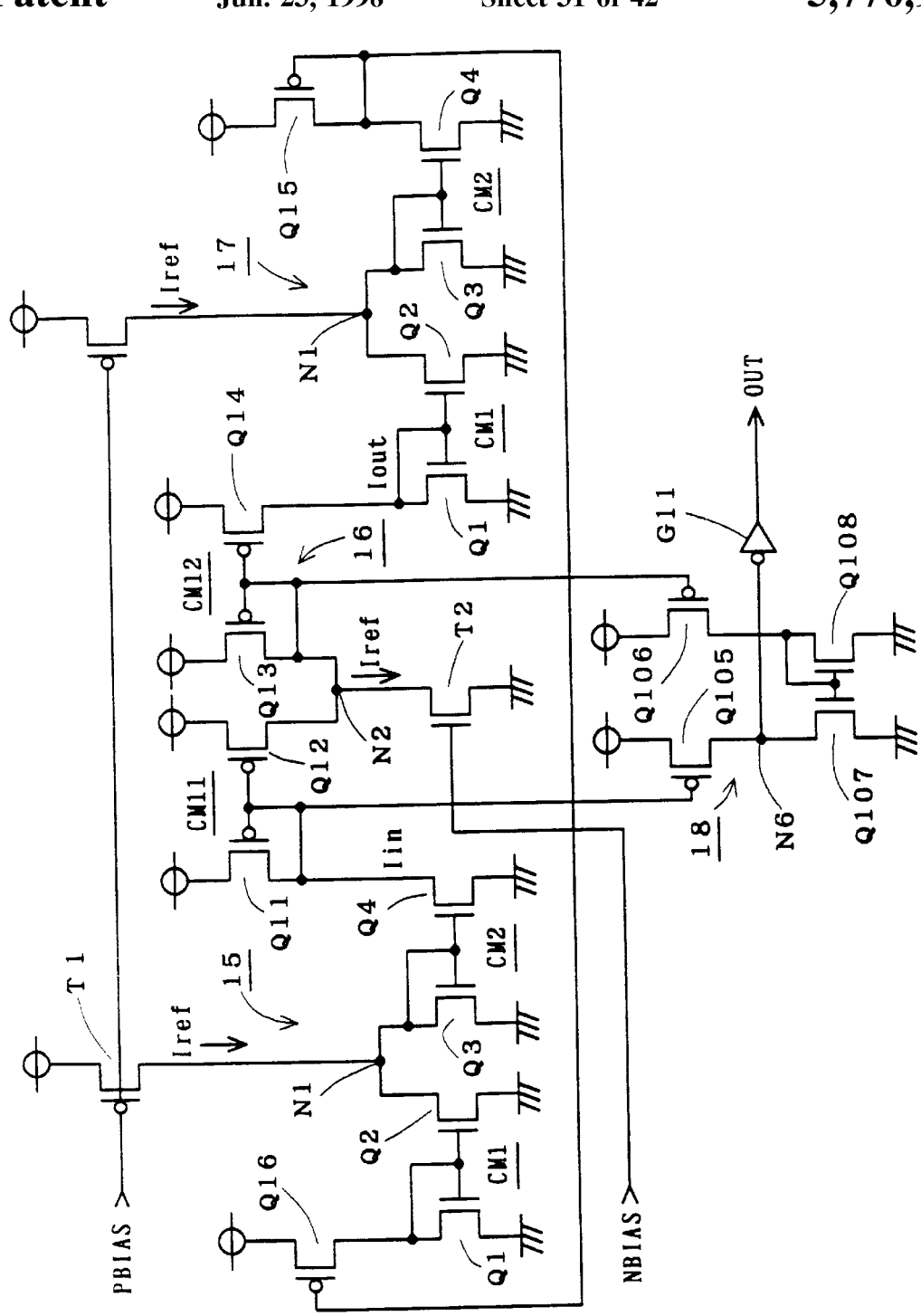
FIG. 35 is a circuit diagram showing FIG. 34 in detail.

FIG. 35 is a circuitry diagram showing an example of an inner structure of the current-voltage conversion circuit of FIG. 34. As shown in FIG. 35, the current type inverter circuits 15 and 17 are each formed by a current type inverter circuit which is formed by NMOS transistors (See the first aspect of the second related embodiment; FIG. 5) while the current type inverter circuit 16 is a current type inverter circuit which is formed by PMOS transistors (See the second aspect of the second related embodiment; FIG. 6). An output from the current type inverter circuit 17 is connected to an input into the current type inverter circuit 15 through a P-type buffer circuit which is formed by PMOS transistors Q15 and Q16 (See FIG. 15).

Further, a gate of a PMOS transistor Q105 of the current-voltage conversion circuit 18 is connected to a gate of a PMOS transistor Q11 of the current-voltage conversion circuit 16. A gate of a PMOS transistor Q106 is connected to a gate of a PMOS transistor Q13 of the current-voltage conversion circuit 16.

Sources of the PMOS transistors Q105 and Q106 are commonly connected to the power source VDD. Thus, the PMOS transistor Q105 is connected to the PMOS transistor Q11 in a current mirror connection while the PMOS transistor Q106 is connected to the PMOS transistor Q13 in a current mirror connection.

NMOS transistors Q107 and Q108 which share a gate form a current mirror circuit. A drain of the NMOS transistor Q107 is connected to the drain of the PMOS transistor Q105 through an node N6. A drain and a gate of the NMOS transistor Q108 are connected to the drain of the PMOS transistor Q106.

An input to an inverter G11 is coupled to the node N6 so that an output of the inverter G11 becomes the output signal OUT.

The transistor Q105 turns off and the transistors Q106 to Q108 turn on when the output current Iout from the current-voltage conversion circuit 16 has a value "1" (i.e., the output current Iout is flowing), whereby the current-voltage conversion circuit 18 outputs the output signal OUT which has a value "0" ("L"). When the output current Iout from the current-voltage conversion circuit 16 has a value "0" (i.e., the output current Iout is not flowing), the transistor Q105 turns on and the transistors Q106 to Q108 turn off, whereby the current-voltage conversion circuit 18 outputs the output signal OUT which has a value "1" ("H").

Thus, the current type ring oscillator according to the present preferred embodiment advantageously exhibits a better dependency on a power source voltage than a conventional voltage type ring oscillator which operates in response to a voltage signal. The current type ring oscillator embodiment is further advantageous due to its high speed operation even with the power source VDD having a low voltage. In addition, while driving force of an element forming a voltage type ring oscillator has a dependency on the size of the transistor element, in the case of a current type ring oscillator, the driving force of the transistor element can be set optimal by controlling biases (i.e., the bias voltages PBIAS and NBIAS). Hence, the current type ring oscillator can be used as a voltage-controlled oscillator as well which yields a desired oscillating frequency by controlling bias voltages as described below in another preferred embodiment.

Although the above described preferred embodiment is related to an example where three current type inverter circuits are connected in series to each other, the number of the current type inverter circuits may be 5 or any larger odd number.

<<Voltage Controlled Oscillator Preferred Embodiment>>

FIG. 36 is a block diagram showing a structure of a voltage-controlled oscillator preferred embodiment of the present invention. As shown in FIG. 36, receiving an input signal IN which is a voltage signal, a bias generating circuit 19 outputs bias voltages PBIAS and NBIAS. The bias voltage NBIAS is supplied to current type inverter circuits 15 and 17 while the bias voltage PBIAS is supplied to a current type inverter circuit 16. The voltage-controlled oscillator is otherwise similar in structure to the current type ring oscillator preferred embodiment shown in FIGS. 34 and 35, and therefore, a redundant description will be simply omitted.

Figure 37:
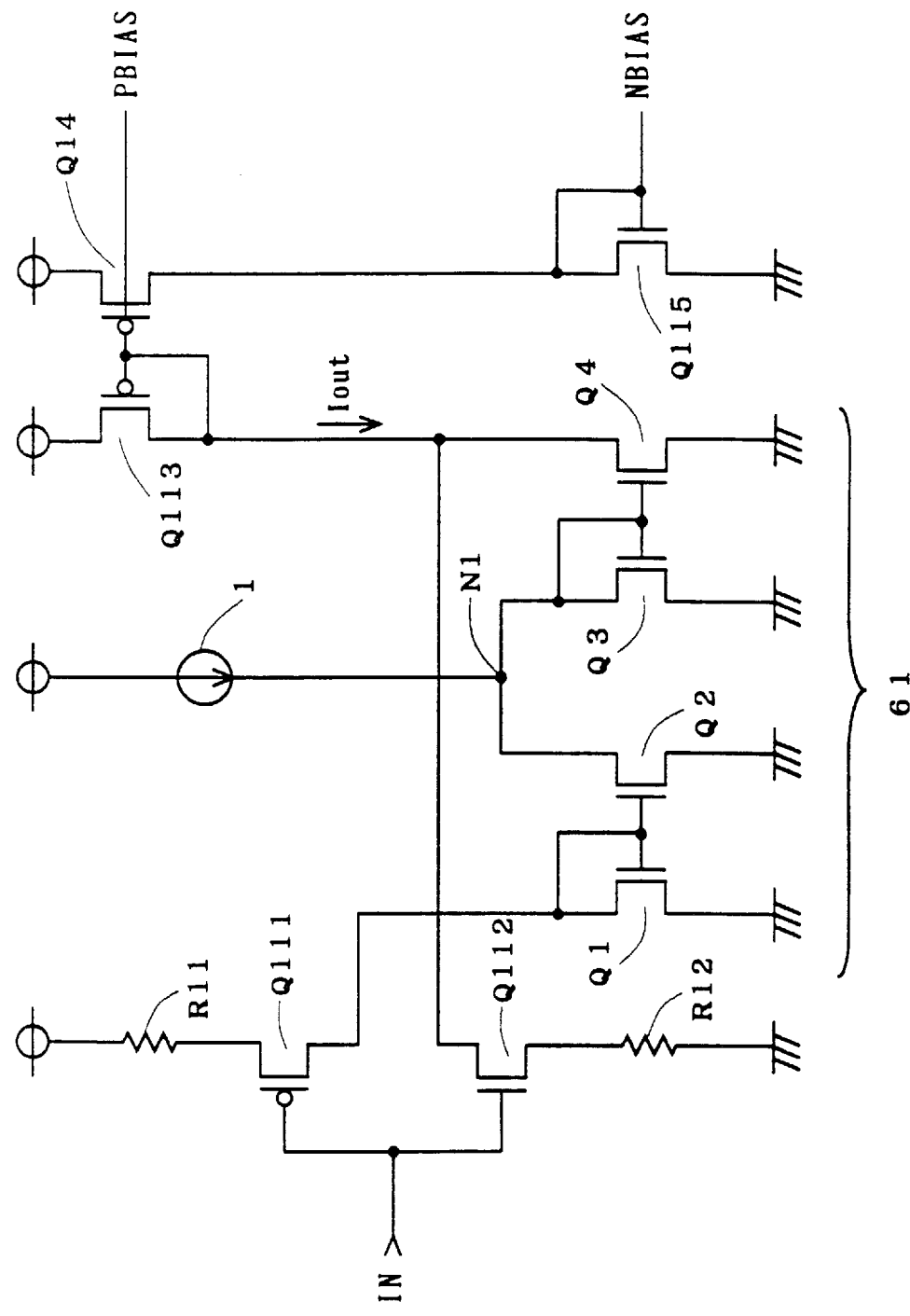
FIG. 37 is a circuit diagram showing the voltage-controlled oscillator of FIG. 36 in detail.

FIG. 37 is a circuitry diagram showing an example of an inner structure of the bias generating circuit 19. As shown in FIG. 37, the input signal IN is supplied to gates of a PMOS transistor Q111 and an NMOS transistor Q112, a source of the PMOS transistor Q111 is connected to a power source VDD through a resistor R11 and a drain of the PMOS transistor Q111 is connected to an input part of a current type inverter circuit 61 (See the first aspect of the first related embodiment, FIG. 1). On the other hand, a source of the NMOS transistor Q112 is grounded through a resistor R12 while a drain of the NMOS transistor Q112 is connected to an output part of the current type inverter circuit 61.

PMOS transistors Q113 and Q114 which share a gate form a current mirror circuit. A source of the PMOS transistor Q113 is connected to a power source VDD while a drain and a gate of the PMOS transistor Q113 are connected to the output part of the current type inverter circuit 61. A source of the PMOS transistor Q114 is connected to the power source VDD and a drain of the PMOS transistor Q114 is connected to the drain and the gate of the PMOS transistor Q115. A source of the PMOS transistor Q115 is grounded.

In such a structure, the quantity of the output current Iout from the current type inverter circuit 61 is adjusted by the voltage level of the input signal IN. Therefore, the bias voltage PBIAS, i.e., a gate voltage of the PMOS transistors Q101 and Q102 and the bias voltage NBIAS, i.e., a gate voltage of the NMOS transistor Q103 are changed under control in such a manner that the same quantity of the reference current Iref is supplied through the PMOS transistor T1 and the NMOS transistor T2.

Hence, the voltage-controlled oscillator according to the sixteenth preferred embodiment yields a desired oscillating frequency by controlling the bias voltages based on the input signal IN which is a voltage signal.

Thus, the voltage-controlled oscillator according to the sixteenth preferred embodiment advantageously exhibits a better dependency on a power source voltage than a conventional voltage transmission type voltage-controlled oscillator which operates in response to a voltage signal. The voltage-controlled oscillator according to the sixteenth preferred embodiment is further advantageous due to its high speed operation even with the power source VDD having a low voltage. In addition, while driving force of an element forming a voltage transmission type voltage-controlled oscillator has a dependency on the size of the transistor element, in the case of a voltage-controlled oscillator of the present embodiment, the driving force of the transistor element can be set optimal by controlling the biases (i.e., the bias voltages PBIAS and NBIAS) based on the input signal IN which is a voltage signal.

Figure 38:
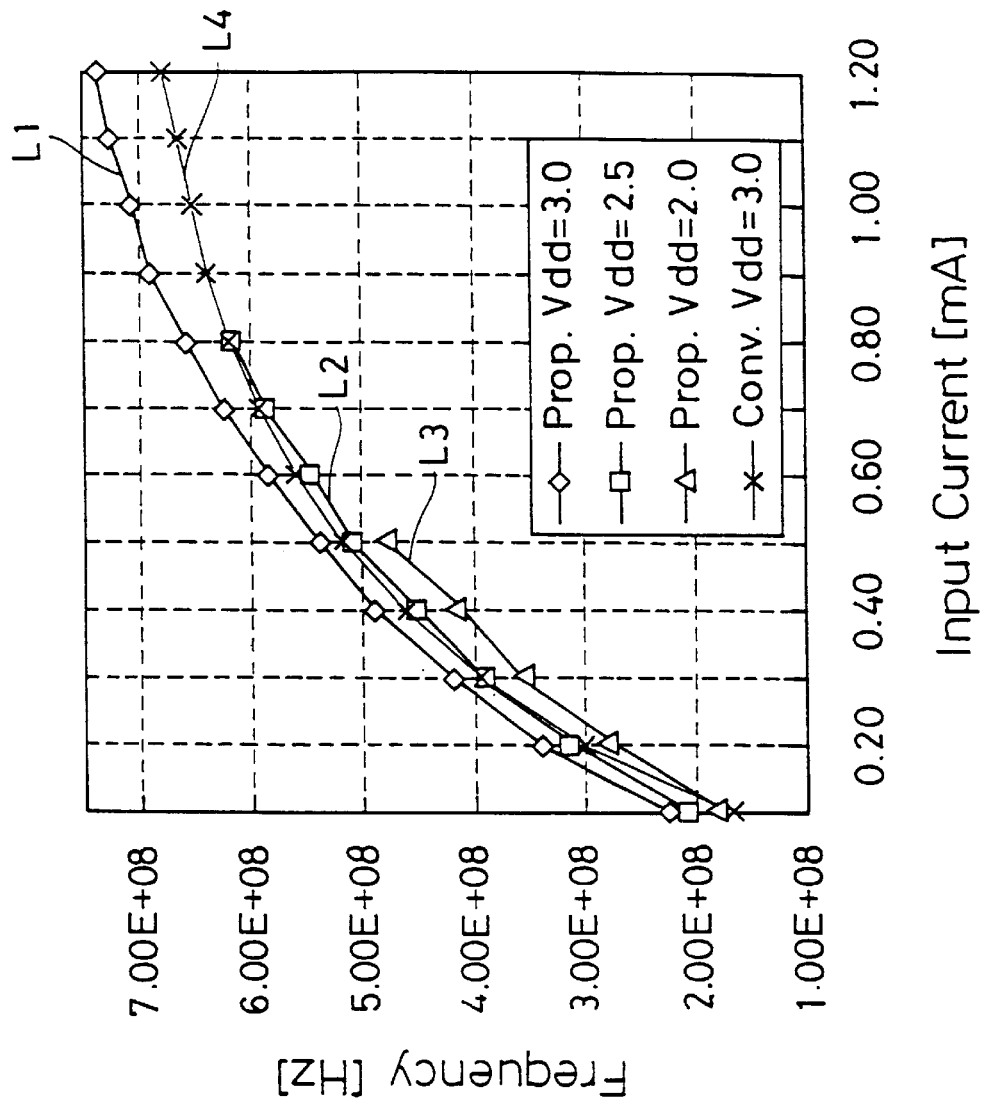
FIGS. 38 and 39 are graphs describing an effect of the voltage-controlled oscillator of the sixteenth related embodiment.
Figure 47:
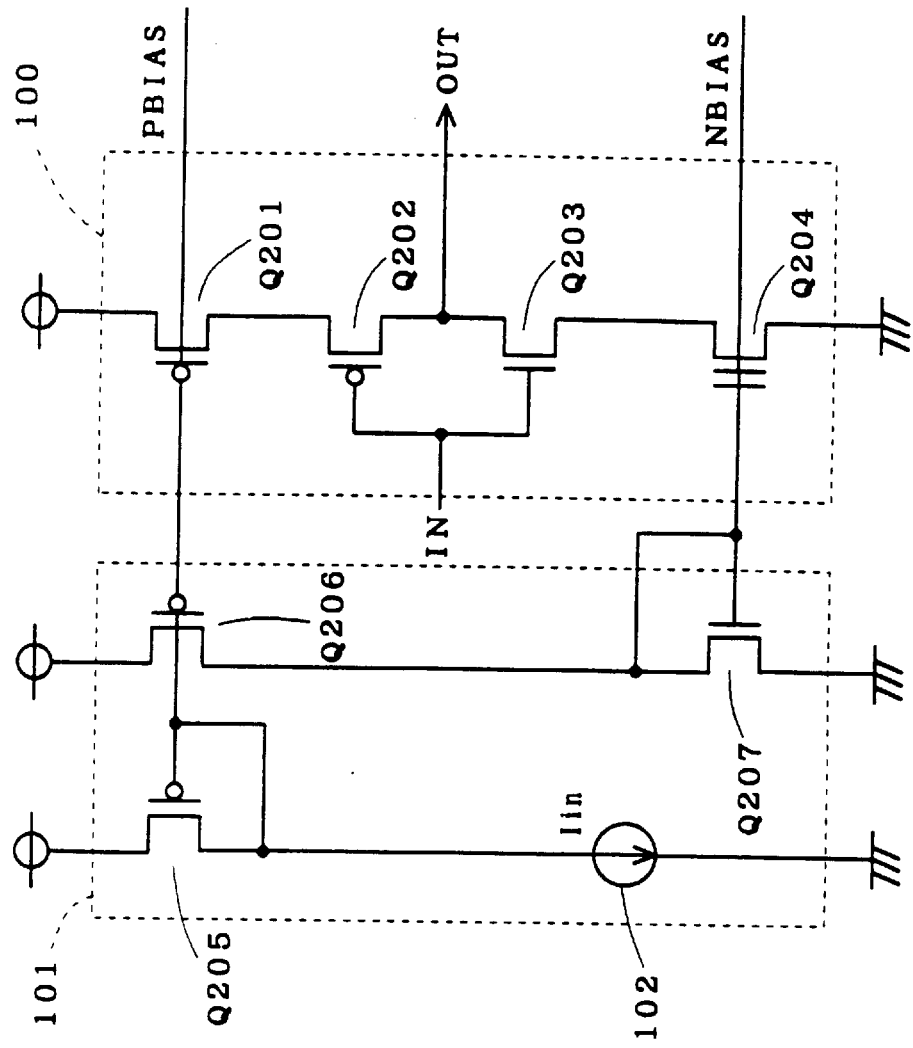
FIG. 47 is a circuit diagram showing an example of a conventional CMOS inverter.
Figure 46:
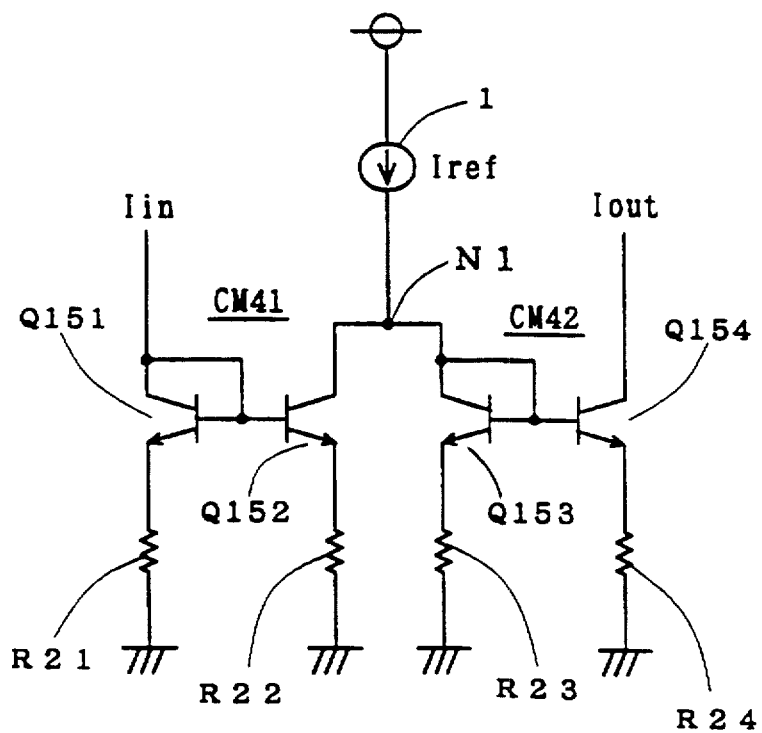

FIG. 38 is a graph showing a relationship between an input current (Input Current) and an oscillating frequency (Frequency) in a voltage-controlled oscillator. In FIG. 38, curves L1 to L3 express a case where the power source VDD is 3.0V, a where the power source VDD is 2.5V and where the power source VDD is 2.0V in the voltage-controlled oscillator of the sixteenth preferred embodiment, respectively. The input current in FIG. 38 corresponds to the reference current Iref which is determined by the bias voltages PBIAS and NBIAS. A curve L4 expresses a case where the power source VDD is 3.0V in a conventional voltage transmission type voltage-controlled oscillator which is formed by a ring oscillator which is formed by the CMOS inverters shown in FIG. 47.

Figure 39:
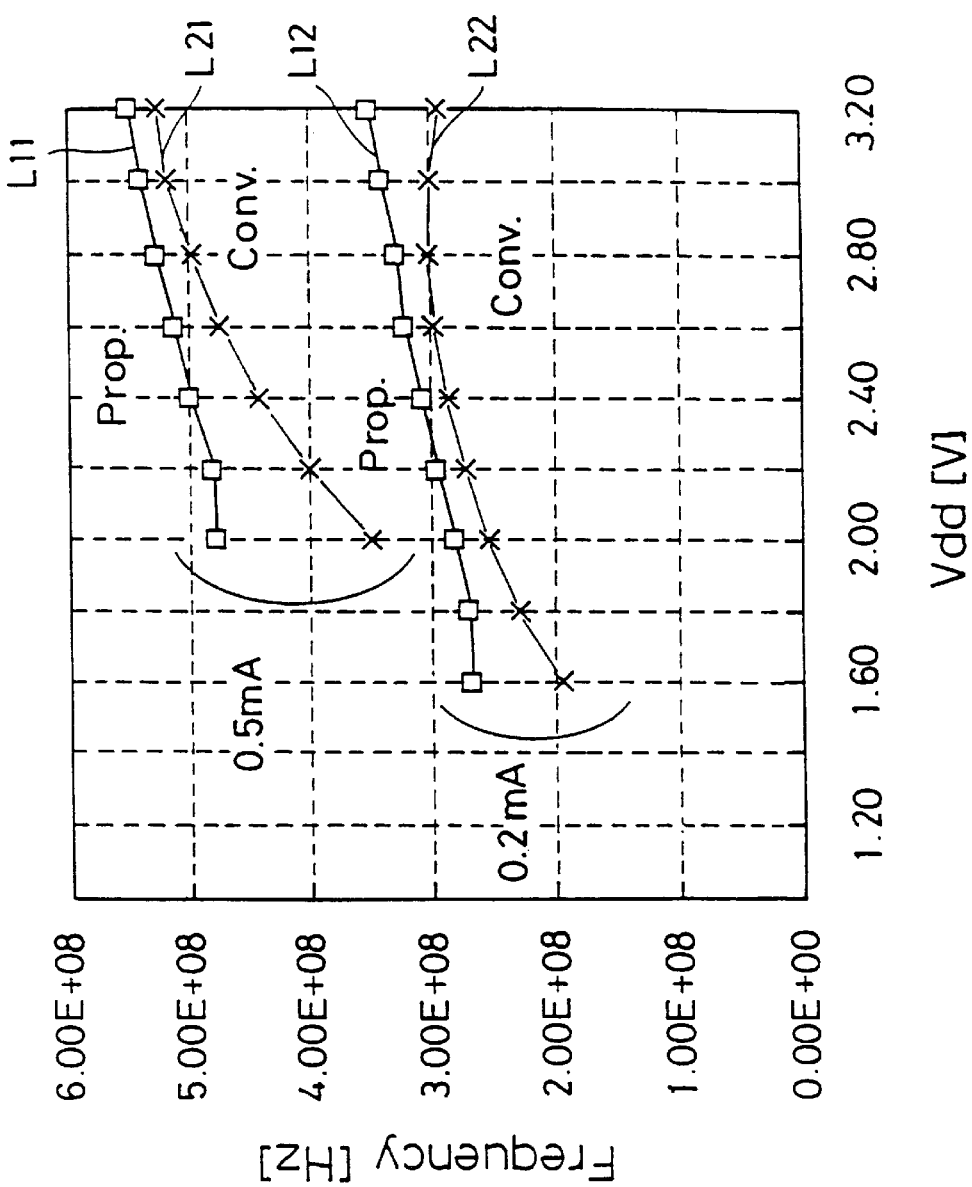

FIG. 39 is a graph showing a relationship between a power source voltage and an oscillating frequency in a voltage-controlled oscillator. In FIG. 39, curves L11 and L12 express a case where the reference current Iref is 0.5 mA and a case where the reference current Iref is 0.2 mA in the voltage-controlled oscillator embodiment, respectively. Curves L21 and L22 express a case where the reference current Iref is 0.5 mA and a case where the reference current Iref is 0.2 mA in a conventional voltage transmission type voltage-controlled oscillator, respectively.

As can be understood from FIG. 39, the oscillating frequency of the voltage-controlled oscillator preferred embodiment is under less influence of a drop in the voltage at the power source VDD than the oscillating frequency of the conventional voltage transmission type voltage-controlled oscillator. That is, the voltage-controlled oscillator of the sixteenth preferred embodiment has a better dependency on the power source voltage.

<<Seventeenth Related Embodiment>>

Figure 40:
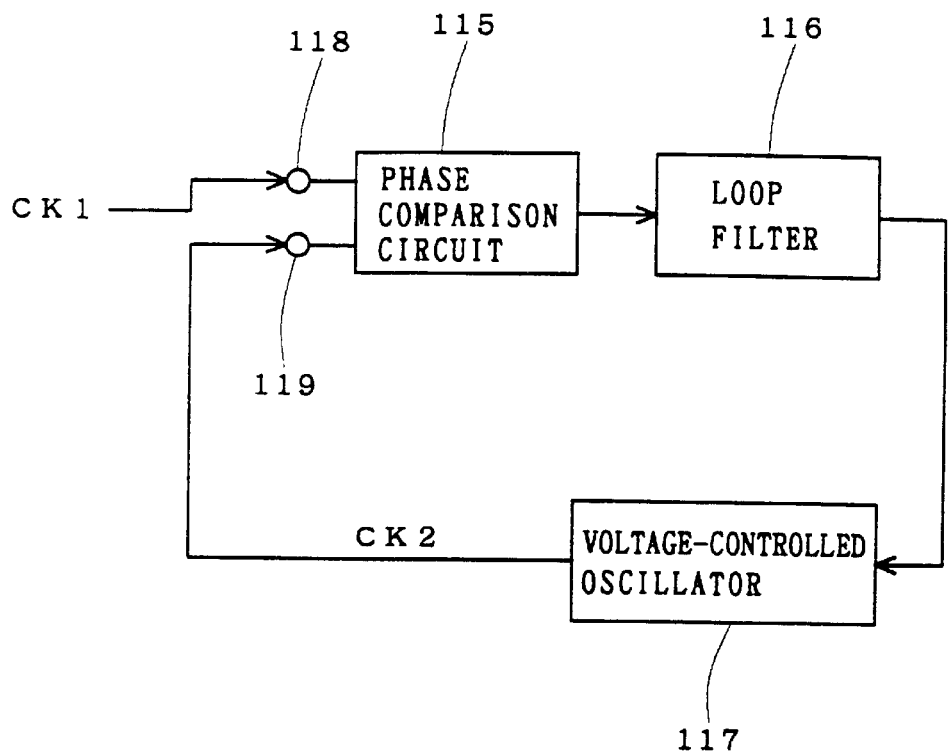
FIG. 40 is a block diagram showing a structure of a PLL circuit according to a seventeenth related embodiment of the present invention.

FIG. 40 is a block diagram showing a structure of a PLL circuit according to a seventeenth related embodiment of the present invention. As shown in FIG. 40, a reference clock CK, i.e., an input signal, is supplied to an input terminal 118.

A phase comparison circuit 115 detects a phase difference between a signal received at the input terminal 118 and a signal received at an input terminal 119, and outputs a phase comparison signal which expresses a result of comparison to a loop filter 116. In other words, the phase comparison circuit 115 outputs a phase comparison signal which instructs an increase of a phase comparison voltage value which is outputted from the loop filter 116 when the signal received at the input terminal 119 has a phase lag with respect to the phase of a reference clock CK1 which is received at the input terminal 118. In an opposite case, the phase comparison circuit 115 outputs a phase comparison signal which instructs a decrease of the phase comparison voltage value which is outputted from the loop filter 116.

The loop filter 116 converts a pulse signal from the phase comparison circuit 115 into an analog voltage, processes the analog voltage by filtering and outputs a phase comparison voltage to a voltage-controlled oscillator 117.

The voltage-controlled oscillator 117 outputs a clock CK2, which is an oscillating signal which oscillates at a frequency which is in proportion to the phase comparison voltage outputted from the loop filter 116, to the input terminal 119. The voltage-controlled oscillator may be the voltage-controlled oscillator which uses the current type ring oscillator according to the voltage-controlled oscillator embodiment.

Thus, in the PLL circuit, the phase comparison circuit 115 outputs a phase comparison signal which instructs an increase of the phase comparison voltage value which is outputted from the loop filter 116 when the clock CK2 which is received at the input terminal 119 has a phase lag with respect to the clock CK1 which is received at the input terminal 118, whereby the oscillating frequency of the clock CK2 outputted from the voltage-controlled oscillator 117 increases. Conversely, when the clock CK2 has a phase lead with respect to the clock CK1, the phase comparison circuit 115 outputs a pulse signal which instructs a decrease of the phase comparison voltage value which is outputted from the loop filter 116, whereby the oscillating frequency of the clock CK2 deceases.

As a result, the oscillating frequency associated with a change in the power source voltage shows less changes than in a conventional voltage-controlled oscillator which is used in a conventional PLL circuit. Hence, the PLL circuit of this embodiment creates less jittering.

<Phase Comparator>

Figure 41:
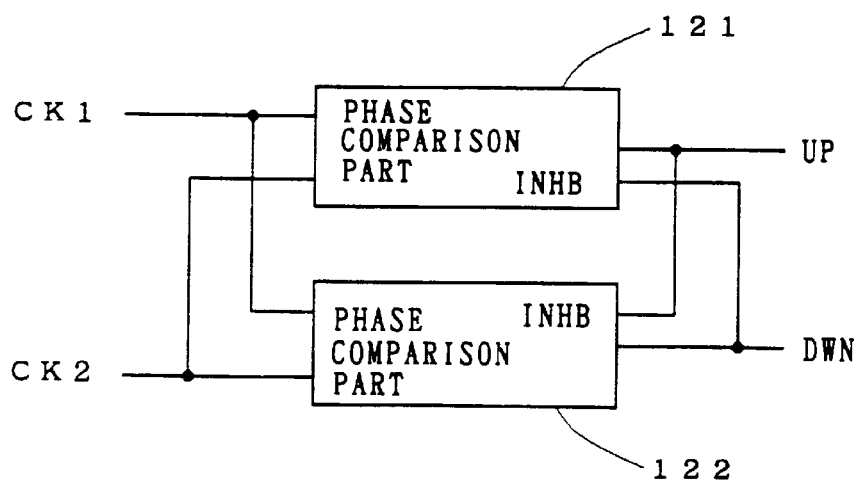
FIG. 41 is a circuit diagram showing an inner structure a phase comparator of FIG. 40.

FIG. 41 is a block diagram showing an example of a structure of a phase comparator which is used in the phase comparison circuit 115. As shown in FIG. 41, the phase comparator is formed by two phase comparison parts 121 and 122 for detecting a phase lag and a phase lead of the clock CK.

Figure 42:
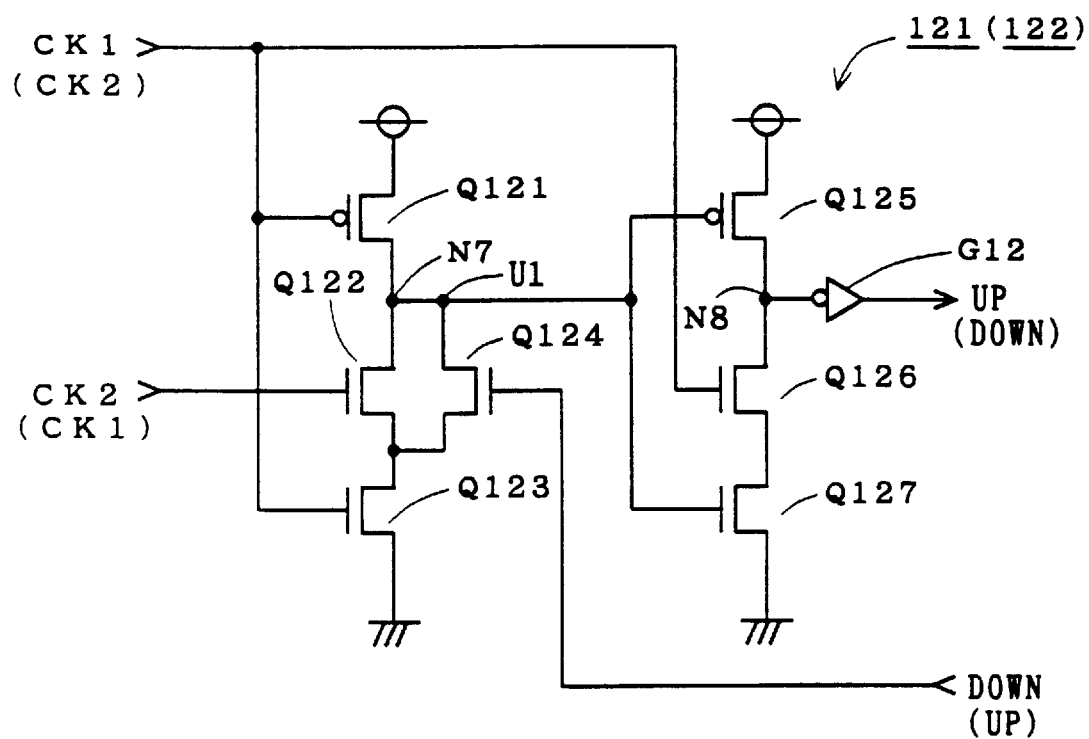
FIG. 42 is a circuit diagram showing an inner structure a phase comparison part of FIG. 41.

FIG. 42 is a block diagram showing an inner structure of the phase comparison part 121. As shown in FIG. 42, PMOS transistors Q121 and NMOS transistors Q122 and Q123 are connected in series to each other between the power source VDD and the ground level. The reference clock CK1 is supplied to gates of the PMOS transistors Q121 and the NMOS transistor Q123, while a clock CK2 is supplied to a gate of the NMOS transistor Q122. Further, an NMOS transistor Q124 is connected in parallel to the NMOS transistor Q122 so that the NMOS transistor Q124 receives a down signal DWN at a gate from the phase comparison part 122.

A PMOS transistor Q125 and NMOS transistors Q126 and Q127 are connected in series to each other between the power source VDD and the ground level. Gates of the PMOS transistor Q125 and the NMOS transistor Q127 are connected to an node N7 which is a drain of the NMOS transistors Q122 and Q124, and the clock CK1 is supplied to a gate of the NMOS transistor Q126. An input part of an inverter G12 is connected to an node N8 which is a drain of the PMOS transistor Q125. An output from the inverter G12 is an up signal UP.

The phase comparison part 122 has the same structure as the phase comparison part 121. An only difference is that the clocks CK1 and CK2 are switched each other and the up signal UP and the down signal DWN are switched each other.

Constructed as described above, the phase comparison part 121 outputs the up signal UP of "H" level at a pulse width corresponding to a phase difference between the clocks CK1 and CK2 when the clock CK2 a phase lag with respect to the clock CK1, while the phase comparison part 122 outputs the down signal DWN of "H" level at a pulse width corresponding to a phase difference between the clocks CK1 and CK2 when the clock CK1 a phase lag with respect to the clock CK2.

The phase comparison circuit 115 outputs a phase comparison signal which is a voltage signal from an incorporated known charge-up pump circuit in accordance with the up signal UP and the down signal DWN.

The phase comparator shown in FIGS. 41 and 42 is advantageous due to its simple structure, high speed performance and a small number of transistors which are used.

However, this phase comparator has the following problems. Although a dynamic operation is free of problem unless the PLL circuit is used with a particularly low frequency, since a precharging period has a dependency on the frequency of an input and a duty ratio, there are problems such as:

1. precharging at the node N7 is insufficient (High duty ratio) since a period in which an inputted clock (CK1 in FIG. 42) stays at L level is short; and
2. a range for evaluating a phase difference is narrow (Low duty ratio) since a period in which the inputted clock stays at H level is short. Since the clock CK2 is generated by a voltage-controlled oscillator, a duty is around 50% in most cases, which causes no problem. Considering this, a discussion should be taken on what will happen when the duty ratio of the reference clock CK1 is poor while the duty ratio of the clock CK2 is approximately 50%.

Now, it is assumed that the clock duty is ensured in the range between 30% to 70% with the oscillating frequency of 155.52 MHz on a substrate seating the PLL circuit. In this case, the H-period and the L-period of the inputted clock are as shown in Table 1.

TABLE 1

| Duty Ratio | 30% | 50% | 70% |
|---|---|---|---|
| Precharge | 4.501 ns | 3.215 ns | 1.929 ns |
| Evaluate | 1.929 ns | 3.215 ns | 4.501 ns |

Figure 43:
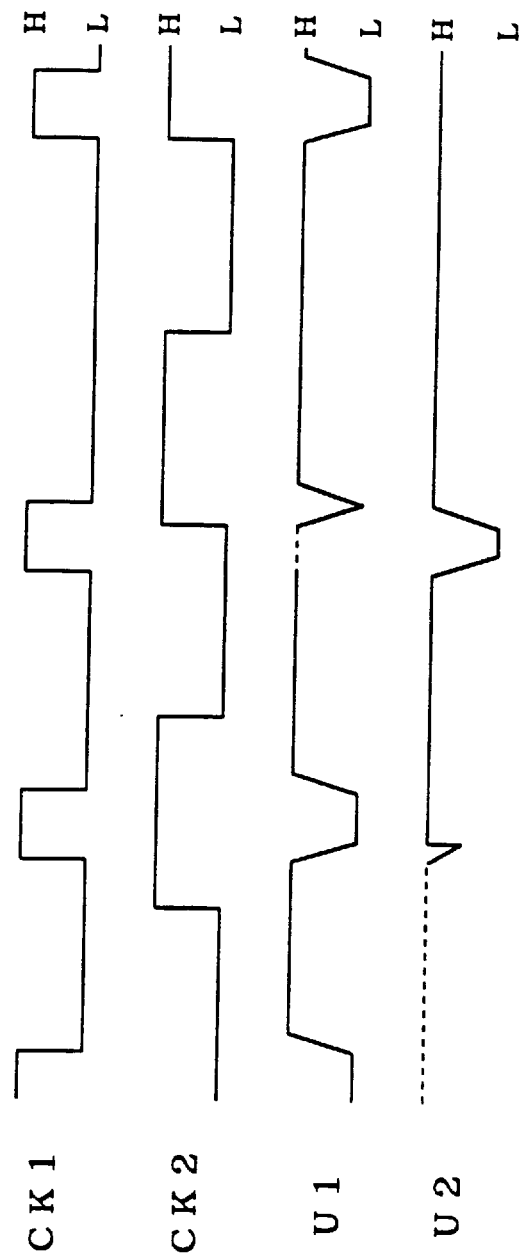
FIG. 43 a waveform diagram showing an operation of the phase comparison part of FIG. 41.

As show in Table 1, although the precharging period of 1.929 ns is enough, the phase comparison period ("Evaluate" period) during this short period of time should be noted. An operation of the phase comparator with a short phase comparison period is shown in FIG. 43. In FIG. 43, denoted at U1 is a signal which is obtainable at the node N7 of the phase comparison part 121 and denoted at U2 is a signal which is obtainable at the node N8 of the phase comparison part 121.

Since the width of the UP pulse (U1, U2) shown in FIG. 43 is not allowed to be longer than the H-period of the clock CK1, the width of the UP pulse needs be shorter than the DWN pulse. Although this may exert no adverse influence after locking, during a process before locking, it is inconvenient that the maximum width of the UP pulse is limited while the width of the DWN pulse can be extended. In some cases, it is possible that locking will not take place. This inconvenience must be eliminated.

Figure 44:
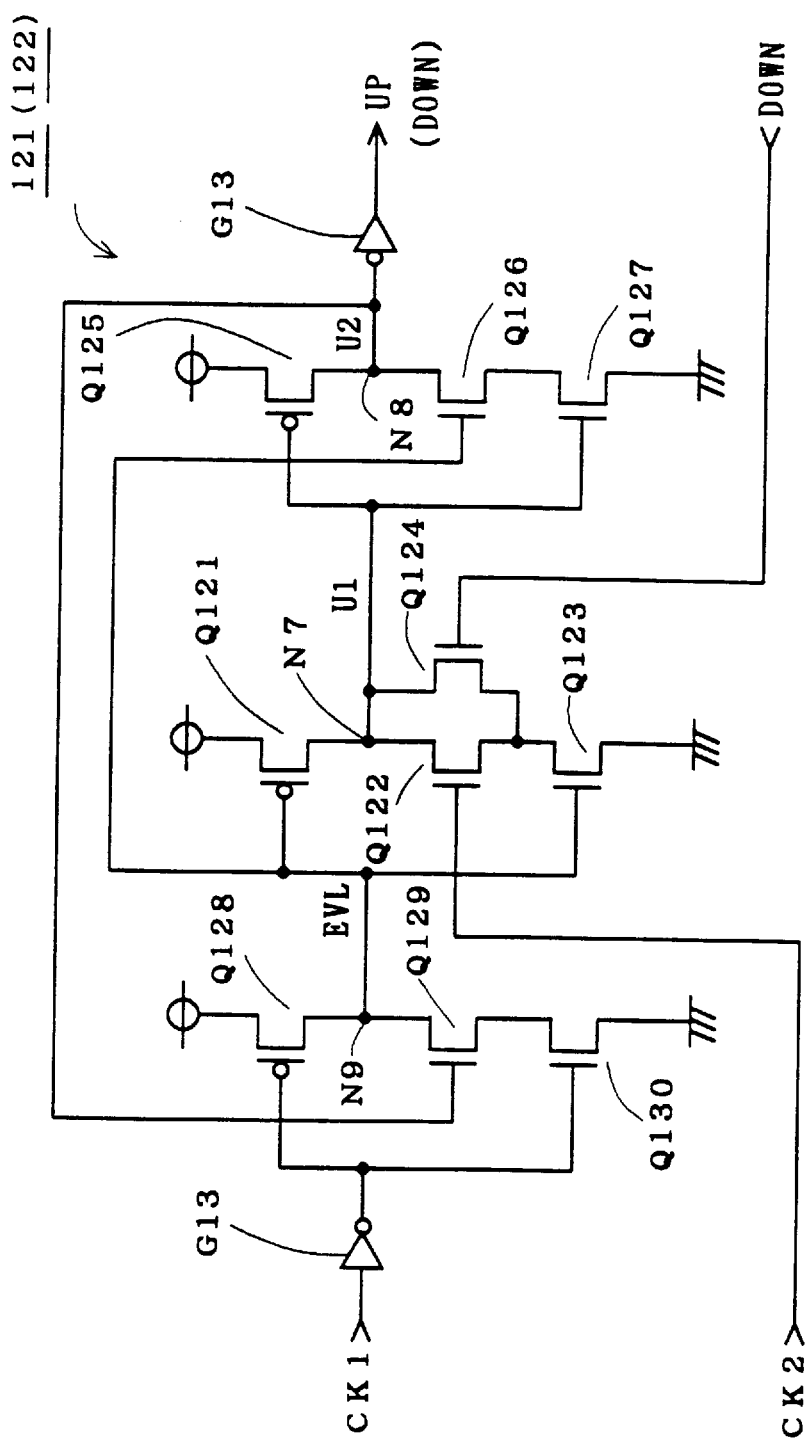
FIG. 44 is a circuit diagram showing an inner structure the phase comparison part of FIG. 41.

FIG. 44 shows an inner structure of the phase comparison part 121 which solves the problem above. As shown in FIG. 44, a PMOS transistor Q128 and NMOS transistors Q129 and Q130 are connected in series to each other between the power source VDD and the ground level. A reverse signal which is obtained by reversing the reference clock CK1 by an inverter G13 is supplied to gates of the PMOS transistor Q128 and the NMOS transistor Q130. A signal EVL is obtained at an node N9 which is formed between a drain of the PMOS transistor Q128 and a drain of the NMOS transistor Q129.

A PMOS transistor Q121 and NMOS transistors Q122 and Q123 are connected in series to each other between the power source VDD and the ground level. The signal EVL is supplied to gates of PMOS transistor Q121 and the NMOS transistor Q123 while the clock CK2 is supplied to a gate of the NMOS transistor Q122. An NMOS transistor Q124 is connected in parallel to the NMOS transistor Q122 so that the down signal DWN from the phase comparison part 122 is supplied to a gate of the NMOS transistor Q124.

Further, a PMOS transistor Q125 and NMOS transistors Q126 and Q127 are connected in series to each other between the power source VDD and the ground level. Gates of the PMOS transistor Q125 and the NMOS transistor Q127 are connected to drains of NMOS transistors Q122 and Q124 (i.e., to the node N7), and the signal EVL is supplied to a gate of the NMOS transistor Q126. The input part of the inverter G12 is connected to a drain of the PMOS transistor Q125 (i.e., to the node N8) so that an output from the inverter G12 becomes the up signal UP: The signal U2 from the node N8 is supplied to the gate of the NMOS transistor Q129.

The phase comparison part 122 has the same inner structure as the phase comparison part 121. Only a difference is that the clocks CK1 and CK2 are switched each other and the up signal UP and the down signal DWN are switched each other.

The phase comparison part 121 shown in FIG. 44 prohibits precharging at the node N7 if a pulse input ("H") of the clock CK2 is not received during the period "Evaluate," i.e., the H-period of the reference clock CK1. When no input of the clock CK2 (i.e., "H" level signal) is received after precharging, the signal U1 is maintained at H level in a high impedance state. Since the signal EVL is at H level after precharging, the NMOS transistors Q126 and Q127 turn on, thereby switching the signal U2 to "L" and generating the UP signal of H level.

The signal EVL does not change to "L" regardless of whether the reference clock CK1 is "H" or "L" since the NMOS transistor Q129 stays turned off during this period. When a pulse input "H" of the clock CK2 is received, the signal U1 changes from "H" to "L" while the signal U2 changes from "L" to "H," which in turn regenerates a path through which "H"/"L" of the clock CK1 is transmitted as "H"/"L" of the signal EVL. When this path is regenerated, the node N7 is precharged again if CK1="L." If CK1="H," the node N7 is not precharged, and therefore, U1="L" which prohibits phase comparison until after next precharging. Through this operation, a long UP pulse can be generated even when the clock duty ratio is small.

Thus, the signal EVL is generated based on the clock CK1 under the control of the signal U2. Once the UP pulse is generated by a change of the clock CK1 from "L" to "H," the signal EVL is fixed at "H" until a pulse input of the clock CK2 is supplied. Phase comparison is continued even when the clock CK1 changes to "L" after this. Hence, a sufficiently long UP pulse is generated even if the period "Evaluate," i.e., the H-period of the clock CK1 is short.

Figure 45:
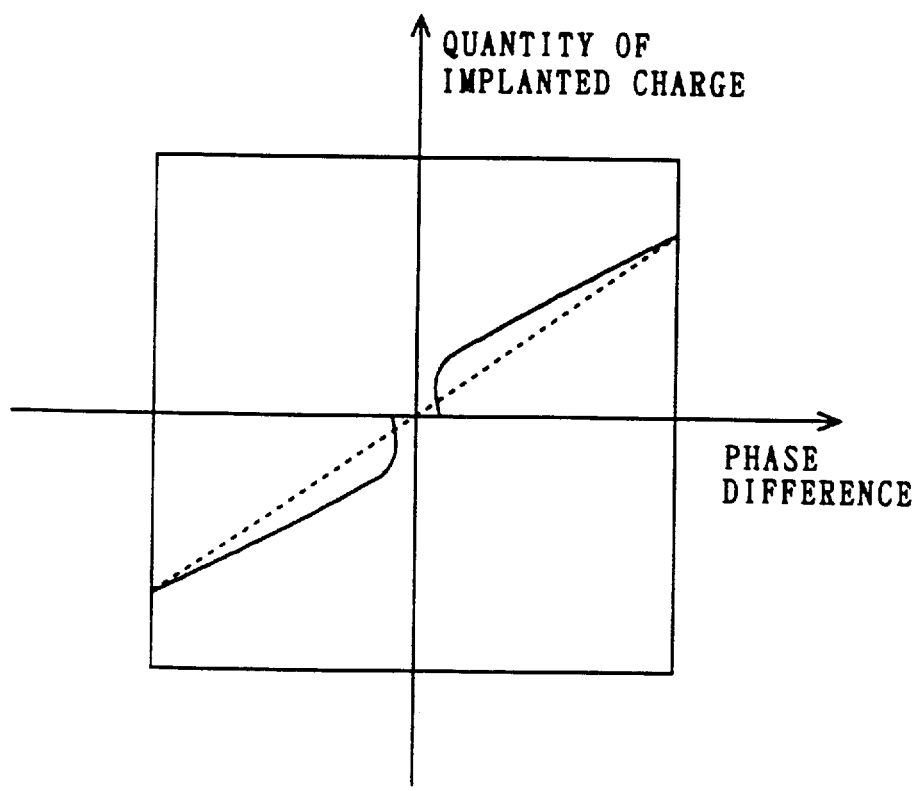
FIG. 45 is a graph showing a characteristic of a phase comparator.

There is one more feature of the phase comparator to be noted. That is, an output in the case where there is no phase difference. Although it is theoretically desirable that no output is obtained from the charge pump when there is no phase difference, in reality, the signals UP and DWN both do not already have a sufficiently large amplitude to drive the charge pump when the phase difference is almost zero in most cases. In this case, as denoted by solid lines in FIG. 45, a relationship between the phase difference and an implanted charge is not linear in the vicinity of zero phase difference and hence discontinuous points are created. This means that the phase condition after locking shifts between the discontinuous points, thereby creating jittering. To avoid such jittering, the phase comparator is desired to have a structure which can generate a pulse even when the phase difference is zero.

In the phase comparator of FIG. 44, data is transmitted during the periods of the signals U1, U2 and EVL through a delay of one gate. Due to a skew, very small UP and DOWN pulses are generated even if the phase difference is zero. Hence, even when the phase difference is close to zero, a small current is supplied, thereby preventing the problem above.

<<Others>>

Figure 46:
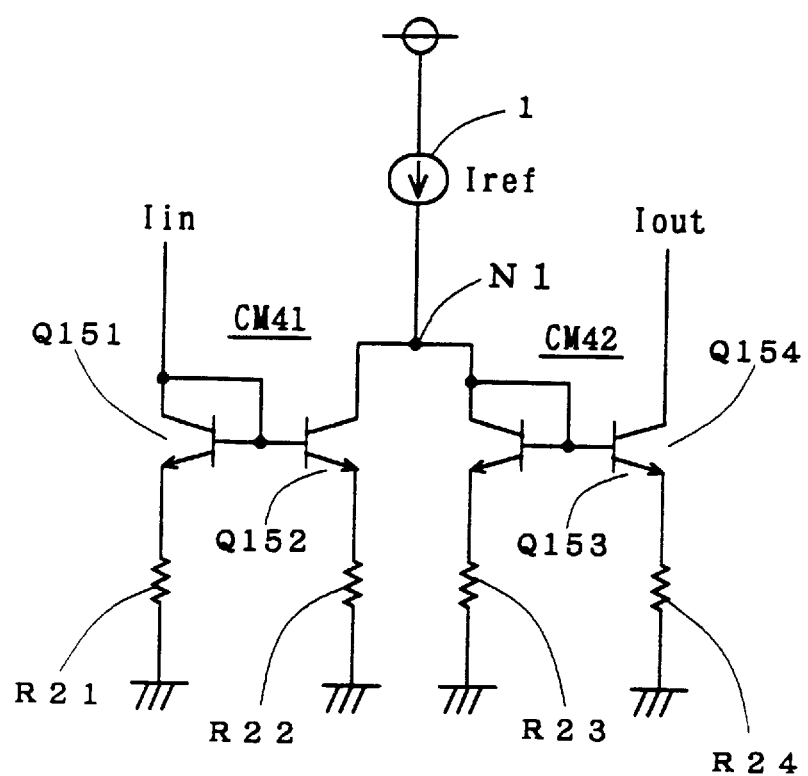
FIG. 46 is a circuit diagram showing an example where a current type inverter circuit is formed by bipolar transistors.

Instead of forming by MOS transistors as in the embodiments described above, the current type logic circuits such as current type inverter circuits may be formed by bipolar transistors as shown in FIG. 46.

One end of the reference current source 1 is connected to a power source VDD. The reference current source 1 receives a reference current Iref at the other end thereof. The current mirror circuit CM41 is formed by NMOS transistors Q151 and Q152 which share a base. The input current Iin is supplied to a collector and a base of the NMOS transistor Q151 which serve as an input part. An emitter of the NMOS transistor Q151 is grounded. On the other hand, as an output part, a collector of the NMOS transistor Q152 is connected to an node N1 of the other end side of the reference current source 1. An emitter of the NMOS transistor Q152 is grounded through a resistor R22.

The current mirror circuit CM42 is formed by NMOS transistors Q153 and Q154 which share a base. As an input part, a collector and the base of the NMOS transistor Q153 are connected to the node N1. An emitter of the NMOS transistor Q153 is grounded through a resistor R23. A collector of the NMOS transistor Q154 functions as an output part for outputting the output current Iout. An emitter of the NMOS transistor Q154 is grounded through a resistor R24.

In the current mirror circuits CM41 and CM42, the following condition is satisfied:

[Condition 1]

TS1≧1;

TS2≧1; and

TS1·TS2>1 where TS1 is a transistor size ratio (i.e., an emitter size ratio) of the size of the NMOS transistor Q152 to the size of the NMOS transistor Q151 and TS2 is a ratio of the size of the NMOS transistor Q154 to the size of the NMOS transistor Q153.

Alternatively, in the current mirror circuits CM41 and CM42, the following condition is satisfied:

[Condition 2]

RS1≧1;

RS2≧1; and

RS1·RS2>1 where RS1 is a resistance ratio of the resistor R22 to the resistor R21 and RS2 is a resistance ratio of the resistor R24 to the resistor R23. That is, at least one of the conditions 1 and 2 should be satisfied.

Thus, even when formed by MOS transistors, the current type logic circuit operates as a current type inverter circuit just like when formed by MOS transistors.

Since the transistor size ratios TS1 and TS2 of each one of the current mirror circuits CM41 and CM42 are set to satisfy the conditions TS1≧1, TS2≧1 and TS1·TS2>1 or the resistance ratios RS1 and RS2 of each one of the current mirror circuits CM41 and CM42 are set to satisfy the conditions RS1≧1, RS2≧1 and RS1·RS2>1, a mirror ratio RM1 of the current mirror circuit CM41 and a mirror ratio RM2 of the current mirror circuit CM42 satisfy relationships RM1 ≧1, RM2≧1 and RM1·RM2>1.

Hence, like where the current type logic circuit is formed by bipolar transistors, by setting a gain of the output current Iout with respect to the input current Iin of the current type inverter circuit sufficiently larger than 1, it is possible to ensure that the current quantity between the input and the output of the current type inverter circuit will not attenuate during an actual operation of the current type inverter circuit.

The effect above is ensured only if the mirror ratio RM1 of the current mirror circuit CM41 satisfies a relationship I1 RM1≧1 where I1 is the quantity of the input current Iin and IR is the quantity of the reference current Iref.

While the invention has been described in detail, the foregoing description is in all aspects illustrative and not restrictive. It is understood that numerous other modifications and variations can be devised without departing from the scope of the invention.

We claim:

1. A current type ring oscillator comprising:

a first power source and a second power source; and first to N-th (N≧3, N being an odd number) current type inverter circuits, wherein odd numbered of said current type inverter circuits each include, first reference current supply means having one end which is connected to said first power source and the other end for supplying a first reference current, said first reference current supply means receiving a first control signal from outside, the current quantity of said first reference current being set based on said first control signal, a first current mirror circuit having a first input part for receiving an input current and a first output part which is connected to the other end of said first reference current supply means so as to supply a first intermediate output current, whose current quantity is in proportion to that of said input current, between said first output part and said second power source, and a second current mirror circuit having a second input part which is connected to the other end of said first reference current supply means and a second output part for carrying an output current so as to supply said output current, whose current quantity is in proportion to that of a first intermediate input current which flows between said second input part and said second power source, between said second output part and said second power source, wherein even numbered of said current type inverter circuits each include, second reference current supply means having one end which is connected to said second power source and the other end for supplying a second reference current, said second reference current supply means receiving a second control signal from outside, the current quantity of said second reference current being set based on said second control signal, a third current mirror circuit having a first input part for receiving an input current and a first output part which is connected to the other end of said second reference current supply means so as to supply a second intermediate output current, whose current quantity is in proportion to that of said input current, between said first output part and said first power source, and a fourth current mirror circuit having a second input part which is connected to the other end of said second reference current supply means and a second output part for carrying an output current so as to supply said output current between said second output part and said first power source, the current quantity of said output current is in proportion to that of a second intermediate input current which flows between said second input part and said first power source, wherein in said first to said N-th current type inverter circuits, a second output part of said i-th (1≦i≦(N−1)) current type inverter circuit is connected to a first input part of said (i+1)-th current type inverter circuit, and said current type ring oscillator further comprises, a connection circuit having a first connection part and a second connection part, said first connection part being connected to said second output part of said N-th current type inverter circuit, said second connection part being connected to said first input part of said first current type inverter circuit, said connection circuit supplying a current between said first power source and said first input part of said first current type inverter circuit as said input current to said first current type inverter circuit, the current quantity of said input current is in proportion to that of said output current from said N-th current type inverter circuit; and voltage output means for receiving said output current from said second output part of one of said first to said N-th current type inverter circuits, said voltage output means performing current/voltage conversion on said output current to output a voltage output signal.

2. A voltage-controlled oscillator comprising:

a current type ring oscillator, including, a first power source and a second power source; and first to N-th (N≧3, N being an odd number) current type inverter circuits;

wherein odd numbered of said first to said N-th current type inverter circuits each include, first reference current supply means having one end which is connected to said first power source and the other end for supplying a first reference current, said first reference current supply means receiving a first control signal from outside the current quantity of said first reference current being set based on said first control signal, a first current mirror circuit having a first input part for receiving an input current and a first output part which is connected to the other end of said first reference current supply means so as to supply a first intermediate output current, whose current quantity is in proportion to that of said input current, between said first output part and said second power source, and a second current mirror circuit having a second input part which is connected to the other end of said first reference current supply means and a second output part for carrying an output current so as to supply said output current, whose current quantity is in proportion to that of a first intermediate input current which flows between said second input part and said second power source, between said second output part and said second power source, and wherein even numbered of said current type inverter circuits each include, second reference current supply means having one end which is connected to said second power source and the other end for supplying a second reference current, said second reference current supply means receiving a second control signal from outside, the current quantity of said second reference current being set based on said second control signal, a third current mirror circuit having a first input part for receiving an input current and a first output part which is connected to the other end of said second reference current supply means so as to supply a second intermediate output current, whose current quantity is in proportion to that of said input current, between said first output part and said first power source, and a fourth current mirror circuit having a second input part which is connected to the other end of said second reference current supply means and a second output part for carrying an output current so as to supply said output current between said second output part and said first power source, the current quantity of said output current is in proportion to that of a second intermediate input current which flows between said second input part and said first power source, wherein in said first to said N-th current type inverter circuits, a second output part of said i-th ($1 \leq i \leq (N-1)$) current type inverter circuit is connected to a first input part of said (i+1)-th current type inverter circuit, and said current type ring oscillator further comprises, a connection circuit having a first connection part and a second connection part, said first connection part being connected to said second output part of said N-th current type inverter circuit, said second connection part being connected to said first input part of said first current type inverter circuit, said connection circuit supplying a current between said first power source and said first input part of said first current type inverter circuit as said input current to said first current type inverter circuit, the current quantity of said output current is in proportion to that of said output current from said N-th current type inverter circuit, and voltage output means for receiving said output current from said second output part of one of said first to said N-th current type inverter circuits, said voltage output means performing current/voltage conversion on said output current to output a voltage output signal, said voltage-controlled oscillator further comprises a control signal generating circuit receiving a voltage input signal and generating said first and said second control signals based on said voltage input signal in such a manner that said first and said second reference currents have the same current quantity.

* * * * *

UNITED STATES PATENT AND TRADEMARK OFFICE
CERTIFICATE OF CORRECTION

PATENT NO. : 5,770,978
DATED     : June 23, 1998
INVENTOR(S) : Harufusa Kondoh et al Page 1 of 2

It is certified that error appears in the above-identified patent and that said Letters Patent is hereby corrected as shown below:

Please substitute the attached Figure 46 for Figure 46 which was printed.

Column 8, line 3, change "I1 • RM1$\geq$1" to --I1 • RM1$\geq$IR--.

Column 9, line 6, change "I1 • RM11$\geq$1" to --I1 • RM11$\geq$IR--;

line 56, change "I1 • RM1$\geq$1" to --I1 • RM1$\geq$IR--.

Column 12, line 29, change "I1 • RM1$\geq$1" to --I1 • RM1$\geq$IR--.

Column 14, line 25, change "II1 • RM1$\geq$1" to --II1 •RM1$\geq$IR--;

line 25, change "II2 • RM2$\geq$1" to --II2 • RM2$\geq$IR--.

Column 15, line 38, change "CM5" to --CM6--;

line 42, change "CM5" to --CM6-- .

Column 16, line 12, change "II1 • RM4$\geq$1" to --II1 • RM4$\geq$IR--;

line 12, change "II2 • RM6$\geq$1" to --II2 • RM6$\geq$IR--.

Column 37, lines 53-54, change "I1RM1$\geq$1" to --I1 • RM1$\geq$IR--.

Signed and Sealed this

Fifteenth Day of June, 1999

Attest:

*Attesting Officer*

Q. TODD DICKINSON

*Acting Commissioner of Patents and Trademarks*